United States Patent
Van Ostrand et al.

(10) Patent No.: US 11,837,279 B2
(45) Date of Patent: Dec. 5, 2023

(54) SINGLE CYCLE READ PROCESSING IN RAM CELL

(71) Applicant: SigmaSense, LLC., Wilmington, DE (US)

(72) Inventors: Daniel Keith Van Ostrand, Leander, TX (US); Gerald Dale Morrison, Redmond, WA (US); Richard Stuart Seger, Jr., Belton, TX (US); Timothy W. Markison, Mesa, AZ (US)

(73) Assignee: SigmaSense, LLC., Wilmington, DE (US)

( * ) Notice: Subject to any disclaimer, the term of this patent is extended or adjusted under 35 U.S.C. 154(b) by 402 days.

(21) Appl. No.: 17/223,267

(22) Filed: Apr. 6, 2021

(65) Prior Publication Data

US 2021/0225428 A1  Jul. 22, 2021

Related U.S. Application Data

(63) Continuation of application No. 16/568,079, filed on Sep. 11, 2019, now Pat. No. 11,017,845.

(51) Int. Cl.
*G11C 11/4094* (2006.01)
*G11C 11/406* (2006.01)
(Continued)

(52) U.S. Cl.
CPC ........ *G11C 11/4094* (2013.01); *G11C 11/406* (2013.01); *G11C 11/4091* (2013.01); *G11C 11/4096* (2013.01)

(58) Field of Classification Search
CPC .............. G11C 11/4094; G11C 11/406; G11C 11/4096; G11C 11/4091
(Continued)

(56) References Cited

U.S. PATENT DOCUMENTS 6,218,972 B1   4/2001  Groshong
6,665,013 B1   12/2003 Fossum et al.
(Continued)

OTHER PUBLICATIONS

Baker; How delta-sigma ADCs work, Part 1; Analog Applications Journal; Oct. 1, 2011; 6 pgs.
(Continued)

*Primary Examiner* — Connie C Yoha
(74) *Attorney, Agent, or Firm* — Garlick & Markison; Kelly H. Hale

(57) ABSTRACT

A method for execution by a Dynamic Random Access (DRAM) cell processing circuit, includes charging a bit-line operably coupled to a plurality of DRAM cells of a DRAM memory device, including a current DRAM cell, at a first voltage to pre-charge the parasitic capacitance between ground and the bit-line to a second voltage, where the second voltage is between a logic 1 voltage and a logic 0 voltage. The method continues by sensing a voltage change on the bit-line based on a difference between a voltage stored on a DRAM cell capacitor of the current DRAM cell and the second voltage and outputting a read output voltage that is generated based on the sensed voltage change. The method then continues by supplying, while outputting the read output voltage, the read output voltage to the bit-line to refresh the voltage stored in the DRAM cell capacitor of the current DRAM cell.

20 Claims, 40 Drawing Sheets

(51) Int. Cl.
  *G11C 11/4096* (2006.01)
  *G11C 11/4091* (2006.01)
(58) Field of Classification Search
  USPC .......................................................... 365/149
  See application file for complete search history.

(56) References Cited

U.S. PATENT DOCUMENTS

| | | | |
|---|---|---|---|
| 7,528,755 | B2 | 5/2009 | Hammerschmidt |
| 8,031,094 | B2 | 10/2011 | Hotelling |
| 8,089,289 | B1 | 1/2012 | Kremin et al. |
| 8,279,180 | B2 | 10/2012 | Hotelling et al. |
| 8,547,114 | B2 | 10/2013 | Kremin |
| 8,625,726 | B2 | 1/2014 | Kuan |
| 9,201,547 | B2 | 12/2015 | Elias |
| 2003/0202407 | A1 | 10/2003 | Hidaka |
| 2005/0264347 | A1 | 12/2005 | Gyohten |
| 2007/0147102 | A1 | 6/2007 | Roehr |
| 2008/0285341 | A1 | 11/2008 | Moschiano et al. |
| 2010/0054016 | A1 | 3/2010 | Kajigaya |
| 2011/0063154 | A1 | 3/2011 | Hotelling et al. |
| 2013/0278447 | A1 | 10/2013 | Kremin |
| 2015/0364194 | A1 | 12/2015 | Lam et al. |
| 2016/0188049 | A1 | 6/2016 | Yang et al. |
| 2018/0114571 | A1* | 4/2018 | Oak .................... G11C 13/0069 |
| 2018/0261296 | A1 | 9/2018 | Choi et al. |
| 2018/0275824 | A1 | 9/2018 | Li |
| 2021/0365325 | A1* | 11/2021 | Seger, Jr. ............. G06F 11/1443 |

OTHER PUBLICATIONS

Brian Pisani, "Digital Filter Types in Delta-Sigma ADCs", Application Report SBAA230, May 2017, pp. 1-8, Texas Instruments Incorporated, Dallas, Texas.

International Searching Authority; International Search Report and Written Opinion; International Application No. PCT/US2020/049715; dated Dec. 21, 2020; 12 pgs.

* cited by examiner

DRAM memory device 10 cell processing circuit 16

V_REF circuit 24

DRAM memory device 10-1

2-bit cell processing circuit 104

$V_{REF}$ circuit 110 previous charge detection circuit 120 interpreting circuit 124

DRAM memory device 10-2 cell processing circuit 204-1

DRAM memory device 10-3

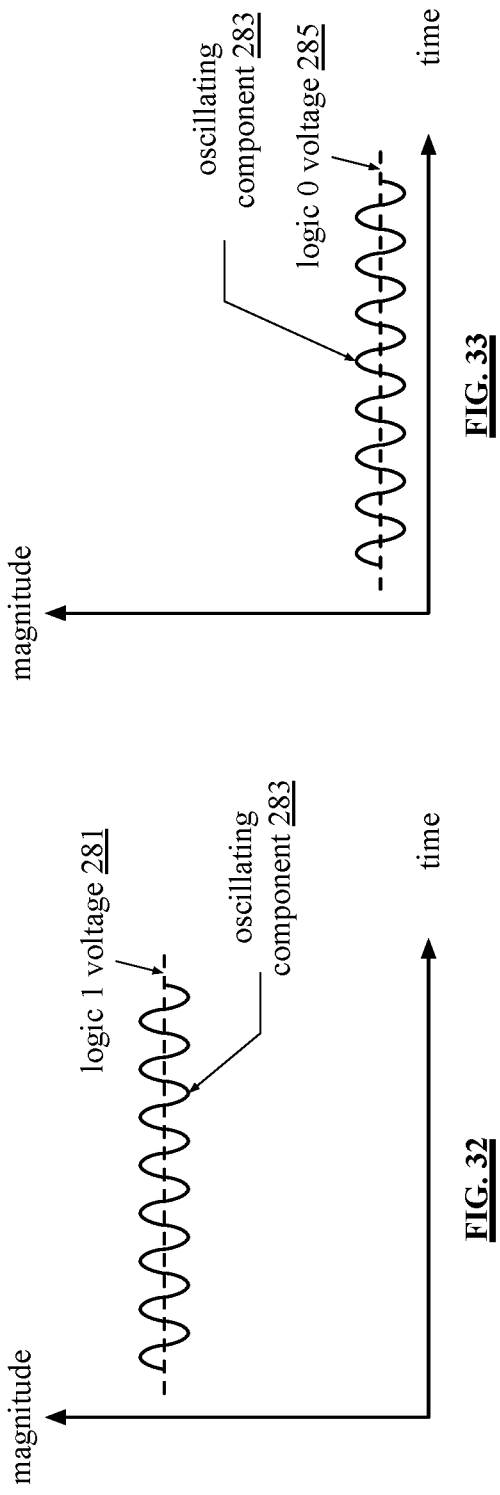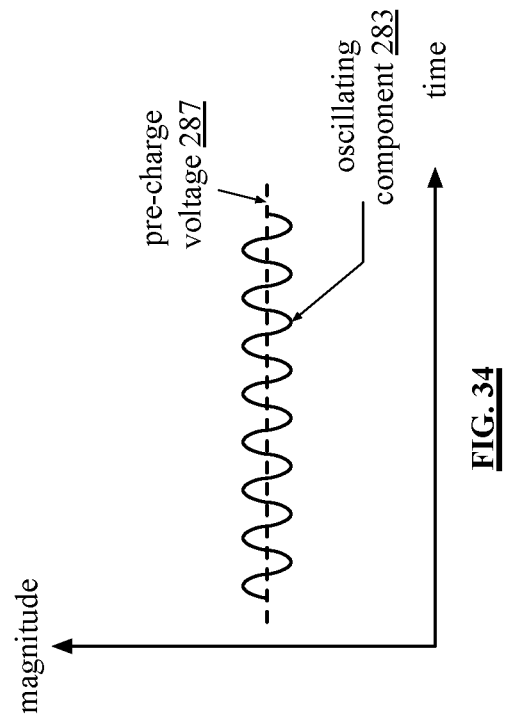

DRAM memory device 10-4

SRAM memory device 350

US 11,837,279 B2

SINGLE CYCLE READ PROCESSING IN RAM CELL

CROSS-REFERENCE TO RELATED APPLICATIONS

The present U.S. Utility patent application claims priority pursuant to 35 USC § 120 as a continuation to U.S. patent application Ser. No. 16/568,079 entitled "RAM CELL PROCESSING CIRCUIT", filed Sep. 11, 2019, which is hereby incorporated herein by reference in its entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computing systems and more particularly to random access memory.

Description of Related Art

Random Access Memory (RAM) is a type of volatile memory (i.e., maintains data only while power is supplied). Presently, Static RAM (SRAM) and Dynamic RAM (DRAM) are the most common forms of RAM. Both SRAM and DRAM include a plurality of memory cells for storing binary bits of data. The memory cells are arranged in rows and columns, where a row is a word line and column is a bit line. To read bits from a row of memory cells, a word line is activated and the bit line of each column is read. To write bits to a row of memory cells, a word line is activated and the bit line of each column is driven with a bit of data to be stored in the corresponding memory cell.

A primary difference between SRAM and DRAM is the nature of the memory cells. An SRAM memory cell includes a six-transistor configuration, where four transistors for two inverters and the remaining two transistors couple to an inverting bit line and non-inverting bit line of a column of SRAM memory cells. The two inverters, which are piggy-backed together (i.e., the input of one is coupled to the output of the other), store the bit.

A DRAM memory cell includes a transistor and a capacitor. The capacitor holds a charge to represent a stored bit. The transistor couples the memory cell to a bit line of a column of DRAM memory cells. With the parasitic capacitance of the bit line being greater than the capacitance of a DRAM memory cell, the DRAM chip includes refresh circuitry to pre-charge the bit line and then, after reading the voltage on the DRAM memory cell capacitor, refreshing the stored voltage to its corresponding bit level.

BRIEF DESCRIPTION OF THE SEVERAL VIEWS OF THE DRAWING(S)

FIGS. 32-34 are schematic diagrams of various examples of an oscillating component and a DC voltage in accordance with the invention;

Figure 35:
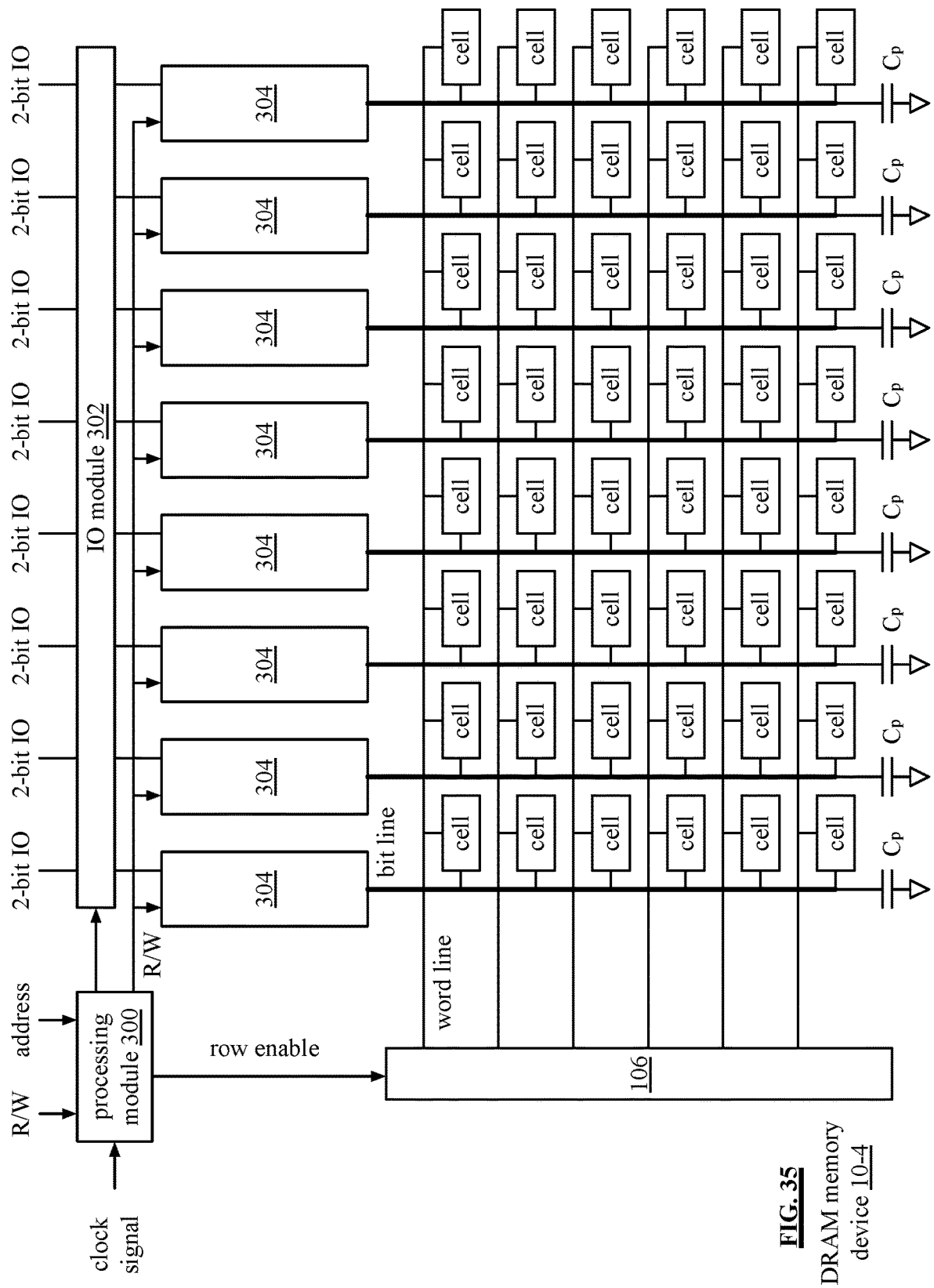
FIG. 35 is a schematic block diagram of another embodiment of a DRAM memory device in accordance with the present invention.
Figure 40:
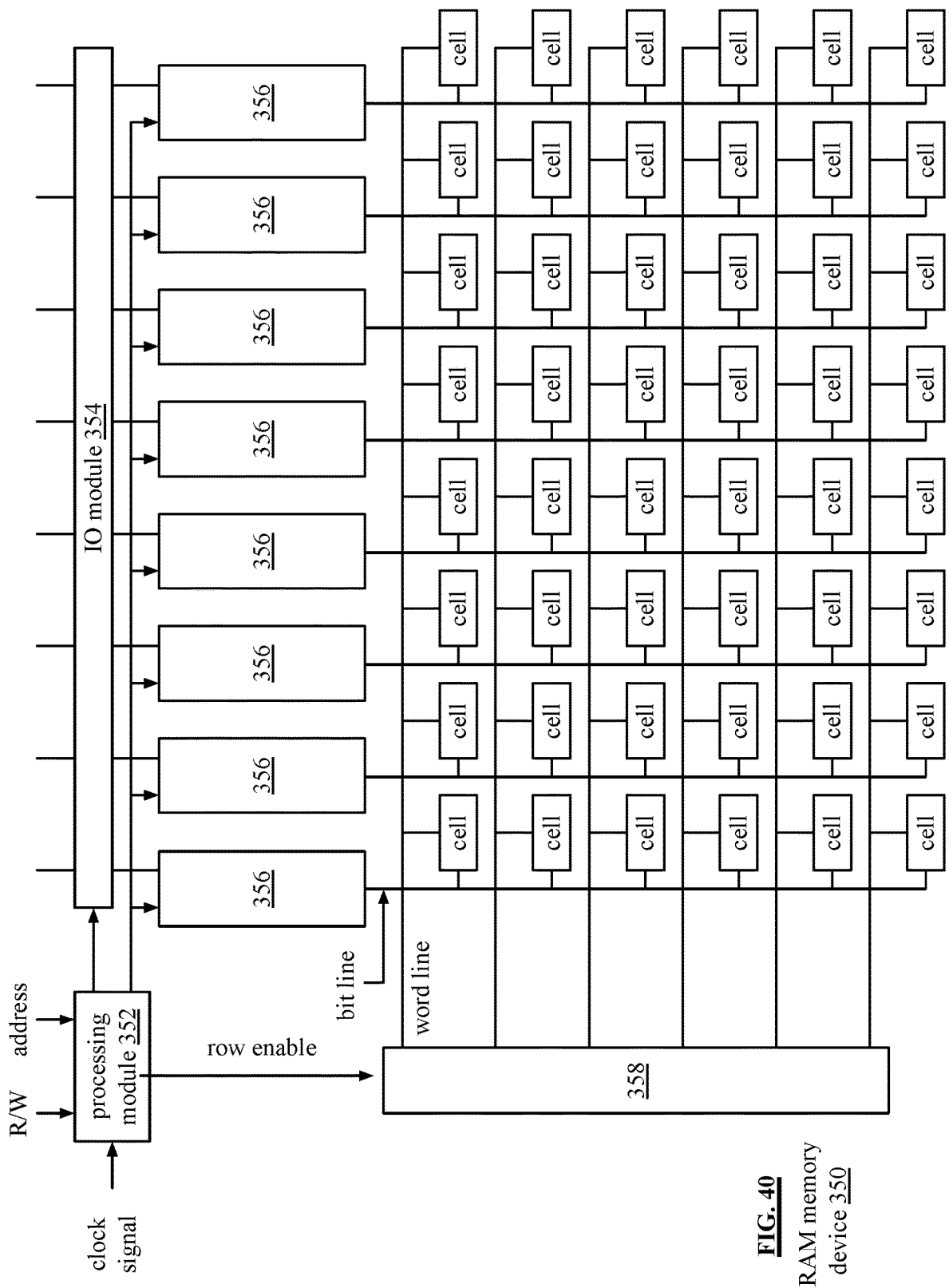
Figure 41:
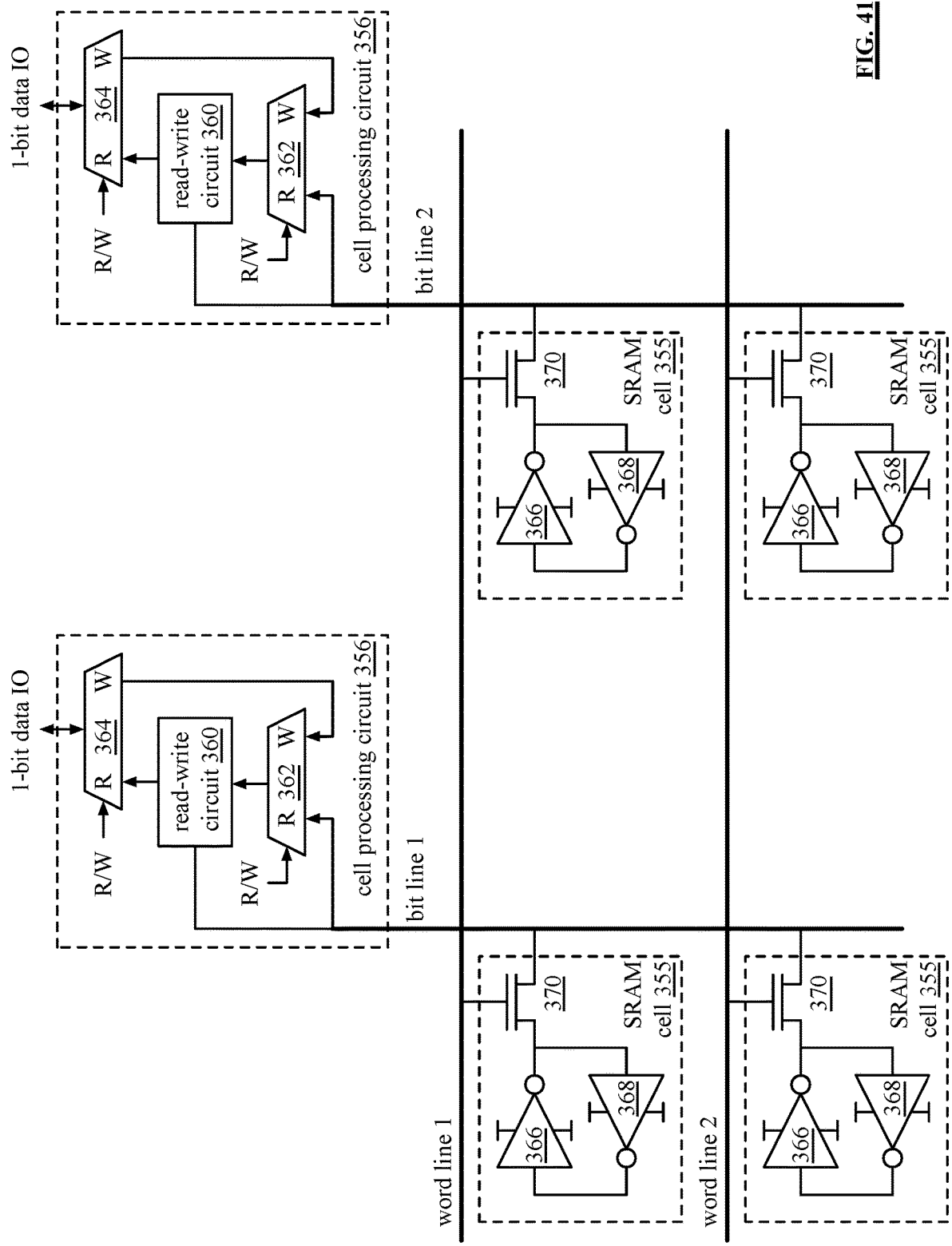
Figure 42:
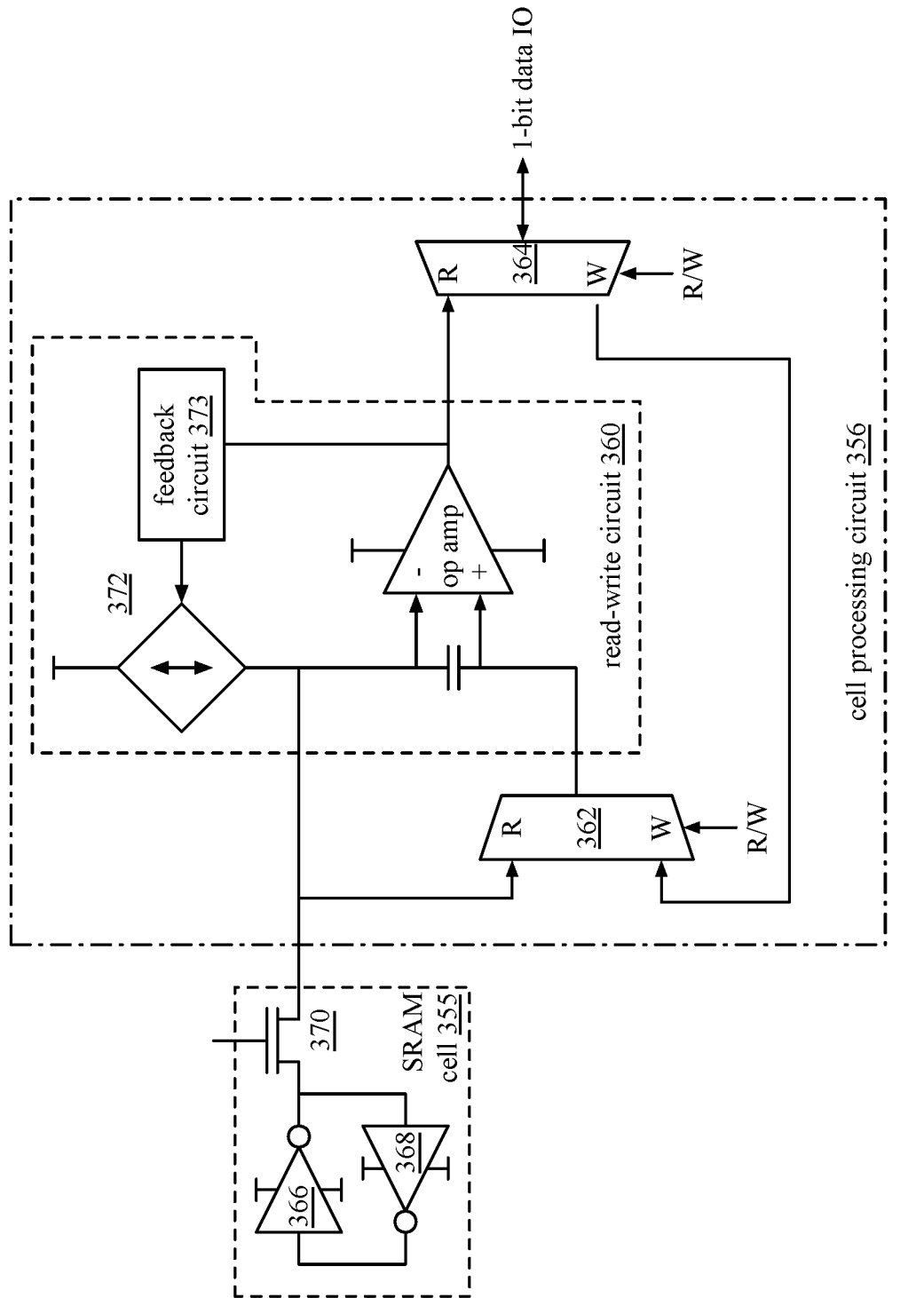

FIGS. 38A, 38B, 39A, and 39B are timing diagrams of an example of operation of a cell processing circuit of FIG. 35 in accordance with the present invention;

FIG. 40 is a schematic block diagram of another embodiment of an SRAM memory device in accordance with the present invention;

FIG. 41 is a schematic block diagram of an embodiment of a cell processing circuit of the SRAM memory device of FIG. 40 in accordance with the present invention; and FIG. 42 is a schematic block diagram of an embodiment of a cell processing circuit of the SRAM memory device of FIG. 40 in accordance with the present invention.

DETAILED DESCRIPTION OF THE INVENTION

Figure 1:
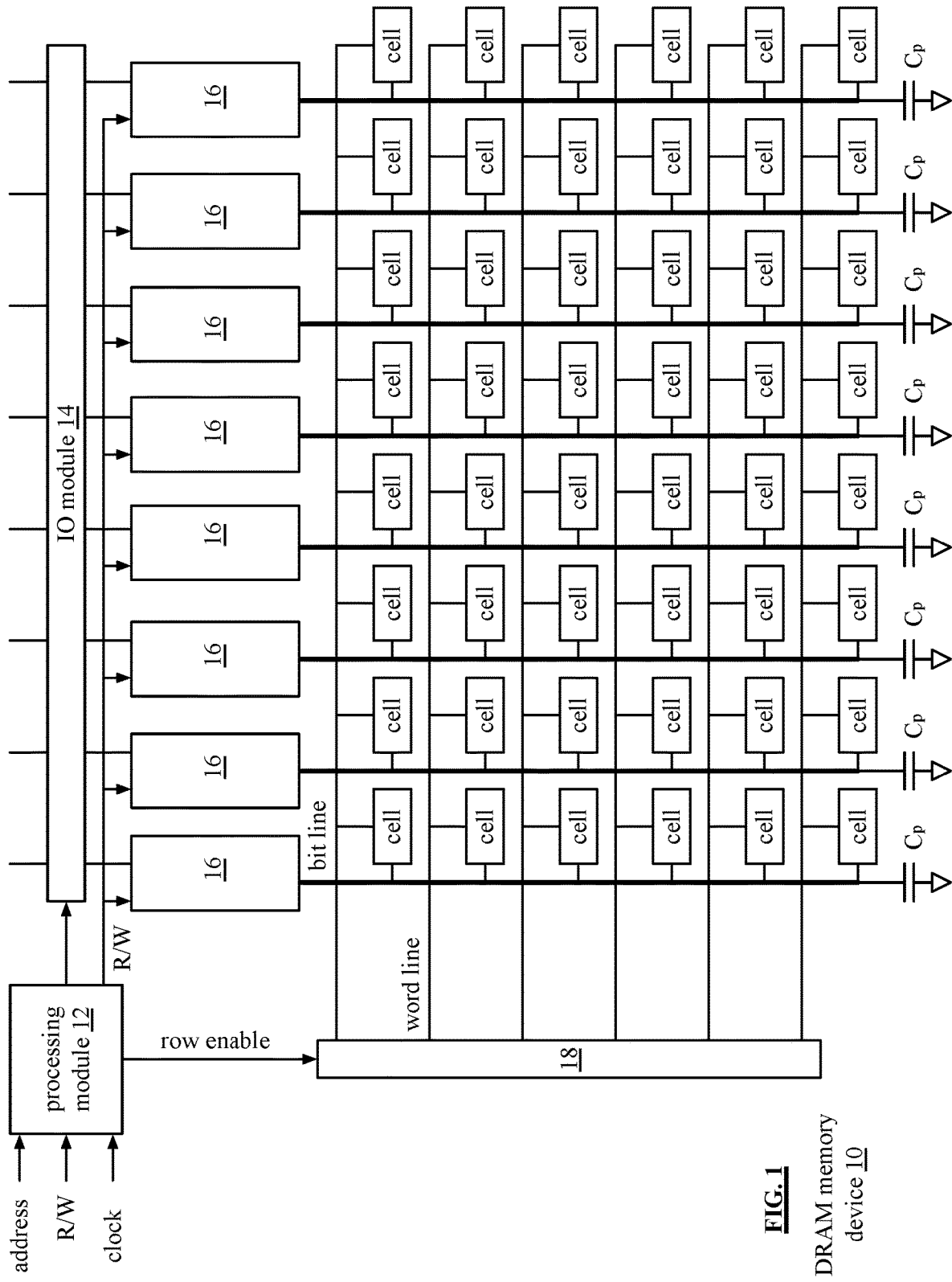
FIG. 1 is a schematic block diagram of an embodiment of a DRAM memory device in accordance with the present invention.

FIG. 1 is a schematic block diagram of an embodiment of a Dynamic Random Access Memory (DRAM) memory device 10 that includes a processing module 12, an input/output (IO) module 14, a plurality of cell processing circuits 16, a row select module 18, and a plurality of DRAM cells ("cell"). The DRAM memory device 10, and other DRAM memory devices discussed herein, may be implemented in a variety of ways. For example, the DRAM memory device is a die incorporated into an integrated circuit. As another example, the DRAM memory device is an integrated circuit that includes one or more dies. As yet another example, the DRAM memory device is a portion of a die that includes one or more other circuits. As a further example, the DRAM memory device is a portion of an integrated circuit that includes one or more other circuits.

The cells are arranged into rows and columns. A column of cells is coupled to a bit line, which is coupled to a cell processing circuit 16. Each bit line has a parasitic capacitance $C_p$. A row of cells is coupled to a word line, which is coupled to the row select module 18. The number of cells in a row and the number of columns is dependent on the desired cell density of the DRAM memory device. As an example, a 1 Gb cell density (e.g., stores 1 Giga-bit of data) DRAM memory device includes 8 columns and 128 million rows. In this example, the IO module 14 includes an 8-bit bus; one for each column. In another example, a 1 Gb cell density DRAM memory device includes 16 columns and 64 million rows. In this example, the IO module 14 includes a 16-bit bus; one for each column. In general, a DRAM memory device includes $2^Y$ columns and $2^N$ rows, where Y is equal to or greater than 1 and where N is equal to or greater than 3.

The processing module 12 receives an address, a Read/Write (R/W) signal, and a clock signal. The processing module 12 converts the clock signal (e.g., the memory clock) into an IO bus clock signal based on the data rate for the DRAM memory device. For example, the processing module generates a 100 MHz IO bus clock signal from a 100 MHz memory clock for single data rate (SDR) and double data rate (DDR) applications. As another example, the processing module generates a 200 MHz IO bus clock signal from a 100 MHz clock signal for a quad data rate (QDR) application. Other data rate applications, such as DDR2, DDR3, and DDR4 have different IO bus clock signals. For each data access of a cycle of the memory clock (e.g., once per memory clock cycle for SDR, twice per memory clock cycle for DDR, and four times per memory clock cycle for QDR), the processing module interprets an address to produce a row enable signal. The row enable signal activates a word line (e.g., a row) such that the cells of the activated row are coupled via their respective bit lines to their respective cell processing circuits 16.

For a read operation, a cell processing circuit 16 reads a voltage stored an active cell. The cell processing circuit 16 provides a logic 1 voltage or a logic 0 voltage to the IO module 14 based on the voltage stored by the cell. This process will be discussed in greater detail with reference to one or more of the subsequent Figures.

For a write operation, the cell processing circuit 16 receives a bit of data from the IO module 14. The cell processing circuit 16 drives a voltage representative of the bit on to its bit line. The cell on the bit line that is activated via its word line has the voltage written to it. For example, if the write input bit is a logic 0, the cell processing circuit 16 creates a logic 0 voltage and drives it onto the bit line. The activated cell, via its word line, stores the logic 0 voltage. As another example, if the write input bit is a logic 1, the cell processing circuit 16 creates a logic 1 voltage and drives it onto the bit line. The activated cell, via its word line, stores the logic 1 voltage. This process will be discussed in greater detail with reference to one or more of the subsequent Figures.

Figure 2:
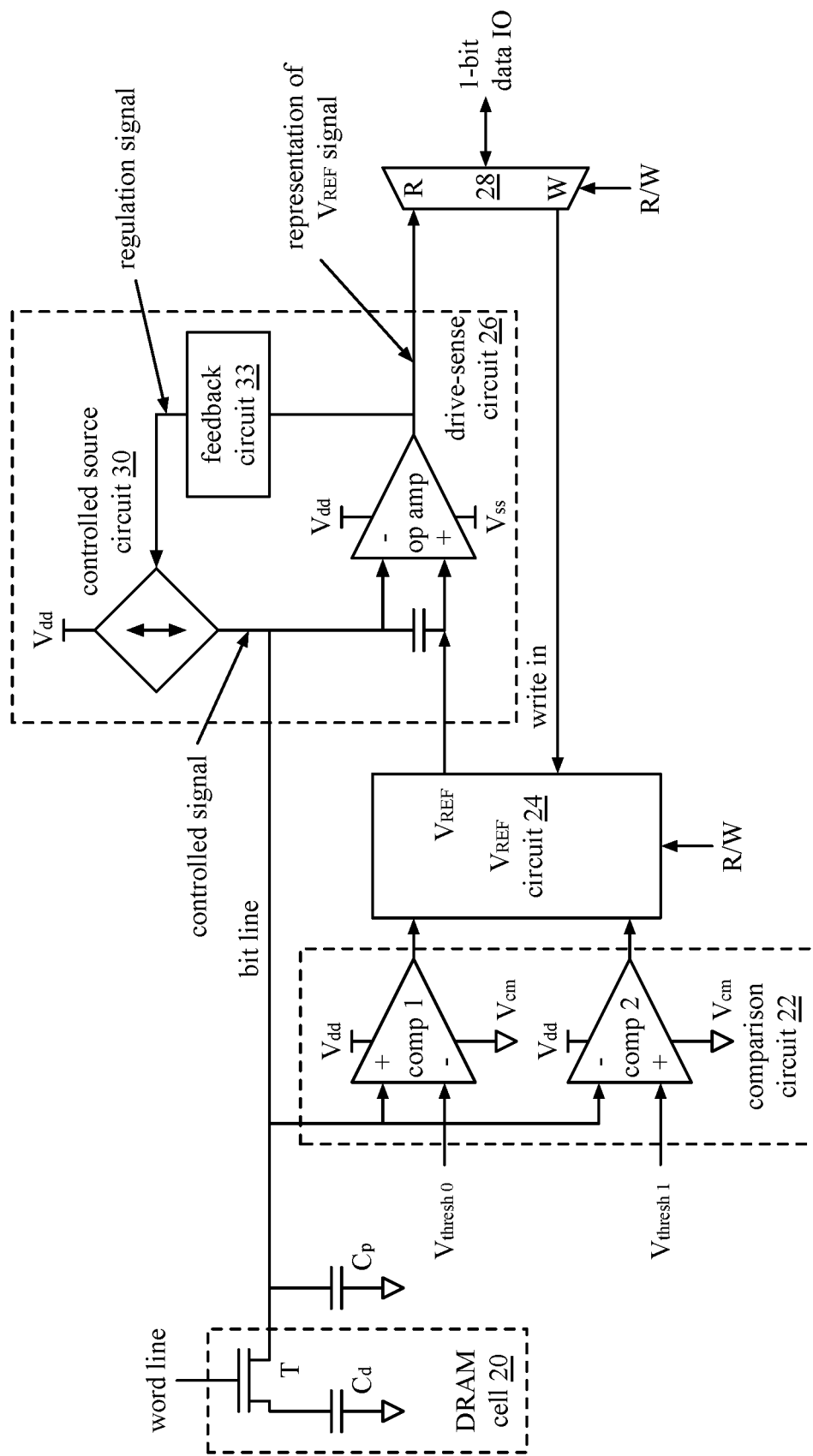
FIG. 2 is a schematic block diagram of an embodiment of a cell processing circuit in accordance with the present invention.

FIG. 2 is a schematic block diagram of an embodiment of a cell processing circuit 16 that is coupled to a DRAM cell 20. The DRAM cell 20 includes a capacitor $C_d$ and a transistor T. The capacitance of the DRAM cell capacitor $C_d$ is less than the parasitic capacitance $C_p$ of the bit line. How much less is dependent on the length, width, and spacing of the bit line. When the transistor is on via the word line, $C_d$ is coupled in parallel with $C_p$. Since $C_p$ is greater than $C_d$, the voltage stored on $C_d$ moves the voltage on the bit line based on a ratio between the capacitance of $C_d$ and $C_p$. The greater the ratio, the less voltage stored by $C_d$ affects the voltage on the bit line.

The cell processing circuit 16 includes a comparison circuit 22, a voltage reference (VREF) circuit 24, a drive-sense circuit 26 and a read-write selection circuit 28. In general, the cell processing circuit 16 functions to read a voltage stored by the DRAM cell capacitor Ca concurrently with refreshing the voltage and without having to pre-charge the bit line. This reduces power consumption, improves efficiency, and/or increases data throughput of the DRAM memory device.

Figure 4:
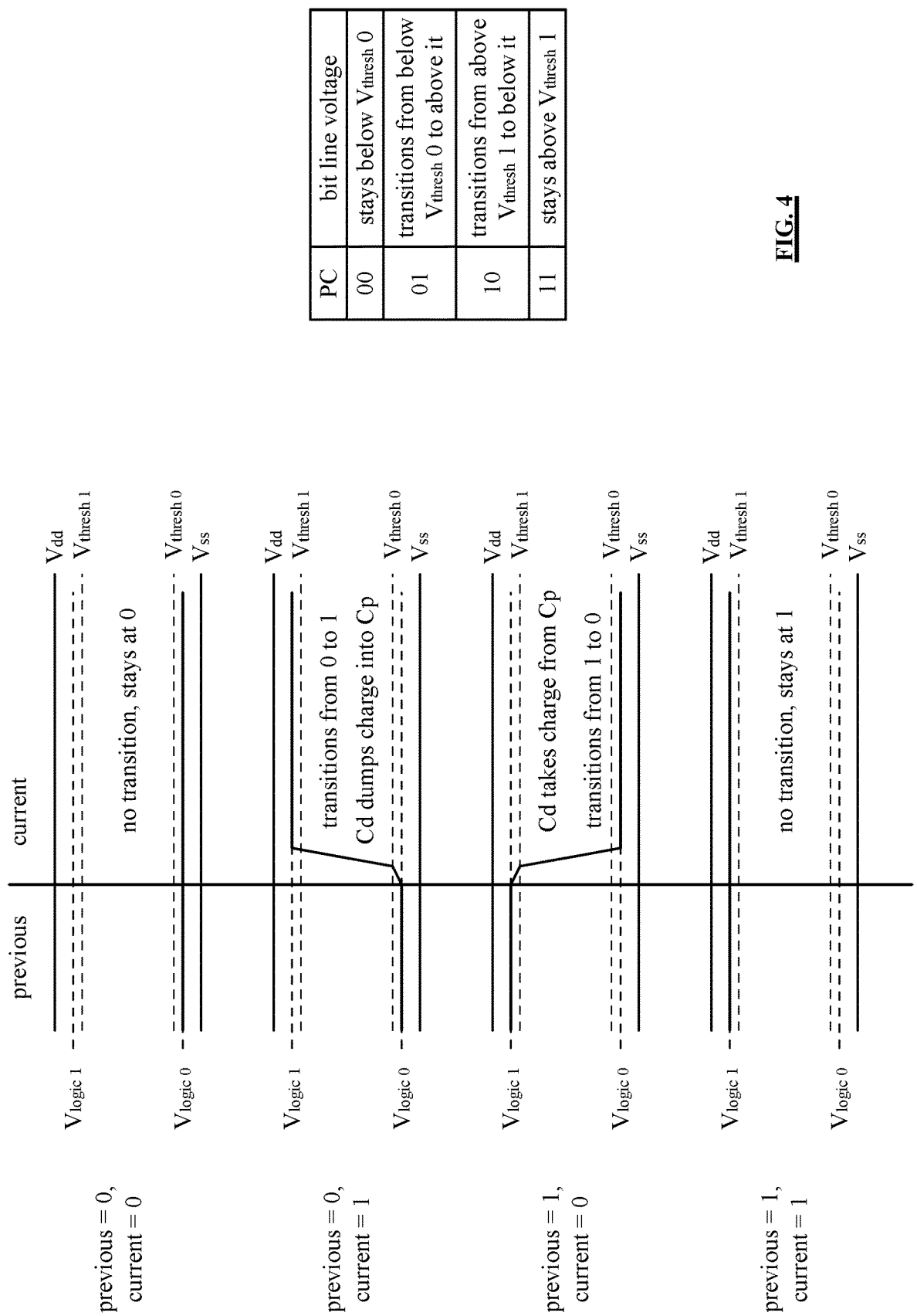
FIG. 4 is a timing diagram of an example of a cell processing circuit in accordance with the present invention.
Figure 5:
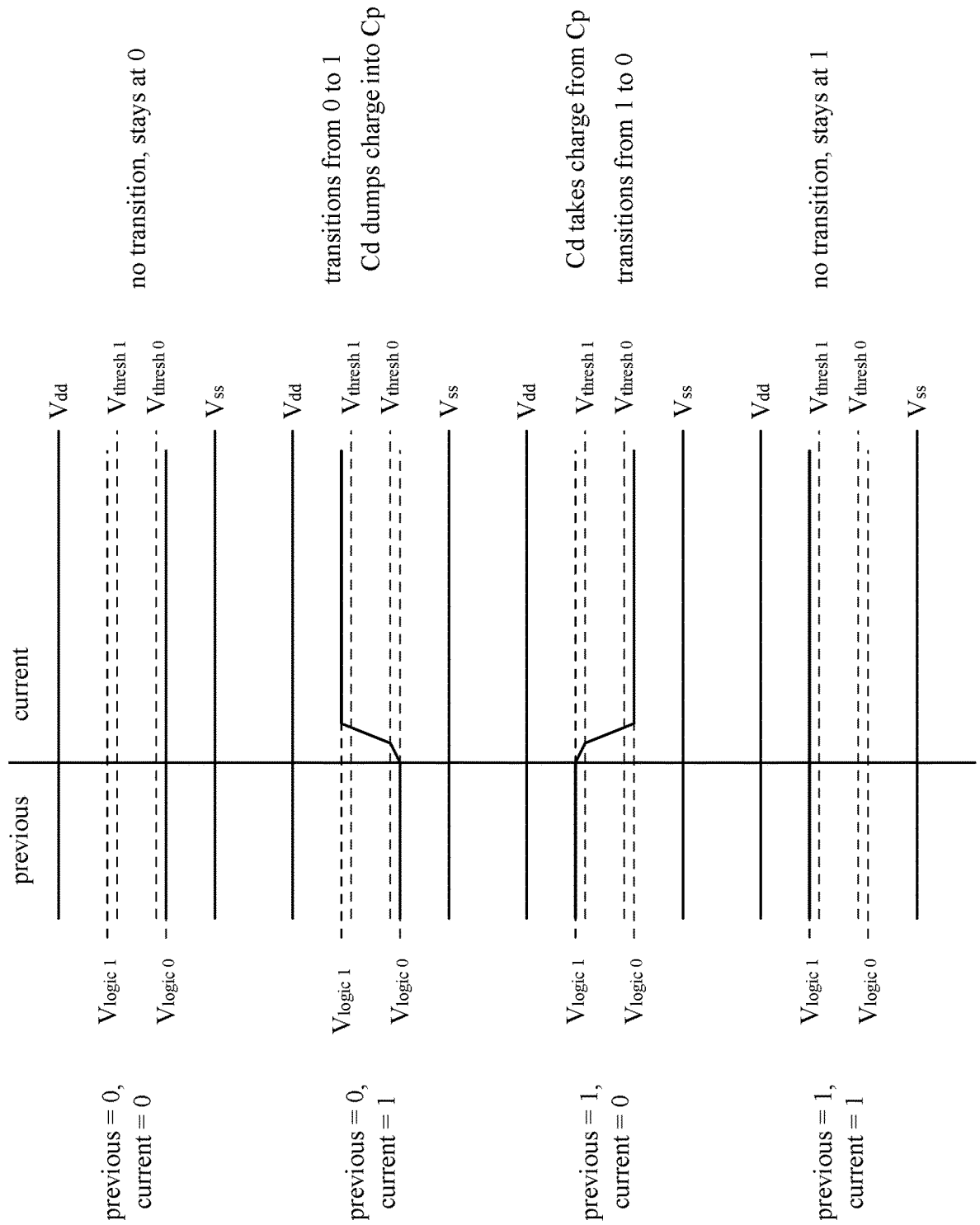
FIG. 5 is a timing diagram of another example of a cell processing circuit in accordance with the present invention.

Within the cell processing circuit 16, the comparison circuit 22 includes two comparators (comp 1 & comp 2). The first comparator compares a voltage on the bit line (e.g., voltage stored by $C_d$ of a current word line as it affects the voltage on the bit line from a previous active word line) with a logic 0 threshold voltage to produce a first comparison output. The second comparator compare the voltage on the bit line with a logic 1 threshold voltage to produce a second comparison output. The first and second comparison outputs provide a voltage difference indication, which indicates a voltage difference between a previous voltage on the bit line and a current voltage on the bit line. The previous voltage corresponds to a logic 1 voltage or a logic 0 voltage stored in a previous DRAM cell of a column of DRAM cells (i.e., the cell activated by the word line that was active prior to the current word line being active). The current voltage corresponds to a logic 1 voltage or a logic 0 voltage being stored in a current DRAM cell of the column of DRAM cells (i.e., the cell activated by the word line that is currently). FIGS. 4 and 5 provide examples of operation of the comparison circuit 22.

Continuing with the discussion of the cell processing circuit 16 of FIG. 2, the voltage reference circuit 24 generates a read voltage reference based on the voltage difference indication when the active word line is for a read operation (e.g., the DRAM memory device is in a read mode). The read voltage reference is a logic 0 voltage when the voltage difference indication indicates that the voltage stored by the DRAM cell capacitor $C_d$ corresponds to the logic 0 voltage and is a logic 1 voltage when the voltage difference indication indicates that the voltage stored by the DRAM cell capacitor $C_d$ corresponds to the logic 1 voltage.

As an example, a logic 0 voltage is "x" % of the positive supply voltage $V_{dd}$ with reference to a common mode voltage $V_{cm}$, where $V_{cm}$ is approximately ½ between $V_{dd}$ and a return voltage Vss. Continuing with this example, a logic 1 voltage is "y" % of $V_{dd}$ with respect to $V_{cm}$, where "y" is greater than "x". As a specific example, $V_{dd}$ is 1.2 volts, $V_{ss}$ is 0 volts and $V_{cm}$ is 0.6 volts. In another specific example, $V_{dd}$ is 1.2 volts, $V_{ss}$ is −1.2 volts and $V_{cm}$ is 0 volts. As another specific example "x" is 10% and "y" is 90%. As a further specific example, "x" is 40% and "y" is 60%. As used herein, the symbols associated with $V_{dd}$, $V_{cm}$, and $V_{ss}$ shall mean the corresponding voltage regardless of whether the symbol is labeled with $V_{dd}$, $V_{cm}$, and $V_{ss}$ or not.

The drive-sense circuit 26 includes an operational amplifier (op amp), a feedback circuit 33, and a controlled source circuit 30 (e.g., controlled voltage source, a controlled current source, etc.). The feedback circuit 33 includes one or more of a conductive trace, one or more resistors, and one or more capacitors to provide a desired operational mode for the op amp. For example, the feedback circuit 33 includes a conductive trace (e.g., a wire, a metal layer trace, etc.) such that the op-amp functions as a unity gain amplifier. As another example, the feedback circuit 33 includes one or more resistors and/or one or more capacitance to establish a gain for the op-amp.

In the read mode, the drive-sense circuit 26 receives the read voltage reference ($V_{REF}$) from the $V_{REF}$ circuit 24 via an input of the op amp. The other input of the op amp is coupled to the bit line and an output of the controlled source circuit 30. The op amp functions to match its input voltages. As such, the output of the op amp is adjusted to force the bit line to match the read voltage reference (e.g., a logic 0 voltage or a logic 1 voltage). Since the controlled source circuit 30 is driving the bit line, it charges the DRAM cell capacitor $C_d$ and the parasitic capacitance $C_p$ of the bit line to the read voltage reference level.

The output of the op amp is coupled to the read (R) node of the read-selection circuit 28 (which may be implemented as a multiplexer). The op amp outputs a representation of the read voltage reference when the current DRAM cell is in the read mode. The representation of the read voltage reference is the read voltage reference, an amplified (e.g., scaled up or scaled down) version of the read voltage reference, a voltage that indicates the read voltage reference.

As such, the cell processing circuit 16 uses the voltage driven onto the bit line from a previous word line to read the voltage stored by a DRAM cell coupled to the bit line for a current word line. In this manner, the cell processing circuit 16 is looking for a 0 to 0 PC transition, a 0 to 1 PC transition, a 1 to 0 PC transition, and a 1 to 1 PC transition, where the PC transition means the voltage transition from the voltage driven onto the bit line from a previous word line to the voltage affect the voltage stored by the DRAM cell of the currently active word line has on the bit line voltage.

In a write mode, the read-write selection circuit 28 provides a write input to the voltage reference circuit 24 (e.g., a logic 0 voltage or a logic 1 voltage). The voltage reference circuit 24 generates a write voltage reference based on the write input and provides the write voltage reference to the drive-sense circuit 26. The drive-sense circuit 26 generates a write input voltage based on the write voltage reference and drives it onto the bit line to write the voltage into the active DRAM cell.

In an alternative embodiment, the supply voltage Vdd for the controlled source circuit 30 is replaced with a higher voltage than Vdd. This will increase the charge rate of charging the bit line.

Figure 3:
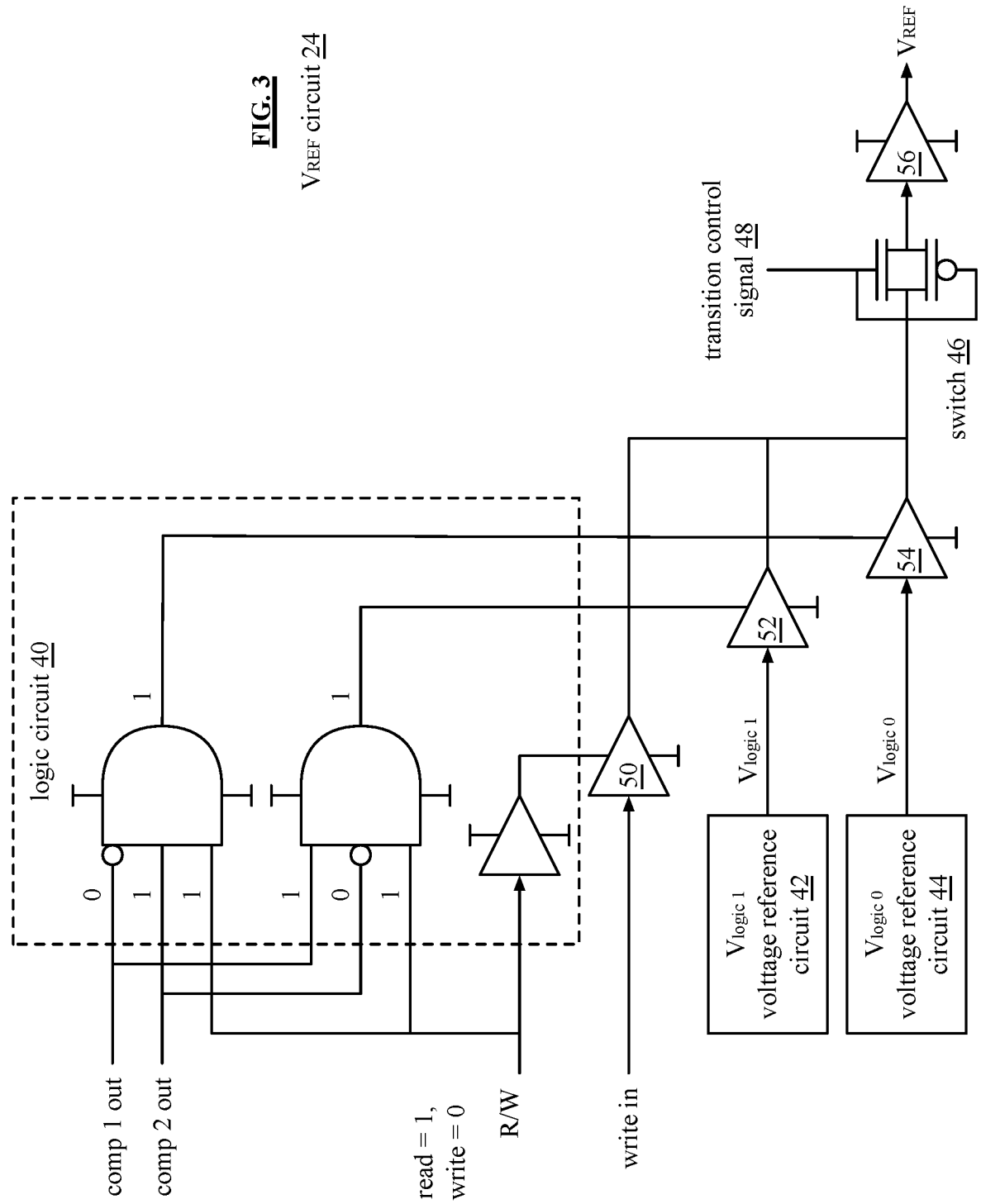
FIG. 3 is a schematic block diagram of an embodiment of a voltage reference circuit of a cell processing circuit in accordance with the present invention.

FIG. 3 is a schematic block diagram of an embodiment of a voltage reference circuit 24 of the cell processing circuit 16. The voltage reference circuit 24 includes a logic 0 voltage reference circuit 42, a logic 1 voltage reference circuit 44, a first gated driver 52, a second gate driver 54, and a logic circuit 40. The voltage reference circuit 24 may further include a switch 46, a third gated driver 50, and an output driver 56. The logic circuit 40 includes two AND gates and a read/write (R/W) driver.

The logic 0 voltage reference circuit 42 produces a logic 0 voltage and the logic 1 voltage reference circuit 44 produces a logic 1 voltage. The logic 0 and logic 1 voltage reference circuits may be implemented in a variety of ways. For example, the voltage reference circuits 42 and 44 are bandgap circuits. As another example, the voltage reference circuits 42 and 44 are linear regulators. As yet another example, the voltage reference circuits 42 and 44 are DC-to-DC converters. As a further example, the voltage references 42 and 44 are of a different construct (e.g., voltage reference 42 is a bandgap reference and voltage reference 44 is a linear regulator).

The logic circuit 40 enables the first gate driver 52, when the DRAM cell is in the read mode, when the first comparison output is in a first state, and when the second comparison output is in a second state. When the first gated driver 52 is enabled, it outputs the logic 0 voltage to the switch 46. When the switch is closed based on the transition control signal 48 (e.g., in a second control state), the switch 46 passes the logic 0 voltage as the read voltage reference $V_{REF}$.

The logic circuit 40 enables the second gate driver 54 when the DRAM cell is in the read mode, when the first comparison output is in the second state, and when the second comparison output is in the first state. When the second gate driver is enabled, it outputs the logic 1 voltage to the switch 46. When the switch is closed based on the transition control signal 48, the switch 46 passes the logic 1 voltage as the read voltage reference $V_{REF}$.

When the DRAM cell is in a write mode, the logic circuit enables the third gated driver 50 to output a voltage corresponding to the write input to the switch 46. In the write mode, switch 46 is closed such that it outputs the write input as the write voltage reference $V_{REF}$. Note that, for a DRAM cell, it is in a write mode or a read mode. Further note, that some DRAM cells of the DRAM memory device may be in a read mode and other DRAM cells may be in a write mode for read-write operations. Still further note, that the read mode and write mode may apply to the cells of the DRAM memory device.

FIG. 4 is a timing diagram of an example of operation of the cell processing circuit 16. In this example, the voltage on the bit line is compared in four states of transition from the previous voltage on the bit line to the current voltage on the bit line. The four previous-current (PC) states are:

- 00, the previously active DRAM cell and the currently active DRAM cell are both storing a logic 0 voltage;
- 01, the previously active DRAM cell is storing a logic 0 voltage and the currently active DRAM cell is storing a logic 1 voltage;
- 10, the previously active DRAM cell is storing a logic 1 voltage and the currently active DRAM cell is storing a logic 0 voltage; and
- 11, the previously active DRAM cell and the currently active DRAM cell are both storing a logic 1 voltage.

In the 00 states and the 11 states, the voltage on the bit line does not change when the transition occurs from the previously active word line to the currently active word line. Thus, by detecting no change to the voltage on the bit line, the cell processing circuit 16 knows that the currently active DRAM cell on the bit line is storing the same voltage as the previously active DRAM cell on the bit line. In these instances, the voltage reference circuit 24 generates the read voltage reference to correspond to the stored voltage and the drive-sense circuit drives the read voltage reference onto the bit line to refresh the current DRAM cell.

In the 01 state, the voltage on the bit line is transitioning from the logic 0 voltage to a logic 1 voltage. When the currently active DRAM cell is activated, the logic 1 voltage stored on its capacitor dumps charge into the parasitic capacitance of the bit line, causing the voltage on the bit line to rise. Once the voltage on the bit line rises above the logic 0 threshold, the voltage reference circuit generates a logic 1 voltage. The drive sense circuit then drives the logic 1 voltage onto the bit line, causes it to rise to the logic 1 voltage level.

In the 10 state, the voltage on the bit line is transitioning from the logic 1 voltage to a logic 0 voltage. When the currently active DRAM cell is activated, the logic 0 voltage stored on its capacitor receives charge from the parasitic capacitance of the bit line, causing the voltage on the bit line to decrease. Once the voltage on the bit line decreases below the logic 1 threshold, the voltage reference circuit generates a logic 0 voltage. The drive sense circuit then drives the logic 0 voltage onto the bit line, causes it to decrease to the logic 0 voltage level. As example voltage levels, the logic 1 voltage is 90% of $V_{dd}$, the logic 1 threshold is 85% of $V_{dd}$, the logic 0 voltage is 10% of $V_{dd}$, and the logic 0 threshold is 15% of $V_{dd}$.

FIG. 5 is a timing diagram of another example of low voltage operation of the cell processing circuit 16. The cell processing circuit 16 works similarly with respect to this timing diagram as it did with respect to the timing diagram of FIG. 4. The difference in this diagram is the voltage levels of the logic 0 voltage, the logic 0 threshold, the logic 1 threshold, and the logic 1 voltage. As example voltage levels, the logic 1 voltage is 65% of $V_{dd}$, the logic 1 threshold is 60% of $V_{dd}$, the logic 0 voltage is 35% of $V_{dd}$, and the logic 0 threshold is 40% of $V_{dd}$. By reducing the levels of the voltages, power consumption is reduced and settling times are reduced since the voltage swing per bit line is reduced.

Figure 6:
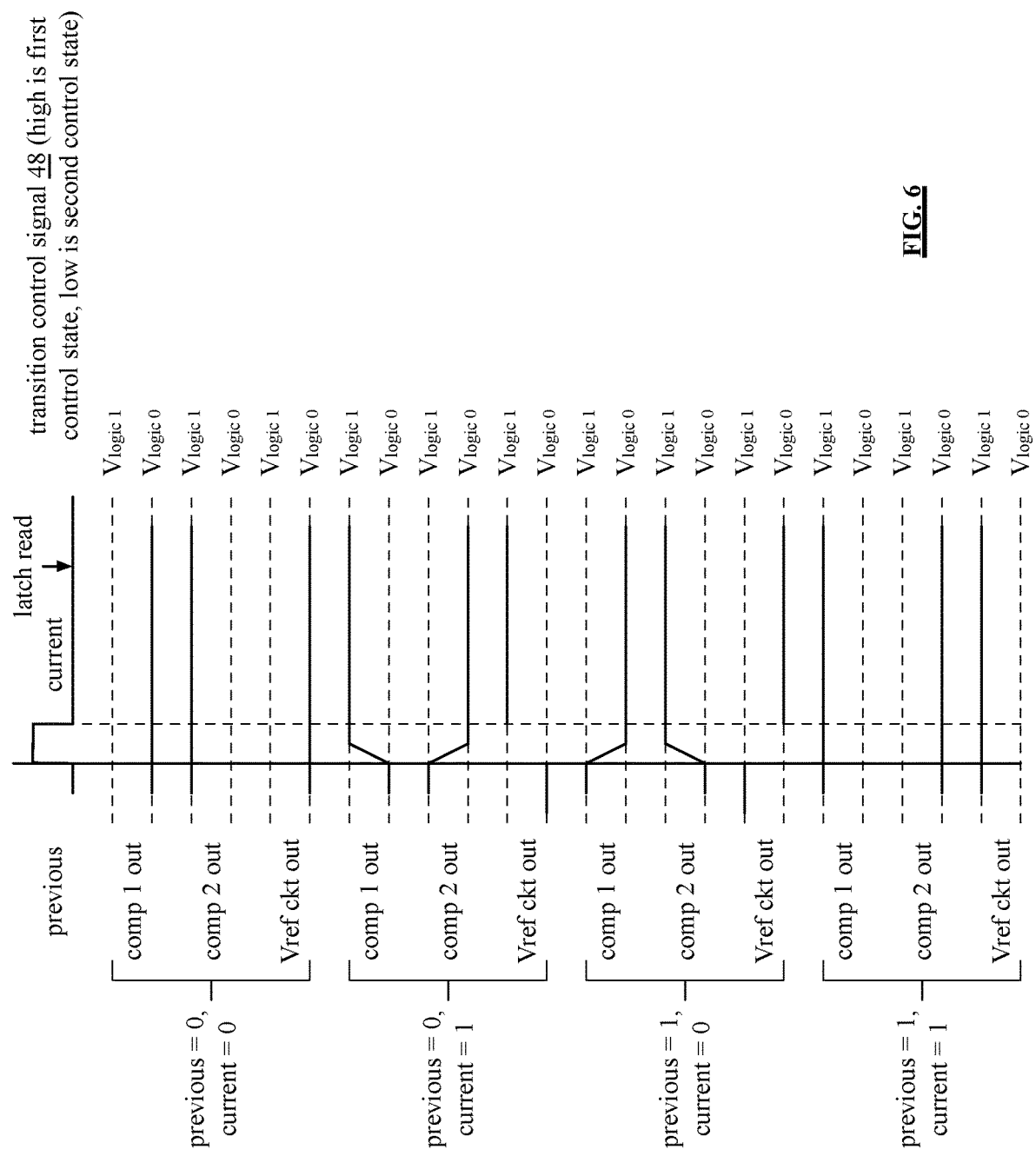
FIG. 6 is a timing diagram of another example of a cell processing circuit in accordance with the present invention.

FIG. 6 is a timing diagram of another example of operation of the voltage reference circuit 24 of the cell processing circuit 16. During the transition from the previous word line being active to the current word line being active, the output of the voltage reference circuit 24 is placed in a high impedance state (switch 46 is open based on the transition control signal 48 being in a first control state). With the voltage reference circuit 24 in a high impedance state, the capacitor across the inputs of the op amp of the drive-sense circuit 26 keeps the voltage on the bit line to the previous voltage (i.e., the voltage stored by the previously active DRAM cell). With the voltage reference circuit in a high impedance state and the drive-sense circuit not driving the bit line, the voltage stored by the DRAM cell capacitor can affect the voltage on the bit line. Once the DRAM cell capacitor has had a chance to affect the voltage on the bit line, the switch is closed, the voltage reference circuit generates the read voltage reference, and the drive-sense circuit drives the read voltage reference onto the bit line.

For state 00 (e.g., previous=0, current=0), comparator 1's output stays low (e.g., logic 0 voltage) and comparator 2's output stays high (e.g., logic 1 voltage). As such, the read voltage reference remains low (e.g., the reference circuit outputs a logic 0 voltage). For state 11 (e.g., previous=1, current=1), comparator 1's output stays high (e.g., logic 1 voltage) and comparator 2's output stays low (e.g., logic 0 voltage). As such, the read voltage reference remains high (e.g., the reference circuit outputs a logic 1 voltage).

For state 01 (e.g., previous=0, current=1), comparator 1's output transitions from low to high and comparator 2's output transitions from high to low. Based on these transitions, the voltage reference circuit creates a logic 0 voltage as the read voltage reference for the currently active DRAM cell.

For state 10 (e.g., previous=1, current=0), comparator 1's output transitions from high to low and comparator 2's output transitions from low to high. Based on these transitions, the voltage reference circuit creates a logic 1 voltage as the read voltage reference for the currently active DRAM cell.

Figure 7:
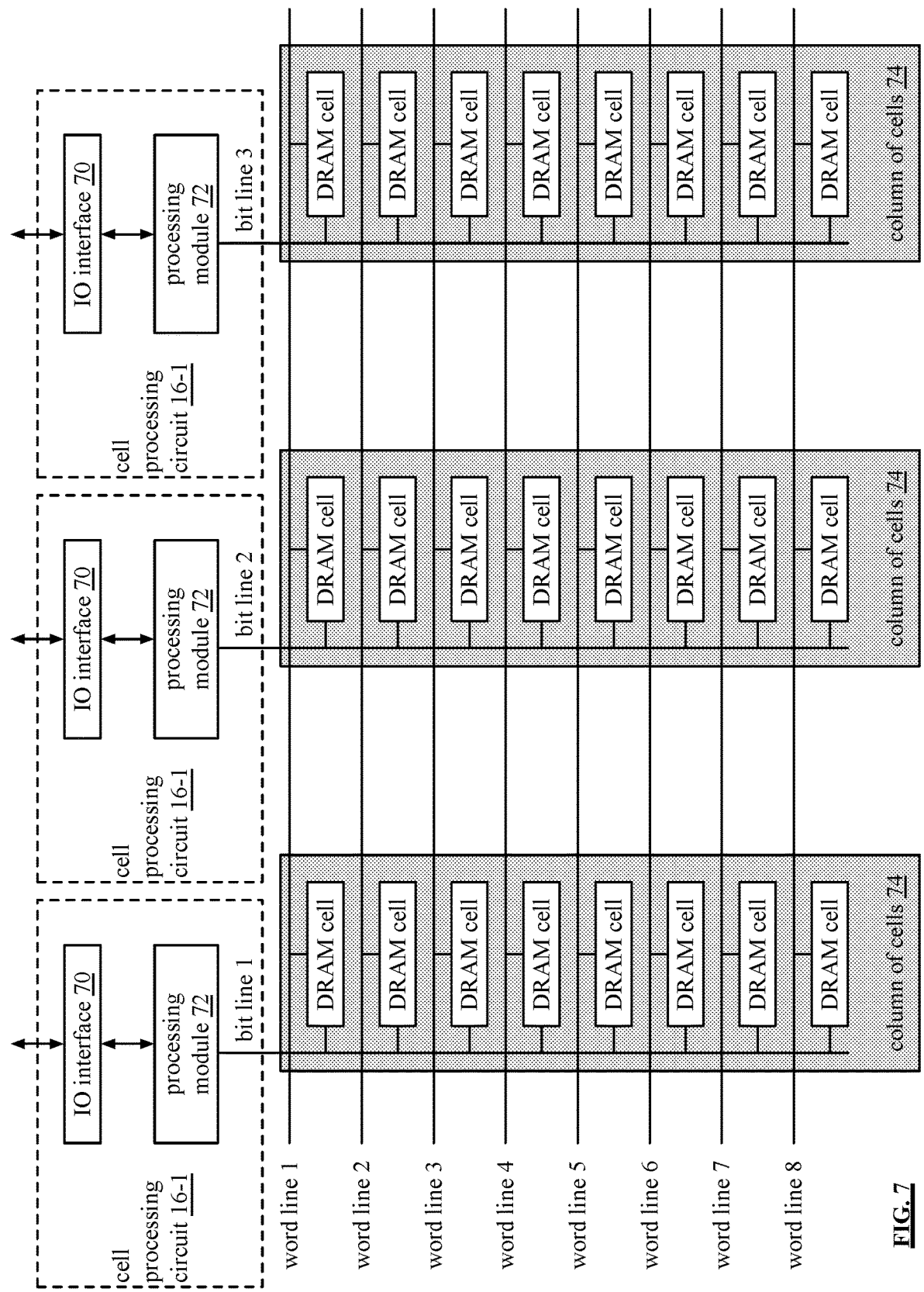
FIG. 7 is a schematic block diagram of another embodiment of a voltage reference circuit in accordance with the present invention.

FIG. 7 is a schematic block diagram of another embodiment of a cell processing circuit 16-1 that includes a processing module 72 and an input/output (IO) interface 70. In this example, three cell processing circuits 16-1 are each coupled to a respective column of cells 74 via a bit line. The cells in a column 74 are DRAM cells. The IO interface 70 is a circuit that includes a combination of hardware and software. The hardware provides the physical connectivity for data bits to be inputted to and outputted from the cell processing circuit 16-1. The software provides control over the inputting and outputting of data bits to preserve the meaning of data that is represented by the bits. For example, in ASCII (American Standard Code for Information Interchange), a capital "A" is represented by the binary bits of 0100 0001 (decimal 65) and a lower case "a" is represented by the binary bits of 0110 0001 (decimal 97). As such, the software of the IO module ensures that 0100 0001 is inputted or outputted from the cell processing circuit for a capital "A" and 0110 0001 is inputted or outputted from the cell processing circuit for a lower case "a".

Figure 8:
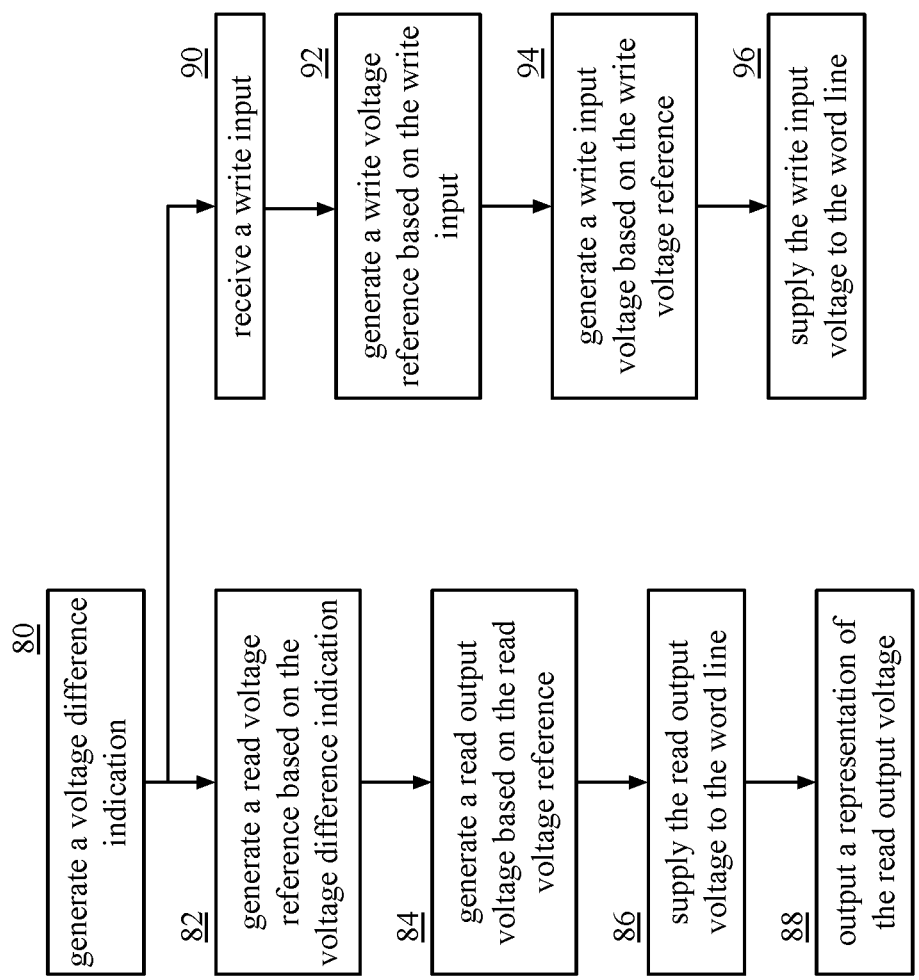
FIG. 8 is a logic diagram of an example of operation of a cell processing circuit in accordance with the present invention.

The processing module 72 performs the method of FIG. 8 to read or write data to the DRAM cells. The method of FIG. 8 begins at step 80 where the cell processing circuit 16-1 generates a voltage difference indication between a previous voltage on the bit line and a current voltage on the bit line. The previous voltage corresponds to a logic 1 voltage or a logic 0 voltage stored in a previous DRAM cell (e.g., the cell coupled to the previously active word line). The current voltage corresponds to a logic 1 voltage or a logic 0 voltage being stored in the current DRAM cell (e.g., the cell coupled to the currently active word line).

In an embodiment, the cell processing circuit generates the voltage difference indication by comparing a voltage on the bit line with a logic 0 threshold voltage to produce a first comparison output. The cell processing circuit further compares the voltage on the bit line with a logic 1 threshold voltage to produce a second comparison output. From the two comparisons, the cell processing circuit generates the voltage difference indication. As a specific example, the cell processing circuit generates a voltage different indication of 00 when the first comparison output remains low and the second comparison output remains high when the previous DRAM cell and the current DRAM cell are both storing a logic 0 voltage. As another specific example, the cell processing circuit generates a voltage different indication of 01 when the first comparison output transitions from low to high and the second comparison output transitions from high to low when the previous DRAM cell stores a logic 0 voltage and the current DRAM stores a logic 1 voltage.

As yet another specific example, the cell processing circuit generates a voltage different indication of 10 when the first comparison output transitions from high to low and the second comparison output transitions from low to high when the previous DRAM cell stores a logic 1 voltage and the current DRAM stores a logic 0 voltage. As a further specific example, the cell processing circuit generates a voltage different indication of 11 when the first comparison output remains high and the second comparison output remains low when the previous DRAM cell and the current DRAM cell are both storing a logic 1 voltage.

The method branches to step 82 for a read operation and to step 90 for a write operation. For a read operation, the cell processing circuit generates a read voltage reference based on the voltage difference indication at step 82. In an embodiment, the cell processing module generates the read voltage reference further by generating a logic 0 voltage and a logic 1 voltage. The cell processing circuit then outputs the logic 0 voltage or the logic 1 voltage as the read voltage reference based on which is enabled.

In particular, the cell processing circuit produces the logic 0 voltage as the read voltage reference when a transition control signal is in a second control state, when the first comparison output is in a first state, and when the second comparison output is in a second state. Alternatively, the cell processing circuit produces the logic 1 voltage as the read voltage reference when the transition control signal is in a second control state, when the first comparison output is in the second state, and when the second comparison output is in the first state.

The method continues at step 84 where the cell processing circuit generates a read output voltage based on the read voltage reference. The method continues at step 86 where the cell processing circuit supplies the read output voltage on to the bit line. In an embodiment, the cell processing circuit supplies the read output voltage on to the bit by generating a representation of the read voltage reference. The cell processing circuit then generates a regulation signal based on the representation of the read voltage reference. The cell processing circuit then generates a controlled signal (e.g., a controlled voltage signal or a controlled current signal) based on the regulation signal. The cell processing circuit then supplies, as the read output voltage, the controlled signal on to the bit line. The method continues at step 88 where the cell processing circuit outputs a representation of the read output voltage.

For a write mode, the method continues at step 90 where the cell processing circuit receives a write input. The method continues at step 92 where the cell processing circuit generates a write voltage reference based on the write input. In an embodiment, the cell processing circuit generates the write input voltage by generating a representation of the write voltage reference. The cell processing circuit then generates a regulation signal based on the representation of the write voltage reference. The cell processing circuit then generates a controlled signal based on the regulation signal.

The method continues at step 94 where the cell processing circuit generates a write input voltage based on the write voltage reference. The method continues at step 96 where the cell processing circuit supplies the write input voltage on to the bit line. In an embodiment, the cell processing circuit supplies, as the write input voltage, the controlled signal on to the bit line.

Figure 9:
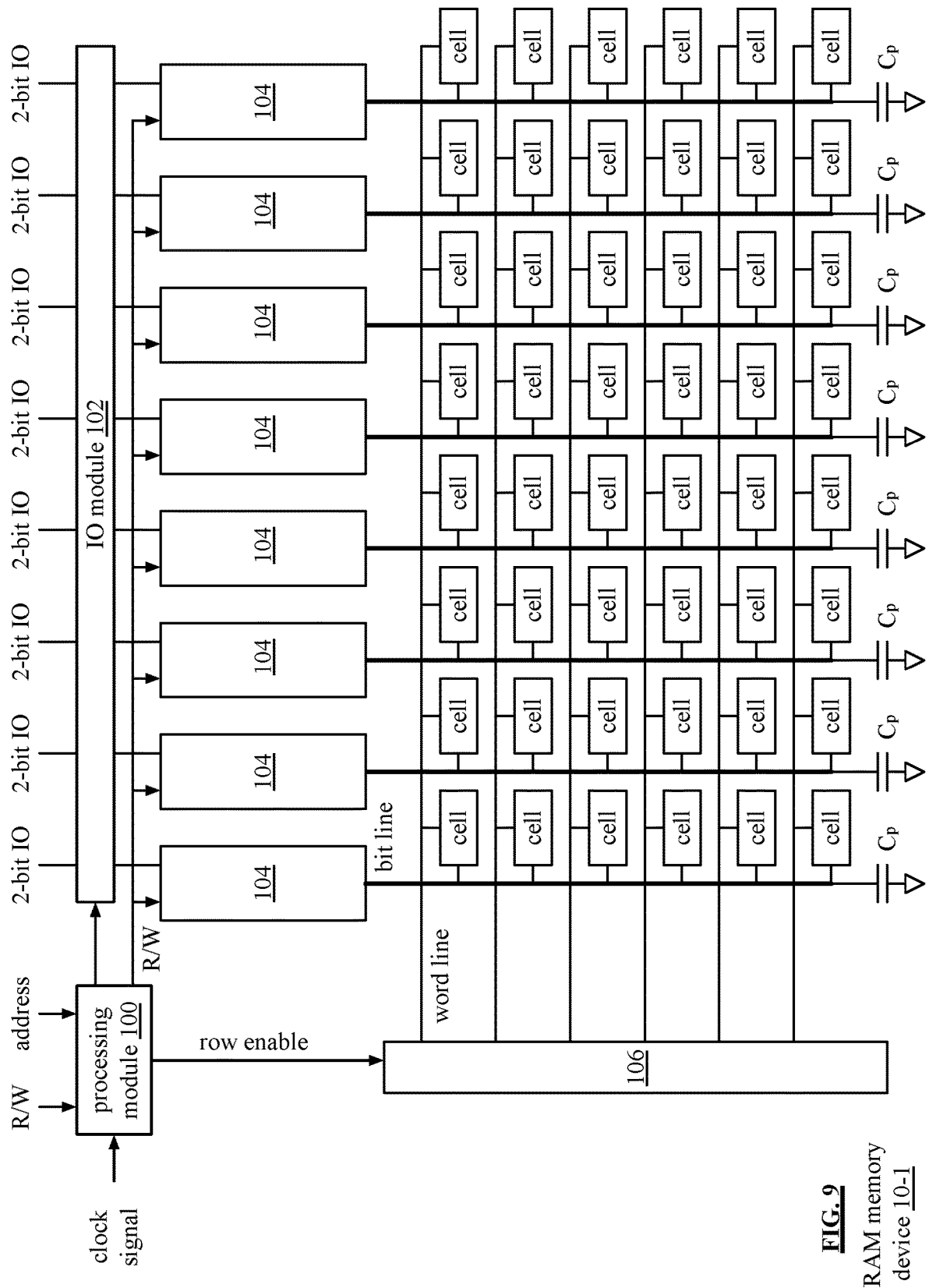
FIG. 9 is a schematic block diagram of another embodiment of a DRAM memory device in accordance with the present invention.

FIG. 9 is a schematic block diagram of another embodiment of a DRAM memory device 10-1 that includes a processing module 100, an input/output (IO) module 102, a plurality of 2-bit cell processing circuits 104, a row select module 106, and a plurality of DRAM cells ("cell"). The cells are arranged into rows and columns and each cell stores a voltage that is representative of 2-bits of data. A column of cells is coupled to a bit line, which is coupled to a cell processing circuit 104. Each bit line has a parasitic capacitance $C_p$. A row of cells is coupled to a word line, which is coupled to the row select module 106.

The number of cells in a row and the number of columns is dependent on the desired cell density of the DRAM memory device. As an example, a 1 Gb cell density (e.g., stores 1 Giga-bit of data) DRAM memory device includes 8 columns and 64 million rows. In this example, the IO module 102 includes an 8-bit bus; one for each column and inputs/outputs 2-bits of data per IO clocking cycle. In another example, a 1 Gb cell density DRAM memory device includes 16 columns and 32 million rows. In this example, the IO module 102 includes a 16-bit bus; one for each column.

The processing module 100, the IO module 102, and the row select module 106 operate similarly to the processing module 12, the IO module 14, and the row select module 18 with a difference being that the DRAM memory device 10-1 stores 2-bits of data per cell. As such, the inputting and outputting of data is for 2-bits per cell.

Figure 10:
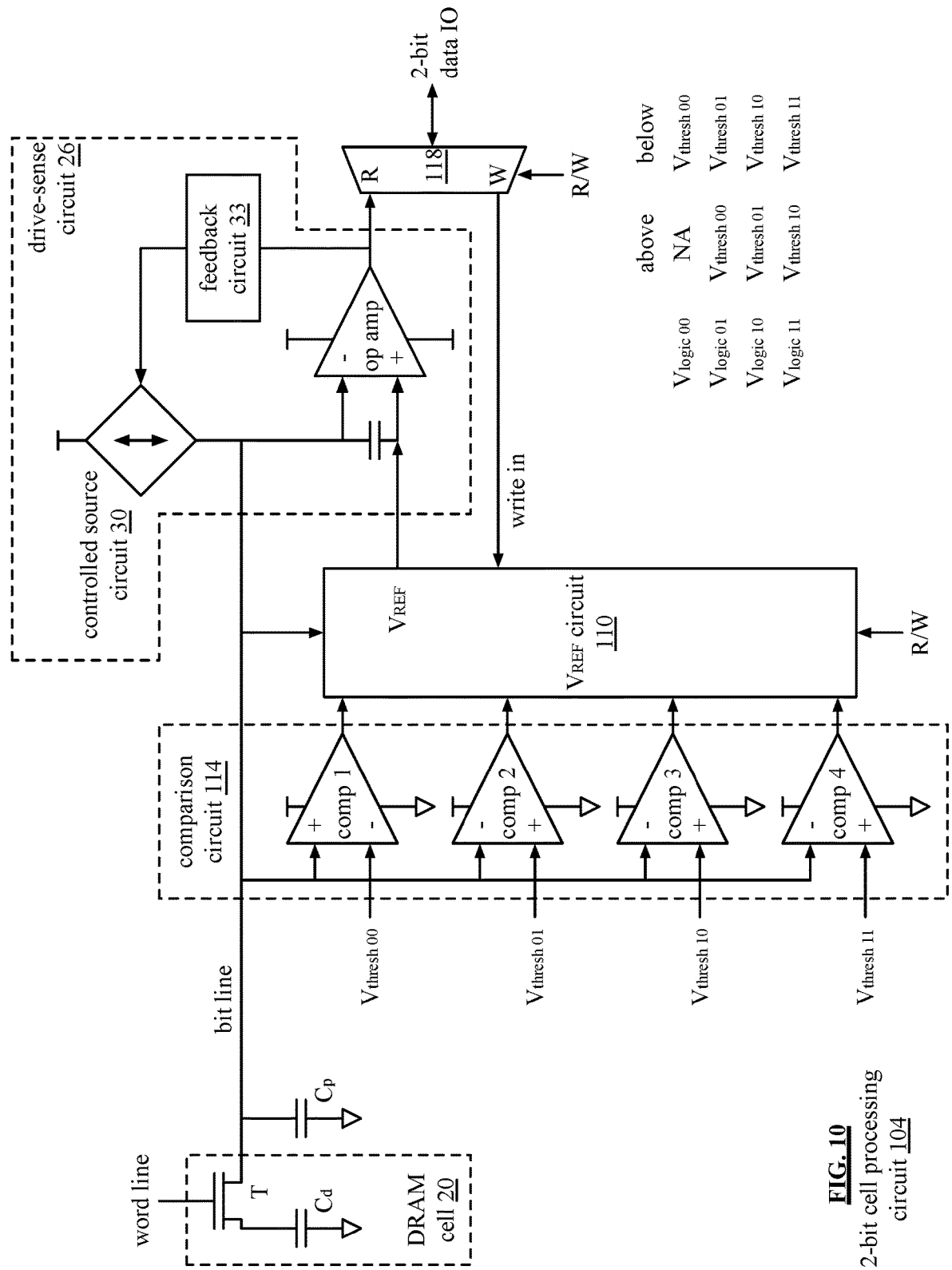
FIG. 10 is a schematic block diagram of another embodiment of a cell processing circuit in accordance with the present invention.

FIG. 10 is a schematic block diagram of another embodiment of a cell processing circuit 104 that is coupled to a DRAM cell 20. The cell processing circuit 104 includes a comparison circuit 114, a voltage reference circuit 110, a drive-sense circuit 26, and a read-write selection module 118. The drive-sense circuit 26 includes an operational amplifier (op amp), a feedback circuit 33, and a controlled source circuit 30. The DRAM cell 20 includes a capacitor Ca and a transistor T, where the capacitor stores one of four voltages to represent a binary number of 00, 01, 10, or 11.

In a read mode, the comparison circuit 114 determines a voltage difference indication between a previous voltage on the bit line and a current voltage on the bit line. The comparison circuit 114 provides the voltage difference indication to the voltage reference circuit 110.

In an example, the comparison circuit 114 includes four comparators (comp 1-comp 4). The first comparator compares the voltage on the bit line with a logic 00 voltage threshold; the second comparator compares the voltage on the bit line with a logic 01 voltage threshold; the third comparator compares the voltage on the bit line with a logic 10 voltage threshold; and the fourth comparator compares the voltage on the bit line with a logic 11 voltage threshold. The previous voltage corresponds to a logic 11 voltage, a logic 10 voltage, a logic 01 voltage, or a logic 00 voltage stored in a previously active DRAM cell. The current voltage corresponds to a logic 11 voltage, a logic 10 voltage, a logic 01 voltage, or a logic 00 voltage being stored in a currently active DRAM cell.

Continuing with the read mode example, the voltage reference circuit 110 generates a read voltage reference ($V_{REF}$) based on the voltage difference indication. For a 2-bit value stored in the previously active DRAM cell and a 2-bit value stored the currently active DRAM cell, there are sixteen previous to current transitions. While there are sixteen transitions, there are only four possible values for the read voltage reference (e.g., a logic 00 voltage, a logic 01 voltage, a logic 10 voltage, and a logic 11 voltage). Basically, the read voltage reference will correspond to the logic voltage of 2-bit value stored by the currently active DRAM cell. How the voltage reference circuit 110 determines what the currently active DRAM cell is storing will be described in one or more the subsequent Figures.

In the read mode, the drive-sense circuit 26 generates a read output voltage based on the read voltage reference. It then supplies the read output voltage on to the bit line for concurrent read and refresh of the voltage stored by the DRAM cell. The drive-sense circuit 26 also outputs a representation of the read output voltage via the output of the op-amp, which may be inverting or non-inverting. The read-write selection circuit 118, which is a multiplexer in an embodiment, outputs the representation of the read output voltage as a 2-bit value or a voltage representation thereof.

In a write mode, the read-write selection circuit 118 provides the write input (e.g., a 2-bit digital input or a voltage representation thereof) to the voltage reference circuit 110. The voltage reference circuit 110 generates a write voltage reference based on the write input (e.g., a logic 00 voltage when the write input is a logic 00, a logic 01 voltage when the write input is a logic 01, a logic 10 voltage when the write input is a logic 10, or a logic 11 voltage when the write input is a logic 11).

The drive-sense circuit 26 generates a write input voltage based on the write voltage reference (e.g., a logic 00 voltage for a corresponding write voltage reference, a logic 01 voltage, a logic 10 voltage for a corresponding write voltage reference, or a logic 11 voltage for a corresponding write voltage reference). The drive-sense circuit 26 also supplies the write input voltage on to the bit line to write the desired voltage into the DRAM cell to represent the 2-bit write input.

FIGS. 11A-12B are timing diagram examples of a cell processing circuit of the DRAM memory device of FIG. 10. The diagrams compare the voltage of a bit line as it transitions from a previous word line being active to a current word line being active. For these figures, the voltages stored by the previously active DRAM cell and stored by the currently active DRAM cell will be between $V_{ss}$ and $V_{dd}$, where $V_{rr}$ is the rail-to-rail voltage between $V_{dd}$ and $V_{ss}$. The voltage on the bit line is compared to threshold voltages to determine a voltage for the current DRAM cell. For example, a logic 00 voltage ($V_{logic\ 00}$) is $1/16^{th}$ of $V_{rr}$; a logic 01 voltage ($V_{logic\ 01}$) is $5/16^{th}$ of $V_{rr}$; a logic 10 voltage ($V_{logic\ 10}$) is $9/16^{th}$ of $V_{rr}$; and a logic 11 voltage ($V_{logic\ 11}$) is $13/16^{th}$ of $V_{rr}$. Example threshold voltages include a logic 00 threshold ($V_{thresh\ 00}$) that is $1/8^{th}$ of $V_{rr}$; a logic 01 threshold ($V_{thresh\ 01}$) that is $3/8^{th}$ of $V_{rr}$; a logic 10 threshold ($V_{thresh\ 10}$) that is $5/8^{th}$ of $V_{rr}$; and a logic 11 threshold ($V_{thresh\ 11}$) that is $7/8^{th}$ of $V_{rr}$.

The cell processing circuit 104 functions to determine the voltage on the bit line from a previously active DRAM cell and determines a voltage rate of change during the transition period (e.g., a short period of time after the current DRAM cell becomes active). From the voltage on the bit line from the previously active DRAM cell and the rate of change, the cell processing circuit 104 determines the voltage stored by the currently active DRAM cell and concurrently refresh it to that voltage level.

Figure 11A:
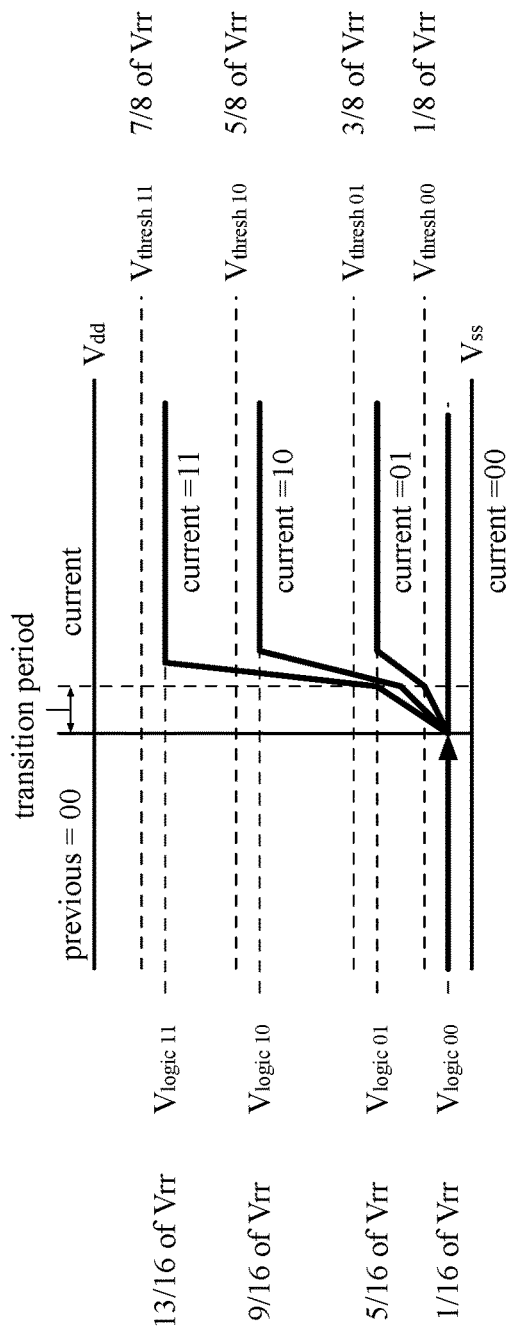
FIGS. 11A-12B are timing diagram examples of a cell processing circuit of the DRAM memory device of FIG. 10 in accordance with the present invention.

FIG. 11A illustrates the transition from the previously active DRAM cell storing a logic 00 voltage to a voltage level for the currently active DRAM cell. If the currently active DRAM cell on the bit line is also storing a logic 00 voltage, the voltage on the bit line does not change. It stays at the logic 00 voltage. Since there is not rate of change, the cell processing circuit determines that the voltage stored by the currently active DRAM cell is essentially the same as the voltage on the bit line from the previously active DRAM cell, which is a logic 00 voltage.

If the currently active DRAM cell on the bit line is storing a logic 01 voltage, the voltage on the bit line increases at a first positive rate of change during the transition time. Since rate of change changed at the first positive rate, the cell processing circuit determines that the voltage stored by the currently active DRAM cell is one step up from the voltage stored by the previously active DRAM cell, which, in this instance, is a logic 01 voltage.

If the currently active DRAM cell on the bit line is storing a logic 10 voltage, the voltage on the bit line increases at a second positive rate of change during the transition time. Since rate of change changed at the second positive rate, the cell processing circuit determines that the voltage stored by the currently active DRAM cell is two steps up from the voltage stored by the previously active DRAM cell, which, in this instance, is a logic 10 voltage.

If the currently active DRAM cell on the bit line is also storing a logic 11 voltage, the voltage on the bit line increases at a third positive rate of change during the transition time. Since rate of change changed at the third positive rate, the cell processing circuit determines that the voltage stored by the currently active DRAM cell is three steps up from the voltage stored by the previously active DRAM cell, which, in this instance, is a logic 11 voltage.

Figure 11B:
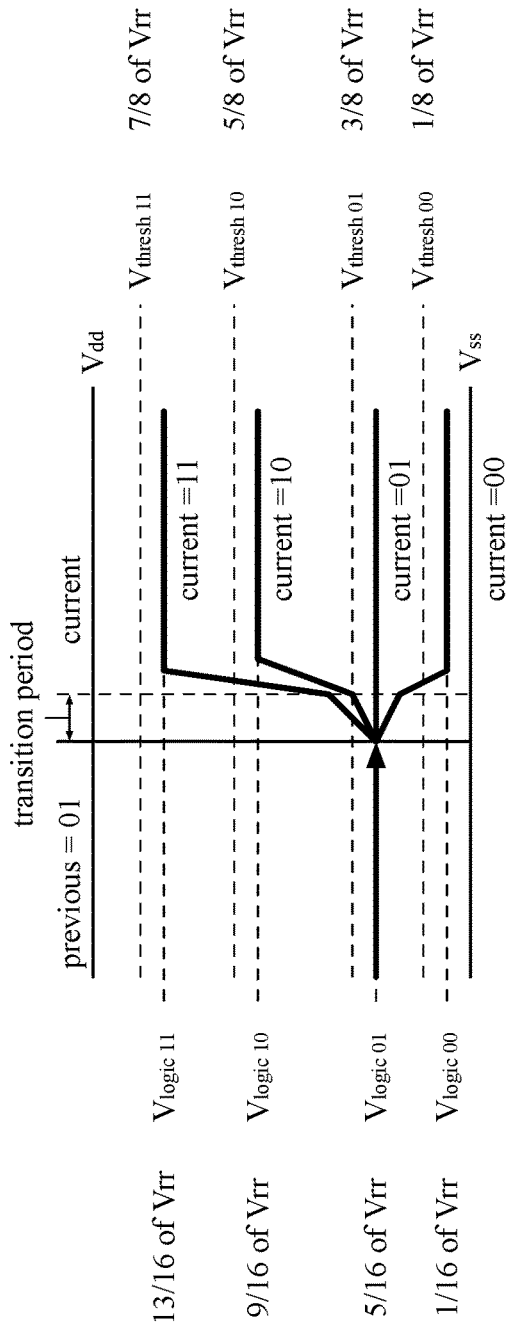

FIG. 11B illustrates the transition from the previously active DRAM cell storing a logic 01 voltage to a voltage level for the currently active DRAM cell. If the currently active DRAM cell on the bit line is storing a logic 00 voltage, the voltage on the bit line decreases at a first negative rate of change. Since rate of change changed at the first negative rate, the cell processing circuit determines that the voltage stored by the currently active DRAM cell is one step down from the voltage stored by the previously active DRAM cell (e.g., a logic 01 voltage), which, in this instance, is a logic 00 voltage.

If the currently active DRAM cell on the bit line is storing a logic 01 voltage, the voltage on the bit line does not change during the transition time. Since rate of change did not change, the cell processing circuit determines that the voltage stored by the currently active DRAM cell is at the same level as the voltage stored by the previously active DRAM cell, which, in this instance, is a logic 01 voltage.

If the currently active DRAM cell on the bit line is storing a logic 10 voltage, the voltage on the bit line increases at the positive rate of change during the transition time. Since rate of change changed at the firth positive rate, the cell processing circuit determines that the voltage stored by the currently active DRAM cell is one step up from the voltage stored by the previously active DRAM cell, which, in this instance, is a logic 10 voltage.

If the currently active DRAM cell on the bit line is also storing a logic 11 voltage, the voltage on the bit line increases at the second positive rate of change during the transition time. Since rate of change changed at the second positive rate, the cell processing circuit determines that the voltage stored by the currently active DRAM cell is two steps up from the voltage stored by the previously active DRAM cell, which, in this instance, is a logic 11 voltage.

Figure 12A:
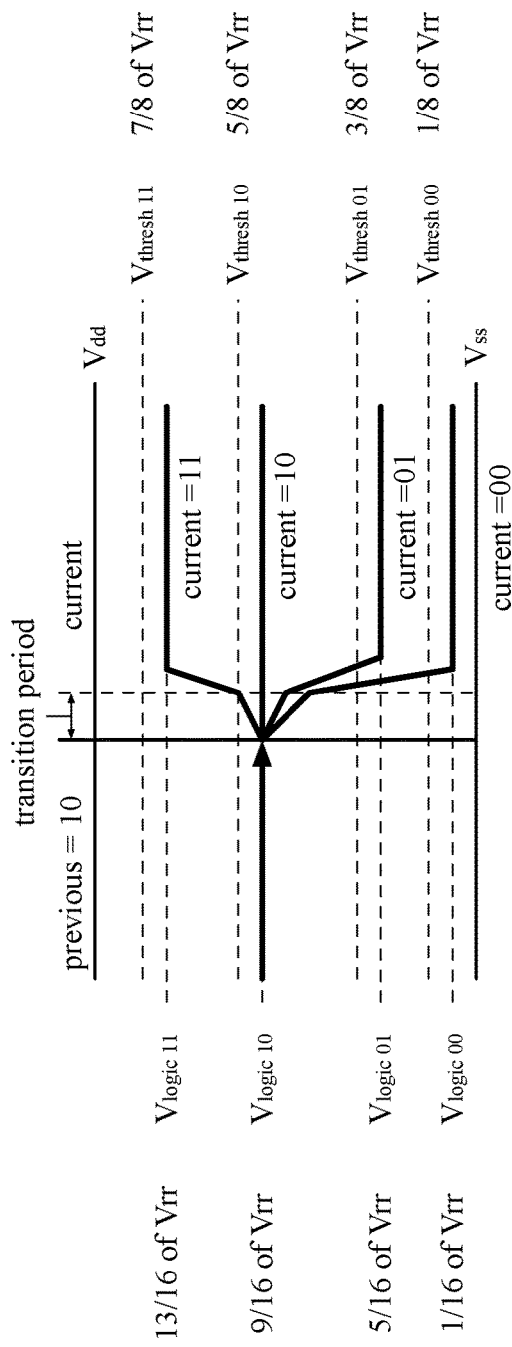

FIG. 12A illustrates the transition from the previously active DRAM cell storing a logic 10 voltage to a voltage level for the currently active DRAM cell. If the currently active DRAM cell on the bit line is storing a logic 00 voltage, the voltage on the bit line decreases at a second negative rate of change. Since rate of change changed at the second negative rate, the cell processing circuit determines that the voltage stored by the currently active DRAM cell is two steps down from the voltage stored by the previously active DRAM cell (e.g., a logic 10 voltage), which, in this instance, is a logic 00 voltage.

If the currently active DRAM cell on the bit line is storing a logic 01 voltage, the voltage on the bit line decreases at the first negative rate of change. Since rate of change changed at the first negative rate, the cell processing circuit determines that the voltage stored by the currently active DRAM cell is one step down from the voltage stored by the previously active DRAM cell, which, in this instance, is a logic 01 voltage.

If the currently active DRAM cell on the bit line is storing a logic 10 voltage, the voltage on the bit line does not change during the transition time. Since rate of change did not change, the cell processing circuit determines that the voltage stored by the currently active DRAM cell is at the same level as the voltage stored by the previously active DRAM cell, which, in this instance, is a logic 10 voltage.

If the currently active DRAM cell on the bit line is also storing a logic 11 voltage, the voltage on the bit line increases at the first positive rate of change during the transition time. Since rate of change changed at the first positive rate, the cell processing circuit determines that the voltage stored by the currently active DRAM cell is one step up from the voltage stored by the previously active DRAM cell, which, in this instance, is a logic 11 voltage.

Figure 12B:
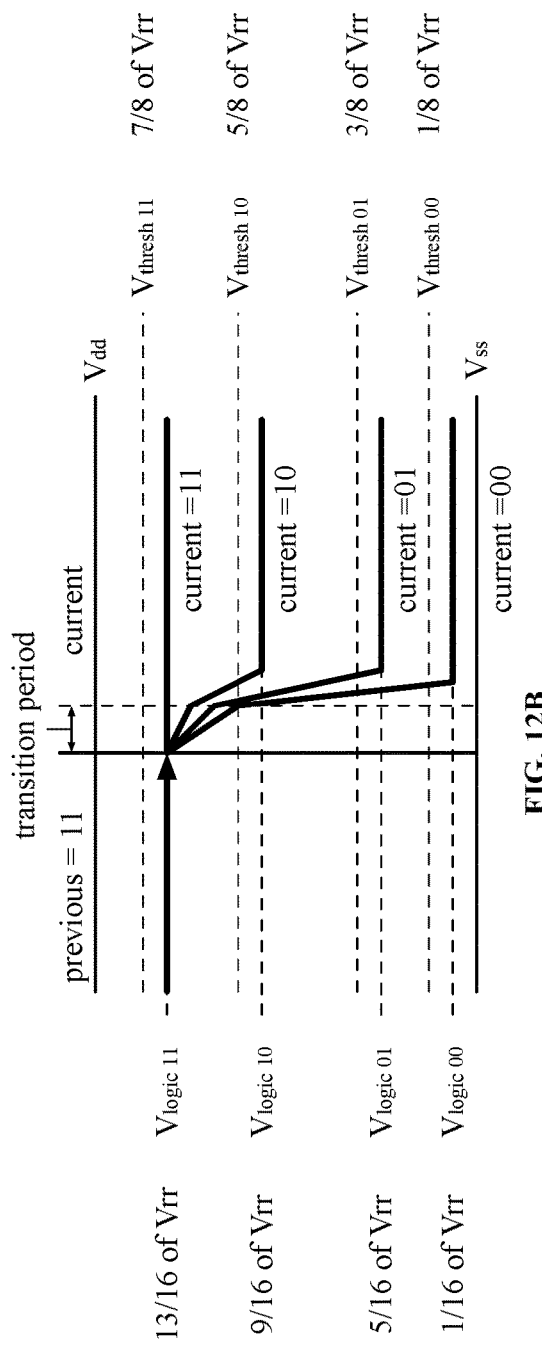

FIG. 12B illustrates the transition from the previously active DRAM cell storing a logic 11 voltage to a voltage level for the currently active DRAM cell. If the currently active DRAM cell on the bit line is storing a logic 00 voltage, the voltage on the bit line decreases at a third negative rate of change. Since rate of change changed at the third negative rate, the cell processing circuit determines that the voltage stored by the currently active DRAM cell is three steps down from the voltage stored by the previously active DRAM cell (e.g., a logic 11 voltage), which, in this instance, is a logic 00 voltage.

If the currently active DRAM cell on the bit line is storing a logic 01 voltage, the voltage on the bit line decreases at the second negative rate of change. Since rate of change changed at the second negative rate, the cell processing circuit determines that the voltage stored by the currently active DRAM cell is two steps down from the voltage stored by the previously active DRAM cell, which, in this instance, is a logic 01 voltage.

If the currently active DRAM cell on the bit line is storing a logic 10 voltage, the voltage on the bit line decreases at the first negative rate of change. Since rate of change changed at the first negative rate, the cell processing circuit determines that the voltage stored by the currently active DRAM cell is one step down from the voltage stored by the previously active DRAM cell, which, in this instance, is a logic 10 voltage.

If the currently active DRAM cell on the bit line is storing a logic 11 voltage, the voltage on the bit line does not change during the transition time. Since rate of change did not change, the cell processing circuit determines that the voltage stored by the currently active DRAM cell is at the same level as the voltage stored by the previously active DRAM cell, which, in this instance, is a logic 11 voltage.

Figure 13:
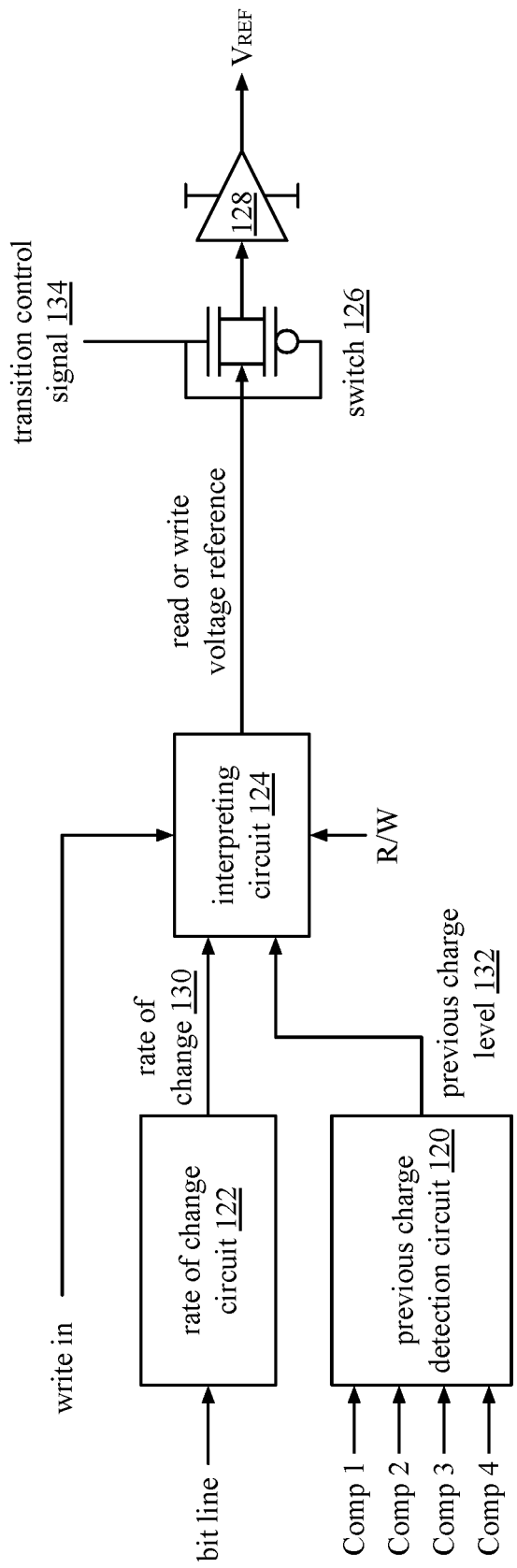
FIG. 13 is a schematic block diagram of an embodiment of a voltage reference circuit of a cell processing circuit of FIG. 10 in accordance with the present invention.

FIG. 13 is a schematic block diagram of an embodiment of a voltage reference circuit 110 of a cell processing circuit of FIG. 10. The voltage reference circuit 110 includes a rate of change circuit 122, a previous charge detection circuit 120, an interpreting circuit 124, a switch 126, and an output driver 128 (if needed). The rate of change circuit 122 is coupled to the bit line. The previous charge detection circuit 120 receives the output of the four comparators.

When in the read mode, the rate of change circuit 130 provides a rate of change indication 130 to the interpreting circuit in accordance with the examples of FIGS. 11A-12B. In addition, the previous charge circuit 120 provides a previous charge level indication 132 to the interpreting circuit 124. An embodiment of the rate of change circuit 122 is provided in FIG. 15 and an embodiment of the previous charge detection circuit 120 is provided in FIG. 14.

In the read mode, the interpreting circuit 124 provides a read voltage reference based on the rate of change indication 130 and the previous charge level indication 132. In the write mode, the interpreting circuit 124 generates a write voltage reference based on a received write input. An embodiment of the interpreting circuit 124 is provided in FIG. 16.

In the read mode, the switch is open during the transition period in accordance with the transition control signal 134 to provide time for a stable voltage reference to be created and provided to the drive-sense circuit 26. The switch 126 is closed in accordance with the transition control signal 134 outside of the transition period. In the write mode, the switch 126 is closed.

Figure 14:
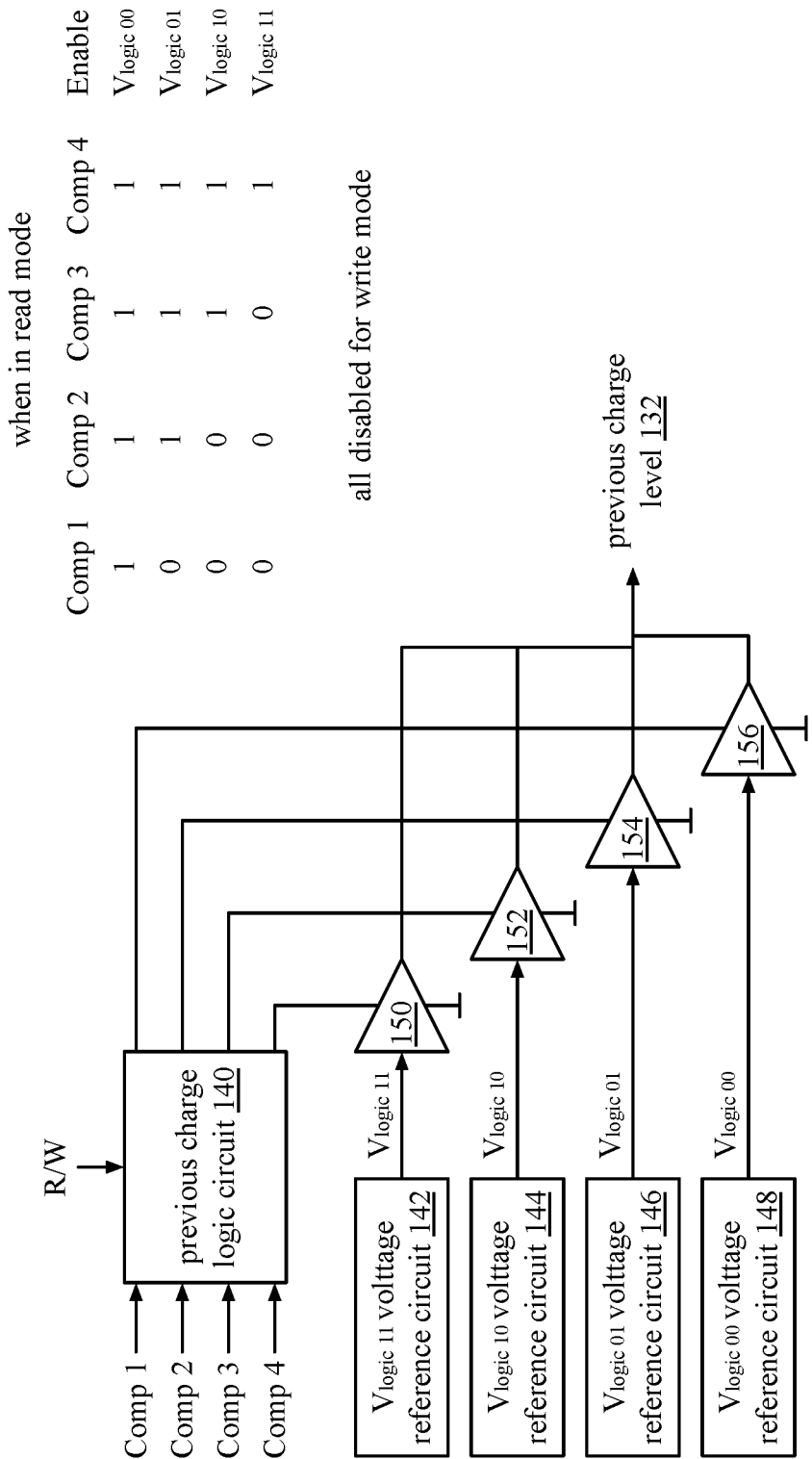
FIG. 14 is a schematic block diagram of an embodiment of a previous charge detection circuit of a cell processing circuit of FIG. 10 in accordance with the present invention.

FIG. 14 is a schematic block diagram of an embodiment of a previous charge detection circuit 120 of a cell processing circuit of FIG. 11. The previous charge detection circuit 120 includes a previous charge logic circuit 140, a logic 11 voltage reference 142, a logic 10 voltage reference 144, a logic 01 voltage reference 146, a logic 11 voltage reference 148, and a plurality of gated drivers 150-156. The previous charge detection circuit 120 is disabled during a write mode.

The previous charge logic circuit 140, in the read mode, receives the outputs of the comparators as its inputs. Based on the comparator output states, the previous charge logic circuit 140 enables one of the gated drivers. For example, when the comparator outputs are all logic 1, the previous charge logic circuit 140 enables gated driver 156 such that the logic 00 voltage is outputted as the read voltage reference. As another example, when comparator 2-4 outputs are logic 1 and comparator 1 output is logic 0, the previous charge logic circuit 140 enables gated driver 154 such that the logic 01 voltage is outputted as the read voltage reference. As yet another example, when comparator 3-4 outputs are logic 1 and comparator 1-2 outputs are logic 0, the previous charge logic circuit 140 enables gated driver 152 such that the logic 10 voltage is outputted as the read voltage reference. As a further example, when comparator 4 output is logic 1 and comparator 1-3 outputs are logic 0, the previous charge logic circuit 140 enables gated driver 150 such that the logic 11 voltage is outputted as the read voltage reference.

Figure 15:
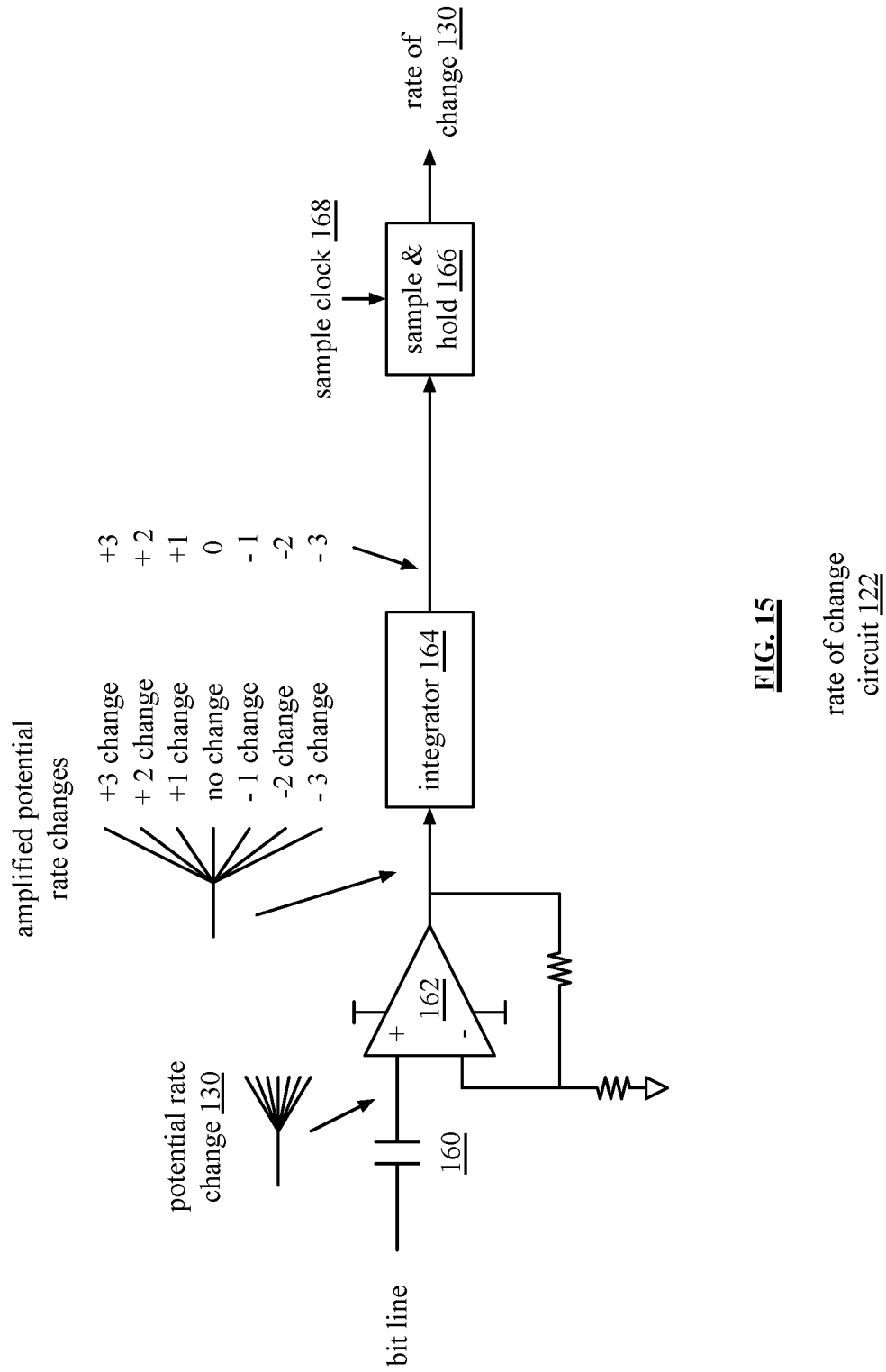
FIG. 15 is a schematic block diagram of an embodiment of a rate of change circuit of a cell processing circuit of FIG. 10 in accordance with the present invention.

FIG. 15 is a schematic block diagram of an embodiment of a rate of change circuit 122 of a cell processing circuit of FIG. 10. The rate of change circuit 122 includes an AC coupling capacitor 160, a non-inverting amplifier 162, an integrator 164, and a sample & hold circuit 166. The AC coupling capacitor 160 is coupled to the bit line.

The AC coupling capacitor 160 provides the AC component of the voltage on the bit line (i.e., the rate of change), which occurs during the transition from the previous state to the current state (i.e., from the previously active DRAM cell on the bit line to the currently active DRAM cell). With four different levels of voltages that could be stored in previously active DRAM cell and the currently active DRAM cell, the rate of change 130 will be one of seven. For example, the rate of change will be 0 for a logic 00 voltage to a logic 00 voltage transition. The rate of change is a first positive change for a logic 00 voltage to a logic 01 voltage transition, a logic 01 voltage to a logic 10 voltage transition, and for a logic 10 voltage to a logic 11 voltage transition.

The rate of change is a second positive change for a logic 00 voltage to a logic 10 voltage transition and for a logic 01 voltage to a logic 11 voltage transition. The rate of change is a third positive change for a logic 00 voltage to a logic 11 voltage transition. The rate of change is a first negative change for a logic 11 voltage to a logic 10 voltage transition, a logic 10 voltage to a logic 01 voltage transition, and for a logic 01 voltage to a logic 00 voltage transition. The rate of change is a second negative change for a logic 11 voltage to a logic 01 voltage transition and for a logic 10 voltage to a logic 00 voltage transition. The rate of change is a third negative change for a logic 11 voltage to a logic 00 voltage transition.

The non-inverting amplifier 162 amplifies the rate of change 130 to a larger voltage, making it easier to distinguish between the different rates of change. The integrator 164 integrates the rate of change to produce a rate of change value (e.g., +3, +2, +1, 0, −1, −2, or −3). The sample & hold circuit 166 is triggered by a sample clock 168 to store, for a current read interval, the rate of change value. In an embodiment, the rate of change value is an analog voltage. In another embodiment, the output of the integrator 164 is fed through an analog to digital converter to produce a digital rate of change value, which is temporarily stored by the sample & hold circuit 166.

In an alternative embodiment, the integrator 164 is replace with a comparison circuit that compares the amplified potential rate changes to a series of reference voltages. The resulting output is still one of +3, +2, +1, 0, −1, −2 and −3, which is sampled and held by the sample and hold circuit 166.

Figure 16:
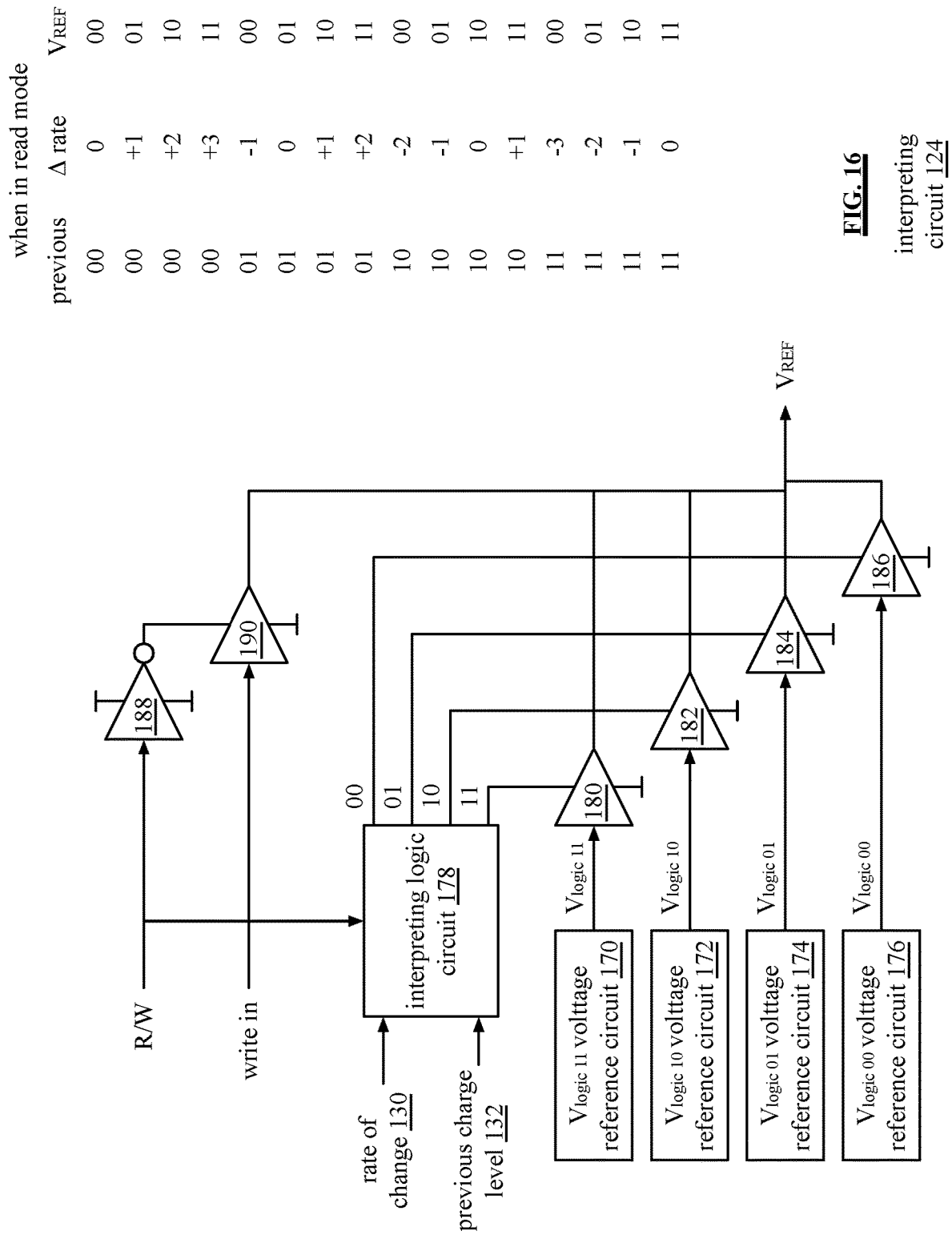
FIG. 16 is a schematic block diagram of an embodiment of an interpreting circuit of a cell processing circuit of FIG. 10 in accordance with the present invention.

FIG. 16 is a schematic block diagram of an embodiment of an interpreting circuit 124 of a cell processing circuit of FIG. 11. The interpreting circuit 124 includes an interpreting logic circuit 178, four voltage reference circuits 170-176, an inverter 188, and a plurality of gated drivers 180-186, and 190. In an embodiment, the four voltage reference circuits 170-176 may be the same four voltage reference circuits 142-148 of FIG. 14. In another embodiment, the four voltage reference circuits 170-176 are common for the cell processing circuits 104 of FIG. 10. In yet another embodiment, the four voltage reference circuits 170-176 are the same as four voltage reference circuits 142-148 are common for the cell processing circuits 104 of FIG. 10.

In the write mode, the interpreting logic circuit 178 outputs a low voltage such that gated drivers 180-186 are disabled. With the write mode enabled, the R/W signal is "0" such that the output of the inverter 188 is high, which enables the write gated driver 190. Thus, the write input voltage is supplied as the write voltage reference.

In the read mode, the R/W signal is "1", which enables the interpreting logic circuit 178 to process the rate of change 130 and previous charge level 132 inputs to enable one of the four gated drivers 180-186. The table indicates when the interpreting logic circuit 178 produces a drive voltage to the respective gated drivers 180-186. For example, when the previous charge level 132 (previous) is a 00 and the rate of change 130 (A rate) is 0, the interpreting logic circuit 178 enables the gated driver 186 such that logic 00 voltage is outputted as the read voltage reference.

Figure 17:
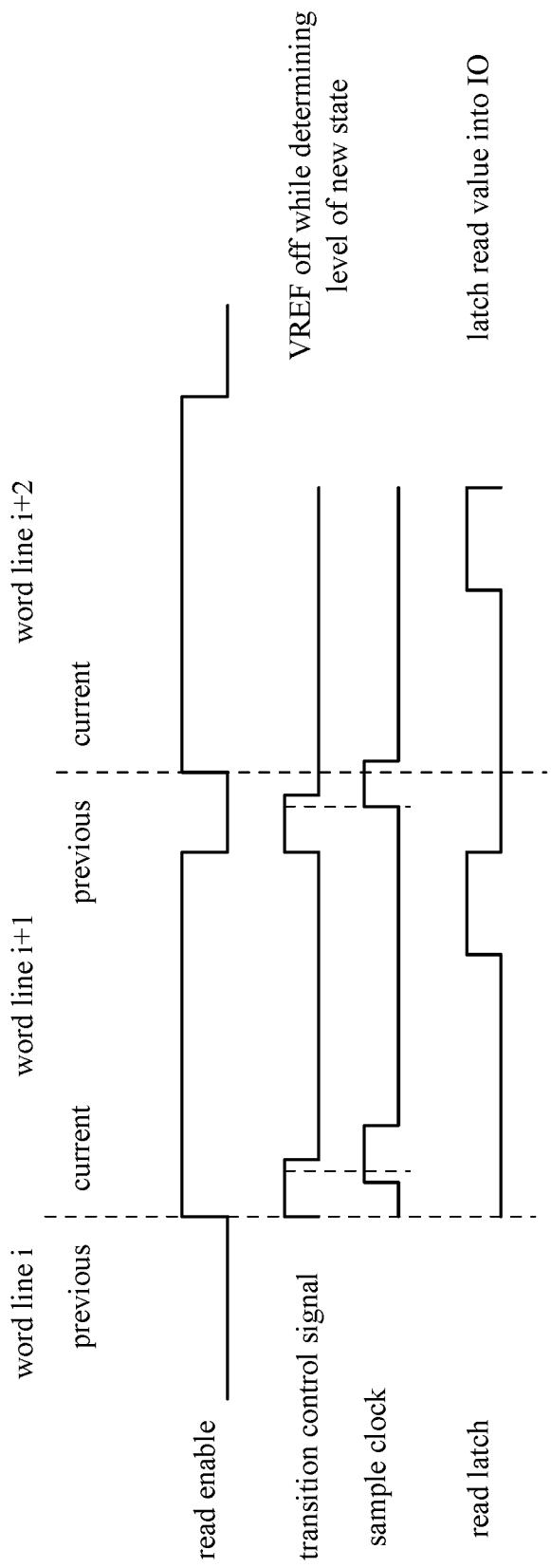
FIG. 17 is a timing diagram of another example of a cell processing circuit of FIG. 11 in accordance with the present invention.

FIG. 17 is a timing diagram of another example of a cell processing circuit of FIG. 10 that includes a read enable signal (e.g., for 3 word lines), a transition control signal, a sample clock signal, and a read latch signal. As shown, when the word lines switch from a previous one to a current one, the transition control signal goes high for a short period of time. This allows for the reference voltage for the current word line to be established without affecting the voltage stored by the currently active DRAM cell.

The sample clock for the sample & hold circuit is triggered high shortly after the transition control signal goes high, but before it goes low, to hold the newly established read voltage reference. At some later point in the read interval, the voltage on the bit line is latched into the IO module in accordance with the read latch signal. Note that the duration of the signals is dependent on the speed of the memory device and the time constant for changing the voltage on a bit based on the voltage stored by the capacitor of a DRAM cell.

Figure 18:
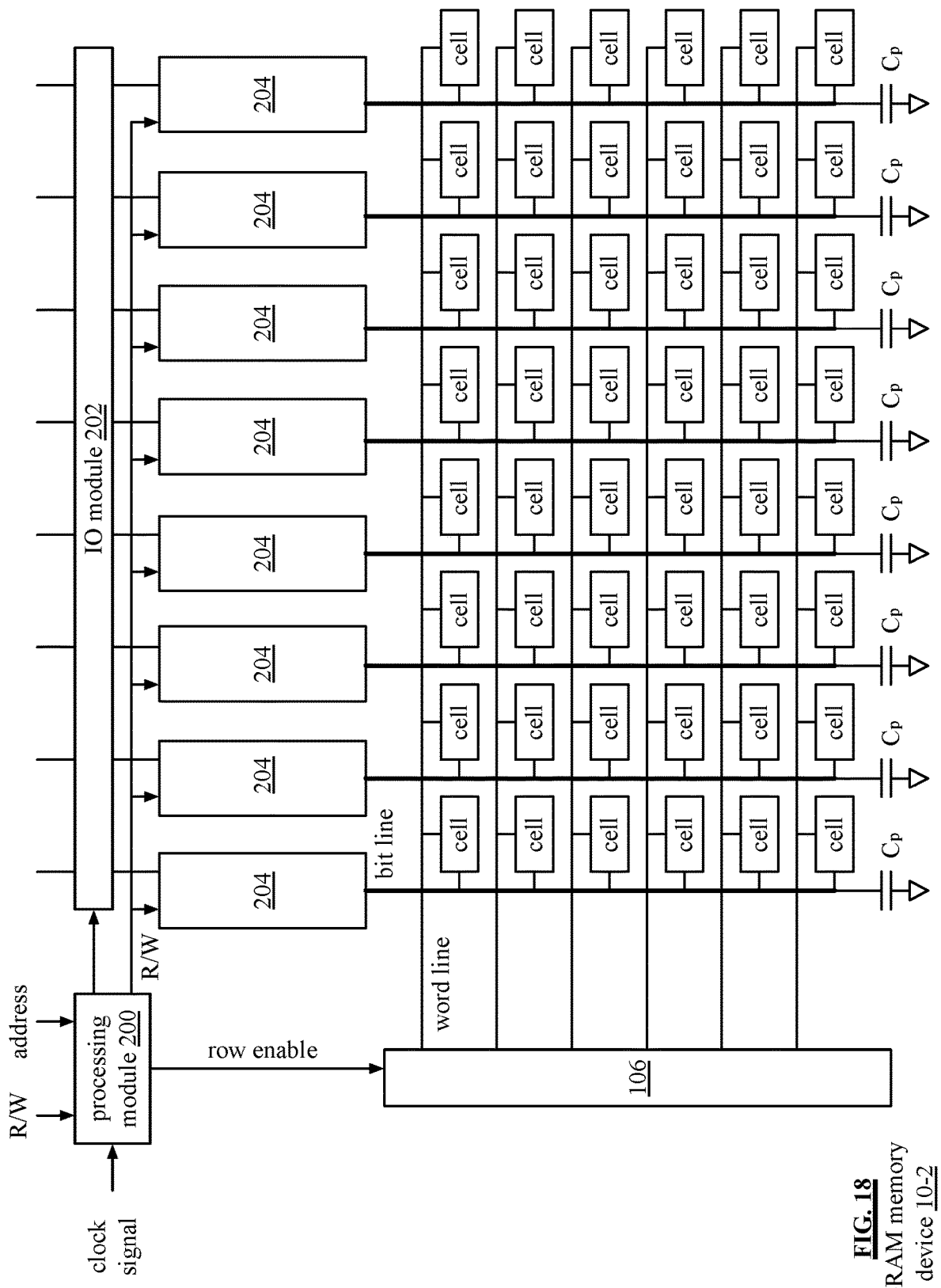
FIG. 18 is a schematic block diagram of another embodiment of a DRAM memory device in accordance with the present invention.

FIG. 18 is a schematic block diagram of another embodiment of a DRAM memory device 10-2 includes a processing module 200, an input/output (IO) module 202, a plurality of cell processing circuits 204, a row select module 106, and a plurality of DRAM cells ("cell"). The cells are arranged into rows and columns and each cell stores a voltage that is representative of 1-bits of data. A column of cells is coupled to a bit line, which is coupled to a cell processing circuit 204. Each bit line has a parasitic capacitance $C_p$. A row of cells is coupled to a word line, which is coupled to the row select module 106. The processing module 200, the IO module 202, and the row select module 106 operate similarly to the processing module 12, the IO module 14, and the row select module 18 of FIG. 1.

The number of cells in a row and the number of columns is dependent on the desired cell density of the DRAM memory device. As an example, a 1 Gb cell density (e.g., stores 1 Giga-bit of data) DRAM memory device includes 8 columns and 128 million rows. In this example, the IO module 202 includes an 8-bit bus; one for each column and inputs/outputs 1-bit of data per IO clocking cycle. In another example, a 1 Gb cell density DRAM memory device includes 16 columns and 64 million rows. In this example, the IO module 202 includes a 16-bit bus; one for each column.

Figure 19:
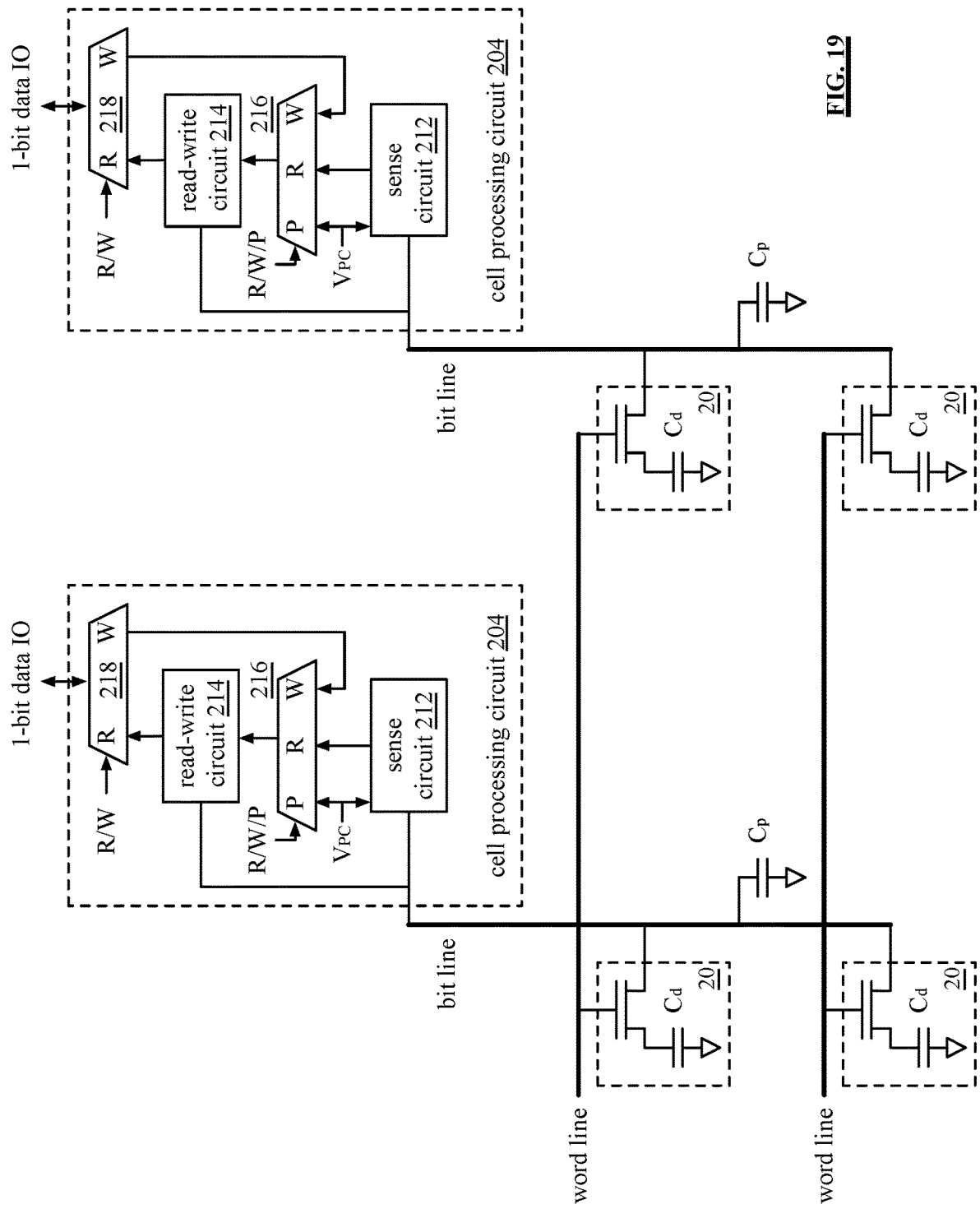
FIG. 19 is a schematic block diagram of an embodiment of a cell processing circuit of the DRAM memory device of FIG. 18 in accordance with the present invention.

FIG. 19 is a schematic block diagram of an embodiment of a cell processing circuit 204 of the DRAM memory device of FIG. 18 coupled to a bit line. Each bit line is coupled to a column of DRAM cells 20 and each word line is coupled to a row of DRAM cells 20. The cell processing circuit 204 includes a sense circuit 212, an input selection circuit 216 (e.g., a multiplexor), a read-write circuit 214, and a read-write selection circuit 218 (e.g., a multiplexor).

For a read operation, the bit line is pre-charged prior to reading the voltage stored in a currently active DRAM cell. While the voltage is being read from the currently active DRAM cell, the voltage is being refreshed. As such, there are two phases to a read operation: phase one is pre-charging the bit line and phase two is a concurrent read and refresh the voltage stored by the currently active DRAM cell.

In the pre-charge mode of the read operation, the input selection circuit 216 provides a pre-charge voltage ($V_{PC}$) to the read-write circuit 214. The read-write circuit 214 drives the bit line with the pre-charge voltage such that the parasitic capacitance $C_p$ of the bit line is pre-charged to a known voltage level (e.g., a voltage level between a logic 1 voltage and a logic 0 voltage). With the bit line pre-charged, the read mode of the read operation is enabled.

In the read mode, the transistor of the currently active DRAM cell is closed, coupling, in parallel, the DRAM cell capacitor $C_d$ with the parasitic capacitance $C_p$ of the bit line. If the DRAM cell capacitor is storing a logic 1 voltage, it dumps charge into the parasitic capacitance, causing the voltage on the bit line to increase. If, however, the DRAM cell capacitor is storing a logic 0 voltage, it takes charge from the parasitic capacitance, causing the voltage on the bit line to decrease.

The sense circuit 212 senses the voltage change on the bit line and creates a representative voltage thereof. For example, if the voltage change is an increase in voltage from the pre-charge level, the sense circuit 212 creates a logic 1 voltage. As another example, if the voltage change is a decrease in voltage from the pre-charge level, the sense circuit 212 creates a logic 0 voltage. The sense circuit 212 provides it output to the input selection circuit 216, which provides the sense circuit 212 output to the read-write circuit 214.

In the read mode, the read-write circuit 214 generates a read output voltage based on the output of the sense circuit 212, which is a representation of the voltage stored in a DRAM cell actively coupled to the bit line. The read-write circuit 214 supplies the read output voltage (e.g., a logic 1 voltage or a logic 0 voltage) on the bit line to refresh the voltage stored by the currently active DRAM cell.

In addition, the read-write circuit provides a representation of the read output voltage to the read-write selection circuit 218. The representation of the read output voltage may be in one of many forms. For example, the represen-
tation of the read output voltage is the read output voltage. As another example, the representation of the read output voltage is a digital output of an analog to digital converter that receives the read output voltage as its input. As yet another example, the representation of the read output voltage is a power amplified version of the read output voltage (e.g., increased voltage and/or increased version of the read output voltage).

For a write operation, the cell processing circuit 204 is in a write mode. In the write mode, the read-write selection circuit 218 receives a write input (e.g., a logic 1 voltage or a logic 0 voltage), which is provided to the input selection circuit 216. The input selection circuit 216 provides the write input to the read-write circuit 214. The read-write circuit 214 generates a write voltage based on the write input and supplies the write voltage on to the bit line to write the write input in the currently active DRAM cell.

Figure 20:
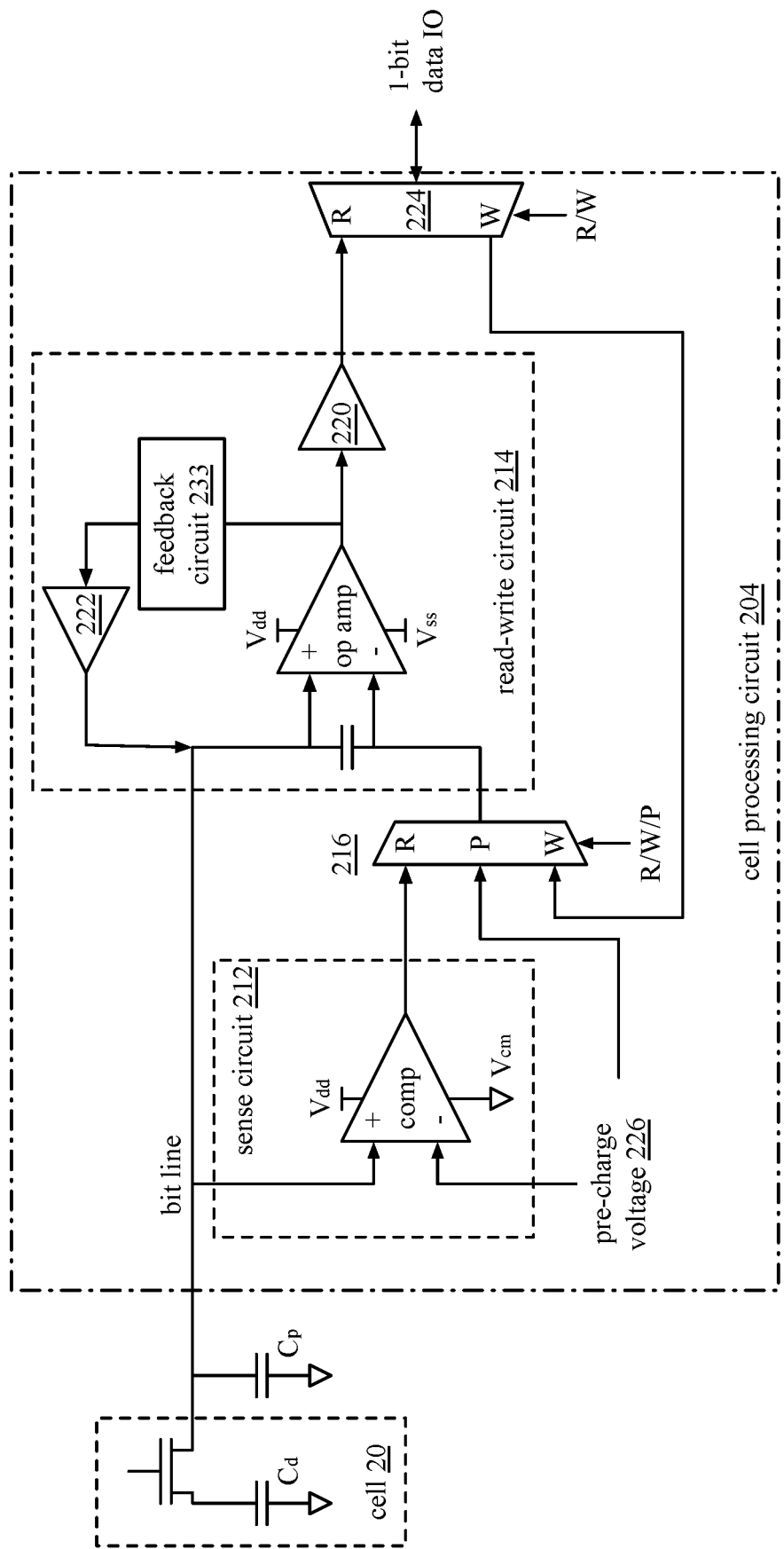
FIG. 20 is a schematic block diagram of another embodiment of a cell processing circuit of the DRAM memory device of FIG. 18 in accordance with the present invention.

FIG. 20 is a schematic block diagram of another embodiment of a cell processing circuit 204 of the DRAM memory device of FIG. 18. The cell processing circuit 204 includes a sense circuit 212, an input selection circuit 216 (e.g., a multiplexor), a read-write circuit 214, and a read-write selection circuit 218 (e.g., a multiplexor). The sense circuit 212 includes a comparator (comp) that compares the voltage on the bit line to a pre-charge voltage 226. The read-write circuit 214 includes an operational amplifier (op amp), a feedback circuit 233, a feedback driver 222, and an output driver 220.

In the pre-charge mode, the input selection circuit 216 provides the pre-charge voltage 226 to a first input of op amp (which may be an inverting or non-inverting op amp). The op amp adjusts its output such that, through the feedback circuit 233, a voltage on a second input of the op amp substantially matches the pre-charge voltage on the first input on the op amp. The second input of the op amp is also coupled to the bit line and drives the bit line to have a voltage that substantially equal the pre-charge voltage. If the output power of the op amp is sufficient to drive the bit line, then the feedback driver 222 may be omitted. The feedback circuit 233 may be implemented similarly to the feedback circuit 33 of FIG. 10.

In the write mode, the read-write selection circuit 224 provides a write input to the input selection circuit 216. The input selection circuit 216 provides the write input to the first input of the op amp of the read-write circuit 214. The op amp forces the same voltage to be on the bit line such that the currently active RDAM cell is written with the write input.

In the read mode, the comparator provides a voltage to the input selection circuit 216. The comparator produces a voltage approximately equal to Vdd when the voltage on the bit line is greater than the pre-charge voltage 226. This indicates that the DRAM cell 20 is storing a logic 1 voltage, which causes the voltage on the bit line to increase. Alternatively, the comparator produces a voltage approximately equal to Vcm when the voltage on the bit line is less than the pre-charge voltage 226. This indicates that the DRAM cell 20 is storing a logic 0 voltage, which causes the voltage on the bit line to decrease.

The input selection circuit 216 provides the voltage it receives from the comparator to the first input of the op amp of the read-write circuit 214. When the voltage is approximately Vcm, the op amp forces the voltage on the bit line to decrease to approximately Vcm, which, in this example, corresponds to a logic 0 voltage. In addition, the op amp outputs a voltage indicative of a logic 0 being stored by the currently active DRAM cell. The output driver 220 outputs a logic 0 voltage to the read-write selection circuit 224, which outputs the logic 0 voltage to the IO module 202.

When the voltage received by the first input of the op amp is approximately Vdd, the op amp forces the voltage on the bit line to increase to approximately Vdd, which, in this example, corresponds to a logic 1 voltage. In addition, the op amp outputs a voltage indicative of a logic 1 being stored by the currently active DRAM cell. The output driver 220 outputs a logic 1 voltage to the read-write selection circuit 224, which outputs the logic 1 voltage to the IO module 202. In this manner, the voltage stored by the currently active DRAM cell is concurrently read and refreshed.

Figure 21:
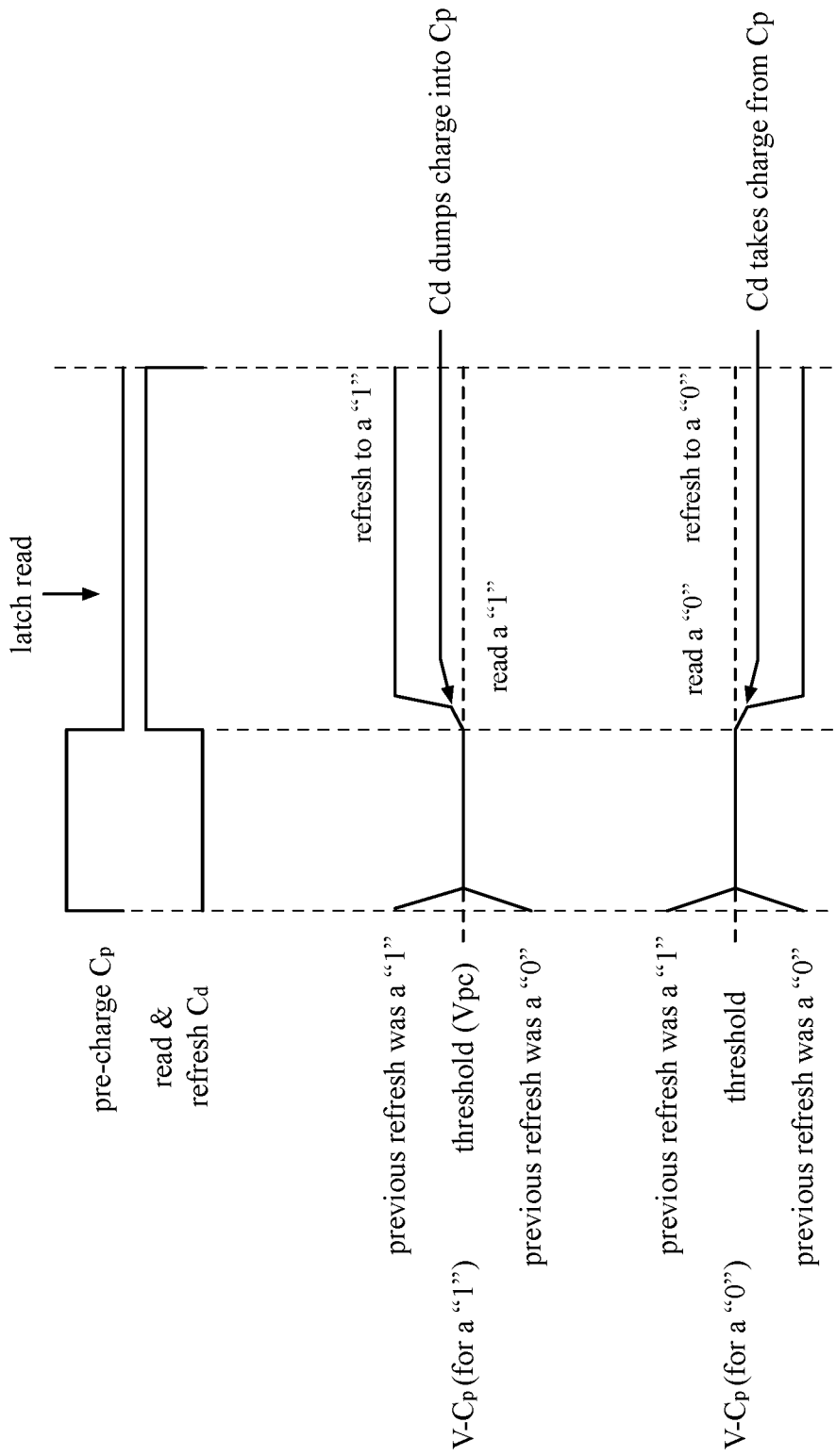
FIG. 21 is a timing diagram of an example of operation of a cell processing circuit of FIG. 19 in accordance with the present invention.

FIG. 21 is a timing diagram of an example of operation of a cell processing circuit 204 of FIG. 19. The timing diagram is for a pre-charge and read of a bit line for a currently active word line. As shown, a read interval (e.g., 1/read clock) includes a pre-charge portion and a read & refresh portion. During the pre-charge portion of the read interval, the voltage on the bit line is pre-charged to a pre-charge voltage. For example, a logic 1 voltage is approximately equal to Vdd, a logic 0 voltage is approximately equal to Vss, and the pre-charge voltage is approximately equal to Vcm (e.g., 0.5*(Vdd−Vss)).

When the currently active DRAM cell is storing a logic 1 voltage, it dumps a charge into the parasitic capacitance of the bit line, causing the voltage on the bit line to increase. The comparator, which has some hysteresis, compares a pre-charge threshold voltage (e.g., Vcm) to the increased voltage on the bit line to produce an output voltage approximately equal to Vdd. Once the read-write circuit 214 receives the Vdd input, it forces the voltage on the bit line to be substantially equal to Vdd.

When the currently active DRAM cell is storing a logic 0 voltage, it takes a charge from the parasitic capacitance of the bit line, causing the voltage on the bit line to decrease. The comparator, which has some hysteresis, compares a pre-charge threshold voltage (e.g., Vcm) to the decreased voltage on the bit line to produce an output voltage approximately equal to Vss. Once the read-write circuit 214 receives the Vss input, it forces the voltage on the bit line to be substantially equal to Vss. As such, the voltage of the currently active DRAM cell is concurrently read and refreshed.

Figure 22:
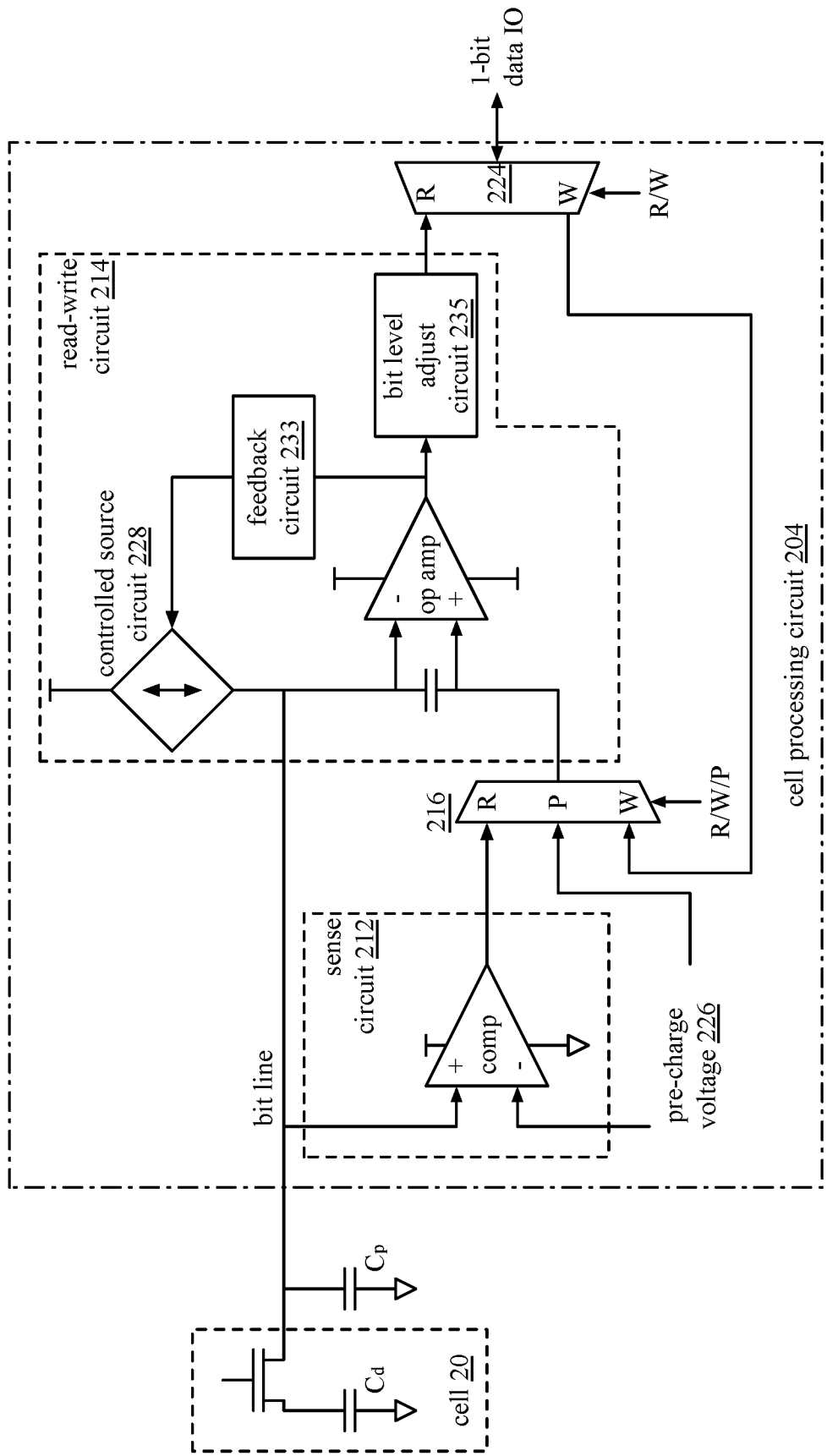
FIG. 22 is a schematic block diagram of another embodiment of a cell processing circuit of the DRAM memory device of FIG. 18 in accordance with the present invention.

FIG. 22 is a schematic block diagram of another embodiment of a cell processing circuit 204 of the DRAM memory device of FIG. 18. The cell processing circuit 204 includes a sense circuit 212, an input selection circuit 216 (e.g., a multiplexor), a read-write circuit 214, and a read-write selection circuit 218 (e.g., a multiplexor). The sense circuit 212, the input selection circuit 216, and the read-write selection circuit 218 operate in a similar manner as discussed with reference to FIGS. 20 and 21.

The read-write circuit 214 includes an operational amplifier (op amp), a feedback circuit 233, a controlled voltage circuit 228, and bit level adjust circuit 235. The op amp still functions to substantially match the voltage on its second input to the voltage its first input, which it receives from the input selection circuit 216. As such, in the pre-charge mode, the op amp, via the controlled source circuit 228 (e.g., a controlled current source, a controlled voltage source, etc.) and feedback circuit 233, drives the pre-charge voltage onto the bit line. In the write mode, the op amp, via the controlled source circuit 228 and the feedback circuit 233, drives the write input voltage onto the bit line.

In the read mode, the op amp, via the controlled source circuit 228 and the feedback circuit 233, drives the read voltage onto the bit line. In this embodiment, the output of the op amp is representative of the voltage on the bit line. For example, to drive the bit line to Vcm, the output of the op amp will be a voltage between Vcm and Vss. When the op amp output voltage in this state, it's interpreted by the bit level adjust circuit 235 to produce a logic 0 output voltage. As another example, to drive the bit line to Vdd, the output of the op amp will be a voltage approximating Vdd. When the op amp output voltage in this state, it's interpreted by the bit level adjust circuit 235 to produce a logic 1 output voltage.

Figure 23:
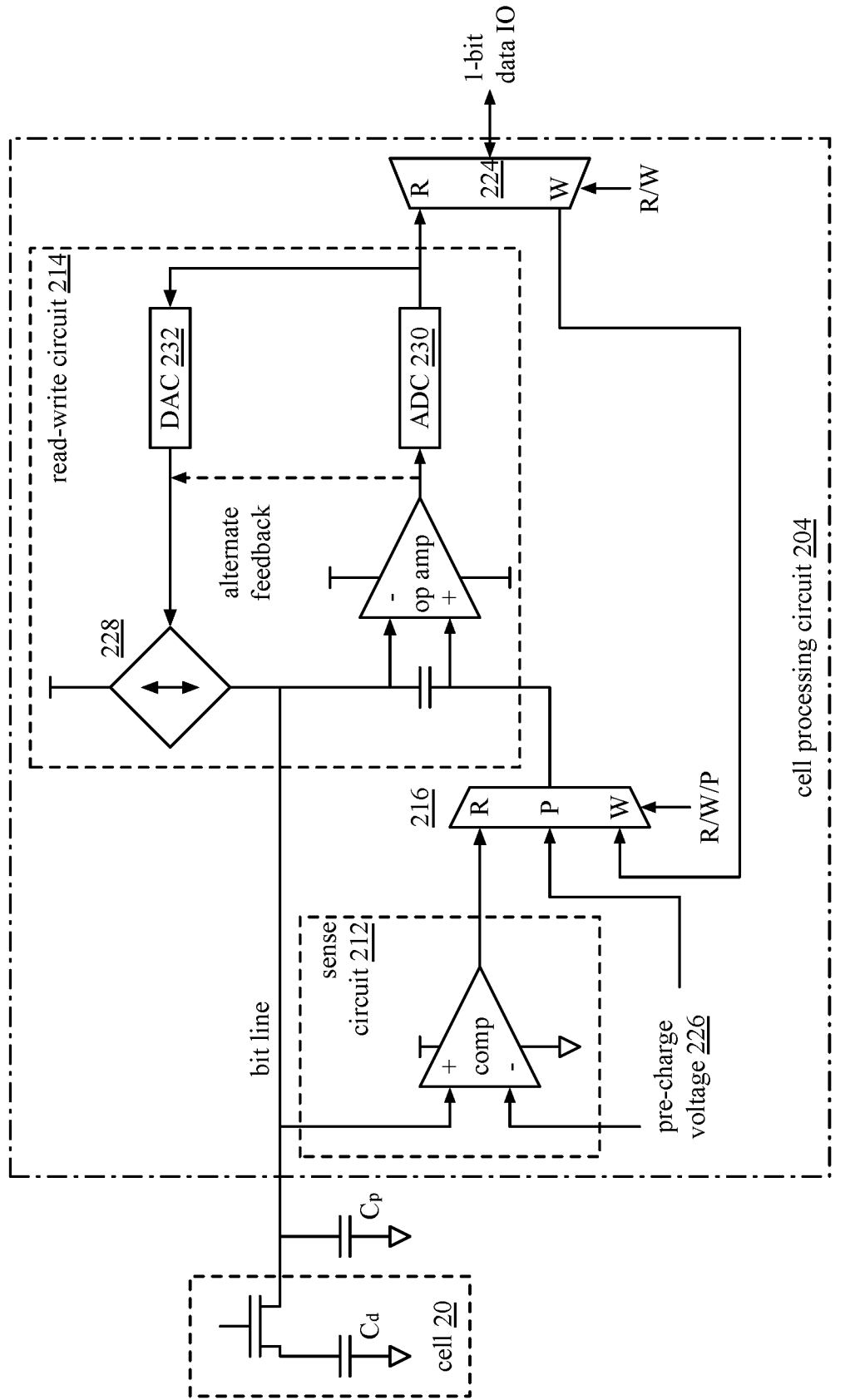
FIG. 23 is a schematic block diagram of another embodiment of a cell processing circuit of the DRAM memory device of FIG. 18 in accordance with the present invention.

FIG. 23 is a schematic block diagram of another embodiment of a cell processing circuit 204 of the DRAM memory device of FIG. 18. The cell processing circuit 204 includes a sense circuit 212, an input selection circuit 216 (e.g., a multiplexor), a read-write circuit 214, and a read-write selection circuit 218 (e.g., a multiplexor). The sense circuit 212, the input selection circuit 216, and the read-write selection circuit 218 operate in a similar manner as discussed with reference to FIGS. 20 and 21.

The read-write circuit 214 includes an operational amplifier (op amp), an analog to digital converter (ADC) 230, a controlled voltage circuit 228, and a digital to analog converter (DAC) 232. The op amp still functions to substantially match the voltage on its second input to the voltage its first input, which it receives from the input selection circuit 216. As such, in the pre-charge mode, the op amp, via the controlled source circuit 228 (e.g., a controlled current source, a controlled voltage source, etc.) the ADC 230, and the DAC 232, drives the pre-charge voltage onto the bit line. In the write mode, the op amp, via the controlled source circuit 228, the ADC 230, and the DAC 232, drives the write input voltage onto the bit line.

In the read mode, the op amp, via the controlled source circuit 228, the ADC 232, and the DAC 232, drives the read voltage onto the bit line. In this embodiment, the output of the op amp is representative of the voltage on the bit line. For example, to drive the bit line to Vcm, the output of the op amp will be a voltage between Vcm and Vss. When the op amp output voltage in this state, it's interpreted by the ADC 230 to produce a logic 0 output voltage. As another example, to drive the bit line to Vdd, the output of the op amp will be a voltage between approximating Vdd. When the op amp output voltage in this state, it's interpreted by the ADC 230 to produce a logic 1 output voltage.

Figure 24:
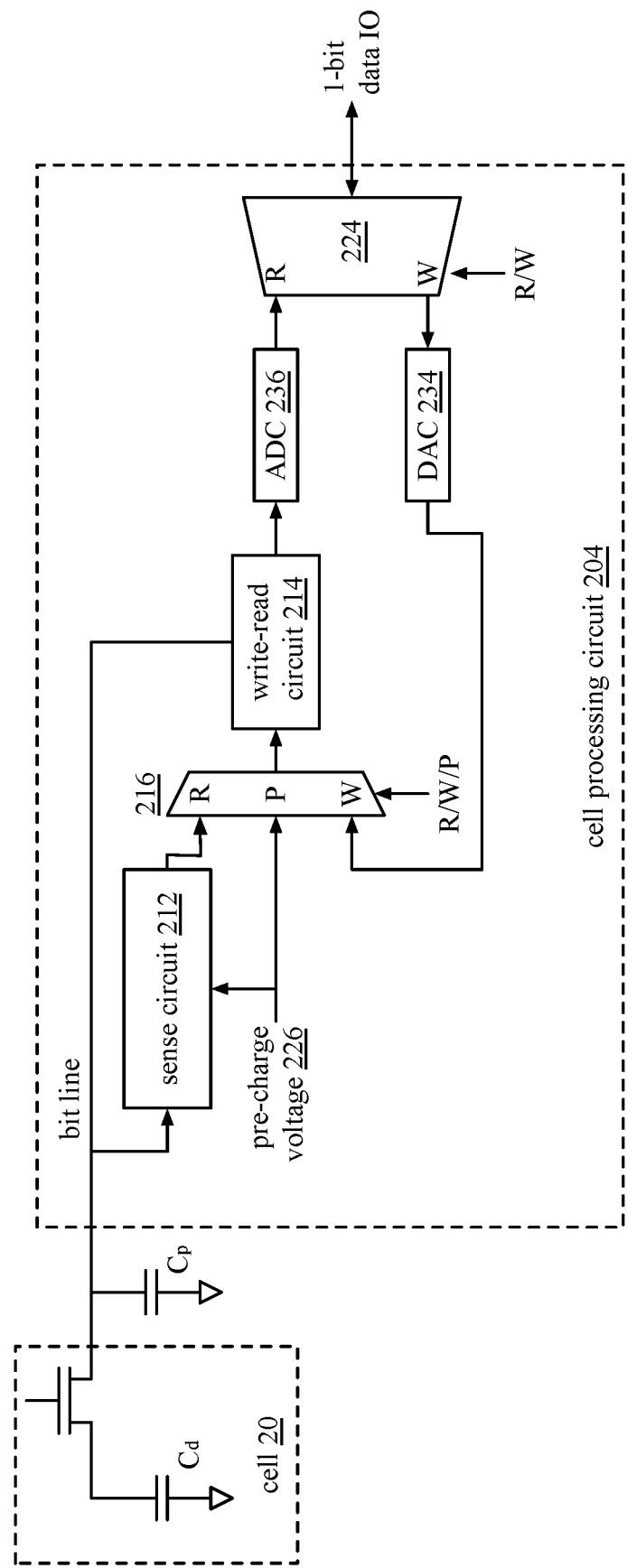
FIG. 24 is a schematic block diagram of another embodiment of a cell processing circuit of the DRAM memory device of FIG. 18 in accordance with the present invention.

FIG. 24 is a schematic block diagram of another embodiment of a cell processing circuit 204 of the DRAM memory device of FIG. 18. The cell processing circuit 204 includes the sense circuit 212, the input selection circuit 216 (e.g., a multiplexor), the read-write circuit 214, the read-write selection circuit 218 (e.g., a multiplexor), a digital to analog converter (DAC) 234, and an analog to digital converter (ADC) 236. The sense circuit 212, the input selection circuit 216, the read-write circuit 214, and the read-write selection circuit 218 operate in a similar manner as discussed with reference to FIGS. 20 and 21.

The difference with this embodiment in comparison to the cell processing circuit of FIG. 20 is the inclusion of the ADC 236 and the DAC 234. In this embodiment, the voltage level for the 1-bit 10 data from the IO module 202 is at a different level than the logic 1 and logic 0 voltages within the DRAM memory device 10-2. For example, the 1-bit 10 data uses a 2.2 voltage source, such a logic 1 voltage is above 90% of the 2.2 volts and a logic 0 voltage is below 10% of the 2.2 volts. Within the DRAM memory device 10-2, the supply voltage may be 1 volt.

Figure 25:
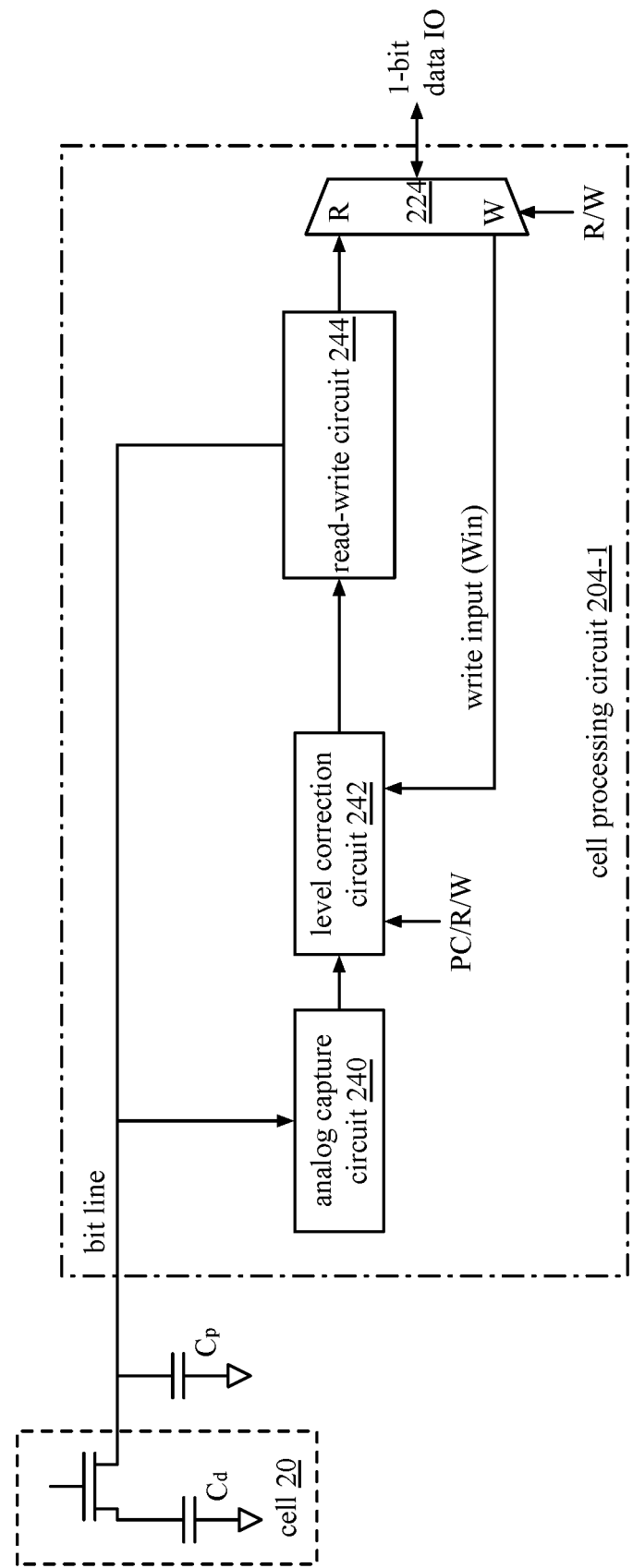
FIG. 25 is a schematic block diagram of another embodiment of a cell processing circuit of the DRAM memory device of FIG. 18 in accordance with the present invention.

FIG. 25 is a schematic block diagram of another embodiment of a cell processing circuit 204-1 of the DRAM memory device 10-2 of FIG. 18. The cell processing circuit 204-1 is coupled to a DRAM cell 20 via a bit line. The cell processing circuit 204-1 includes an analog capture circuit 240, a level correction circuit 242, a read-write circuit 244, and a read-write selection circuit 224.

In a pre-charge mode of a read operation, the level correction circuit 242 provides a pre-charge input to the read-write circuit 244. The read-write circuit 244 generates a pre-charge voltage based on the pre-charge input and supplies the pre-charge voltage on to the bit line. In this manner, the bit line is pre-charged to the pre-charge voltage.

In the read mode of the read operation, the analog capture circuit 240 determines a voltage stored by a DRAM cell 20 that is active on the bit line and supplies the voltage to the level correction circuit 242. The level correction circuit 242 generates a logic 1 input when the voltage stored by the DRAM cell is in a first state and generates a logic 0 input when the voltage stored by the DRAM cell is in a second state. The read-write circuit 244 supplies a logic 1 voltage on the bit line when input received from the level correction circuit 242 is a logic 1 input. The read-write circuit 244 supplies a logic 0 voltage on the bit line when input received from the level correction circuit 242 is a logic 0 input.

The read-write selection circuit 244 outputs a representation of the logic 1 voltage when the read-write signal is in the read state and the voltage stored by the DRAM cell is in the first state (i.e., when the read-write circuit 244 supplies the bit line with a logic 1 voltage). The read-write selection circuit 244 outputs a representation of the logic 0 voltage when the read-write signal is in the read state and the voltage stored by the DRAM cell is in the second state (i.e., when the read-write circuit 244 supplies the bit line with a logic 0 voltage).

For a write operation, the read-write selection circuit 244 provides a write input to the level correction circuit 242. The level correction circuit 242 generates a voltage representative of the write input and provides the representative voltage to the read-write circuit 244. The read-write circuit 244 generates a write input voltage based on the representative voltage and supplies the write input voltage onto the bit line such that the currently active DRAM cell is charged to the write input voltage.

Figure 26:
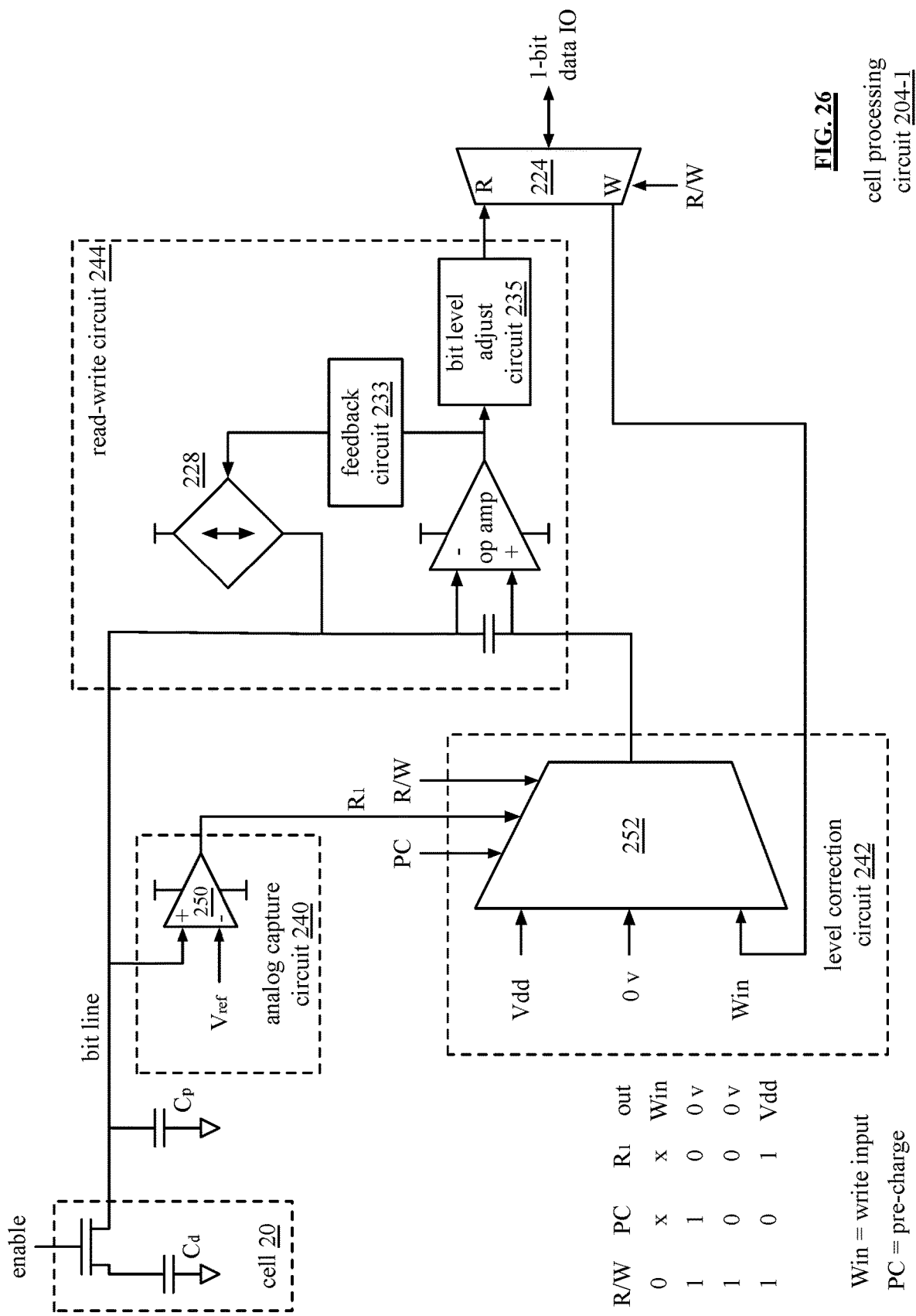
FIG. 26 is a schematic block diagram of another embodiment of a cell processing circuit of the DRAM memory device of FIG. 18 in accordance with the present invention.

FIG. 26 is a schematic block diagram of another embodiment of a cell processing circuit 204-1 of the DRAM memory device of FIG. 18. The cell processing circuit 204-1 includes the analog capture circuit 240, the level correction circuit 242, and the read-write circuit 244. The analog capture circuit 240 includes a comparator 250. The level correction circuit 252 includes a multiplexer with three inputs and three control lines. The read-write circuit 244 includes the op amp, the feedback circuit 323, the controlled voltage source 228, and the bit level adjust circuit 235. The read-write circuit 244 operates similarly to the read-write circuit 214 of FIG. 22.

For a write operation, the read-write selection circuit 224 provides a write input (Win) to the level correction circuit 252. In the write mode, the read/write (R/W) signal is a logic 0. As such, the multiplexer 252 outputs the write input to the read-write circuit 244. The read-write circuit 244 drives a write input voltage, which is based on the write input, onto the bit line to charge the capacitor of the currently active DRAM cell.

A read operation includes a pre-charge (PC) mode and a read-refresh mode. In the pre-charge mode, the PC input to the multiplexer 252 is a logic 1 and the read/write signal is a logic 1, such that the multiplexer 252 outputs the 0-volt signal to the read-write circuit 244. The read-write circuit 244 pre-charges the bit line to 0 volts.

In the read-refresh mode, the comparator 250 compares the voltage on the bit line with a reference voltage (Vref), which, in an embodiment, is slightly above 0 volts. As a specific example, when Vdd is 1.2 volts, the pre-charge is 0 volts, Vref is 0.1 volts (assuming the charge on the capacitor of the RAM cell can move the bit line more than 0.1 volts. When the capacitor Cd of the RAM cell 20 is storing a logic 1 voltage, the voltage on the bit line increases above Vref, causing the comparator to output a voltage approximating Vdd. With respect to the multiplexor 252, this constitutes a logic 1 input control voltage, causing the multiplexor 252 to output Vdd to the read-write circuit 244.

The read-write circuit 244 drives the Vdd voltage on to the bit line to refresh the voltage stored by the capacitor of the DRAM cell. In addition, the read-write circuit 244 provides a logic 1 output voltage to the read-write selection circuit 224, which provides the read bit to the IO module 202 of the DRAM memory device 10-2.

When the capacitor Cd of the RAM cell 20 is storing a logic 0 voltage, the voltage on the bit line doesn't change; thus it doesn't increase above Vref. As such, the comparator outputs a voltage approximating Vss. With respect to the multiplexor 252, this constitutes a logic 0 input control voltage, causing the level correction circuit 252 to output 0 volts to the read-write circuit 244. The read-write circuit 244 drives the 0 volts on to the bit line to refresh the voltage stored by the capacitor of the DRAM cell. In addition, the read-write circuit 244 provides a logic 0 output voltage to the read-write selection circuit 224, which provides the read bit to the IO module 202.

Figure 27B:
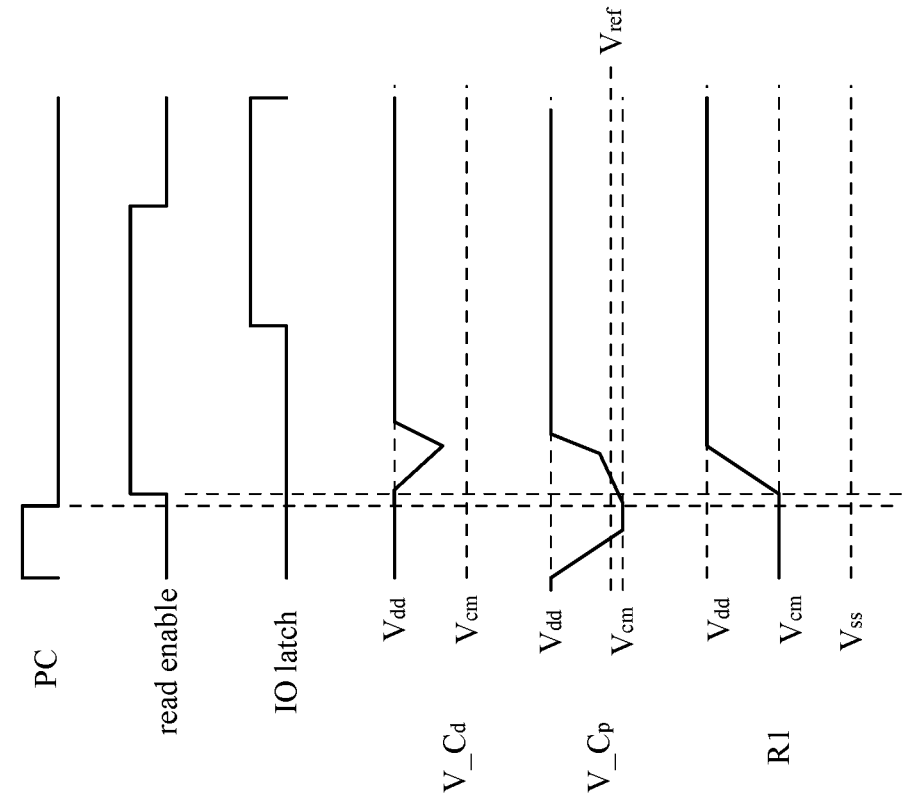
FIGS. 27A and 27B are timing diagrams of an example of operation of a cell processing circuit of FIG. 25 in accordance with the present invention.
Figure 27A:
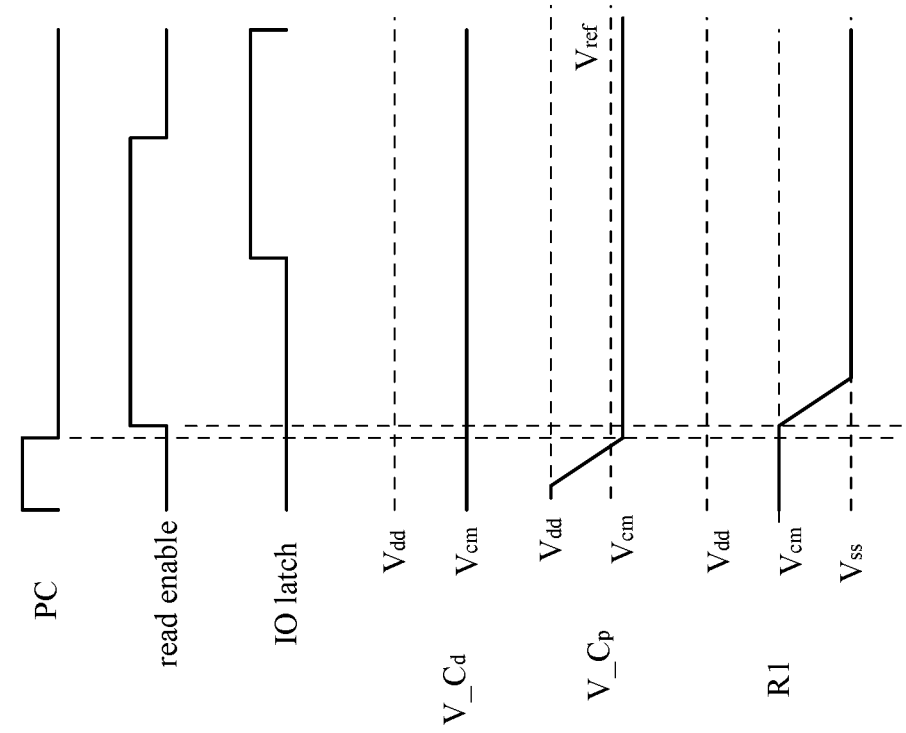

FIGS. 27A and 27B are timing diagram of an example of operation of a cell processing circuit 204-1 during a read operation of a DRAM cell. In FIG. 27A, the capacitor of the DRAM cell is storing a logic 0 voltage (e.g., Vcm=0 volts). The read operation begins with the pre-charge mode (i.e., PC signal is high and read enable is low) to pre-charge the bit line to 0 volts. After the pre-charge mode, the read mode is activated by the read enable signal going high (e.g., the word line for the DRAM cell is high). Since the voltage stored by the DRAM cell is 0 volts (e.g., the voltage stored on capacitor Cd), it does not move the bit line (e.g., voltage on the parasitic capacitance Cp). Since the bit line voltage did not change, the comparator output R1 goes to Vss. With R1 low, the read-write circuit read a logic 0 voltage, outputs it, and refreshes the voltage stored by the DRAM cell capacitor to a logic 0 voltage (e.g., 0 volts).

In FIG. 27B, the capacitor of the DRAM cell is storing a logic 1 voltage (e.g., Vdd). The read operation begins with the pre-charge mode to pre-charge the bit line to 0 volts. After the pre-charge mode, the read mode is activated by the read enable signal going high. Since the voltage stored by the DRAM cell is Vdd volts (e.g., the voltage stored on capacitor Cd), it dumps charge into the parasitic capacitor of bit line causing the voltage to rise above Vref. Since the bit line voltage rose above Vref, the comparator output R1 goes to Vdd. With R1 high, the read-write circuit read a logic 1 voltage, outputs it, and refreshes the voltage stored by the DRAM cell capacitor to a logic 1 voltage (e.g., Vdd volts).

Note that for the various cell processing circuit of DRAM memory device 10-2, there is some settling time incorporated in the circuitry. In this manner, the voltage on the bit line can be accurately read before the read-write circuit refreshes the voltage stored by the DRAM cell capacitor. Further note that the read bit is latched into the IO module 202 in accordance with the IO latch signal.

Figure 28:
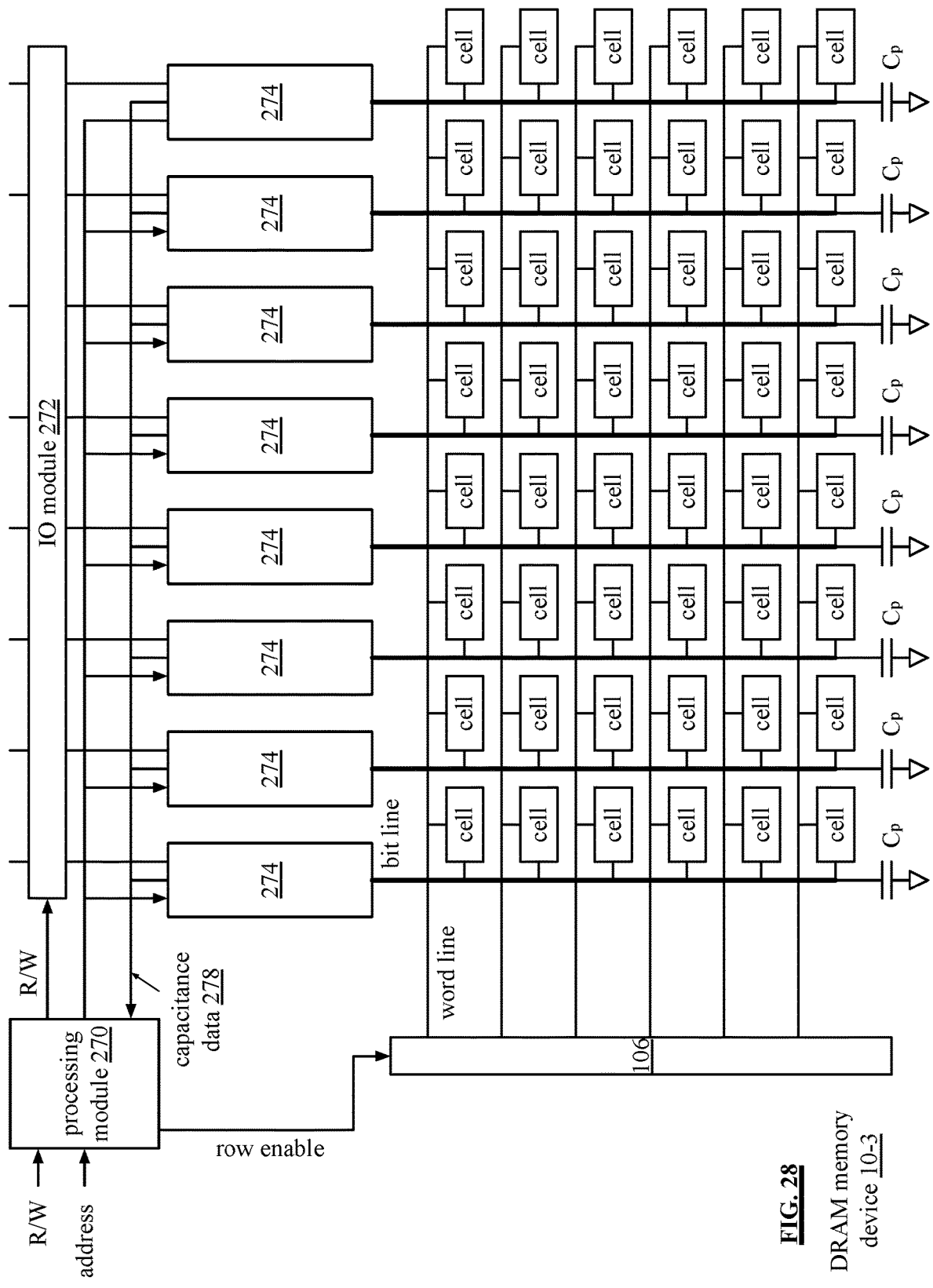
FIG. 28 is a schematic block diagram of another embodiment of a DRAM memory device in accordance with the present invention.

FIG. 28 is a schematic block diagram of another embodiment of a DRAM memory device 10-3 that includes a processing module 270, an input/output (IO) module 272, a plurality of cell processing circuits 274, a row select module 106, and a plurality of DRAM cells ("cell"). The cells are arranged into rows and columns and each cell stores a voltage that is representative of 1-bits of data. A column of cells is coupled to a bit line, which is coupled to a cell processing circuit 204. Each bit line has a parasitic capacitance $C_p$. A row of cells is coupled to a word line, which is coupled to the row select module 106. The IO module 272 and the row select module 106 operate similarly to the IO module 14 and the row select module 18 of FIG. 1. As with the previous embodiments of a DRAM memory device, the number of cells in a row and the number of columns is dependent on the desired cell density of the DRAM memory device 10-3.

In this embodiment, a cell processing circuit 274 produces capacitance data 278 for each DRAM cell it engages. The capacitance data 278 can be used by the processing module 270 for a variety of purposes. For example, the processing module 270 can determine a value of the parasitic capacitance Cp for each bit line and/or the average capacitance of the DRAM cell capacitors Cd. From this information, the processing module 270 can adjust threshold voltages, drive currents, and/or read/write timing to make the DRAM memory device more efficient (e.g., faster, more reliable, and/or less power consumption). The capacitance data 278 may also be used for in manufacturing processes to test the DRAM memory device, to calibrate the DRAM memory device, and/or to classify the DRAM memory device's performance level. The capacitance data 278 may still further used to detect a change in operating conditions that are indicative of the DRAM memory device, or a portion thereof, in an early stage and/or later stage of failure.

Figure 29:
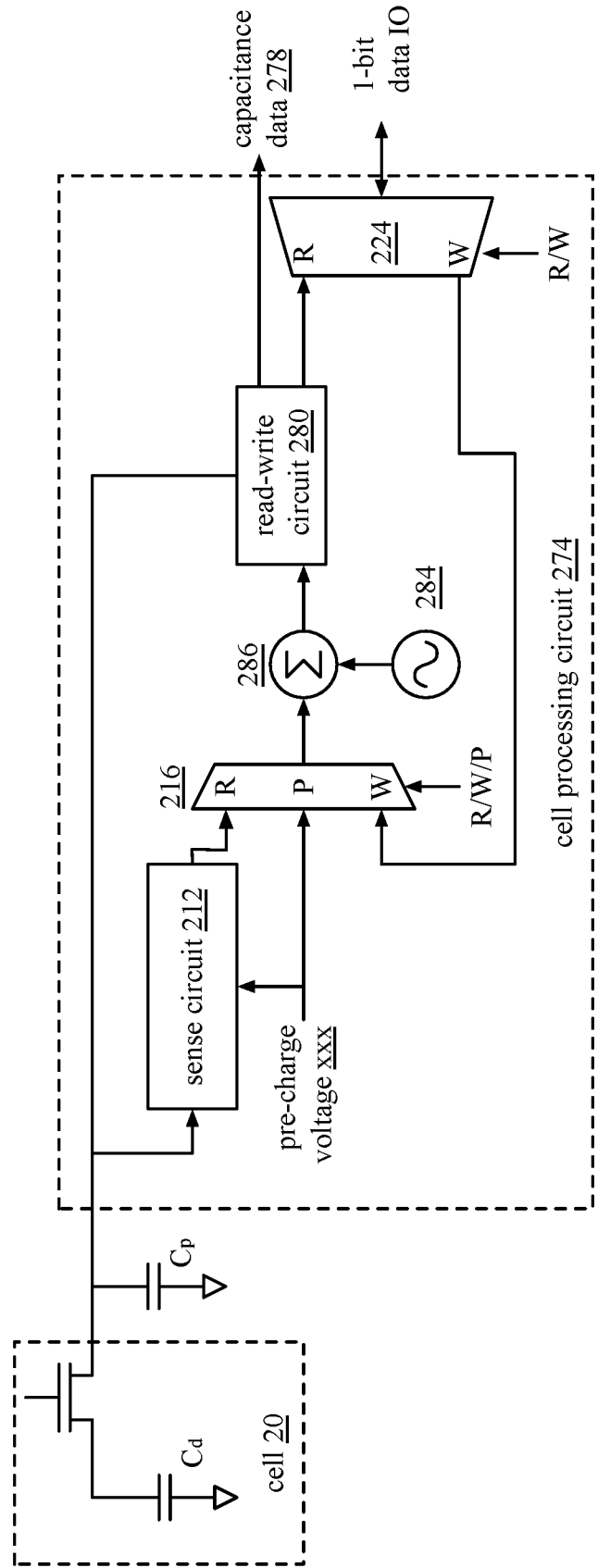
FIG. 29 is a schematic block diagram of an embodiment of a cell processing circuit of the DRAM memory device of FIG. 28 in accordance with the present invention.

FIG. 29 is a schematic block diagram of an embodiment of a cell processing circuit 274 of the DRAM memory device 10-3 of FIG. 28. The cell processing circuit 274 includes a sense circuit 212, an input selection circuit 216, a read-write circuit 280, an oscillator 284, a summing module 286, and a read-write selection circuit 224. The sense circuit 212, the input selection circuit 216, and the read-write selection circuit 224 operate as previously discussed.

In this embodiment, whatever signal is outputted by the input selection circuit 216 (e.g., a pre-charge voltage, a write input voltage, a read output voltage), it is summed with an oscillation produced by the oscillator 284 (e.g., a voltage controlled oscillator, a crystal oscillator circuit, a digital frequency synthesizer, etc.). The oscillation is at a frequency above the memory clock rate of the DRAM cell. For example, if the memory clock is 400 MHz, the oscillation will be above 400 MHz; for example, at 4 GHz. By providing an AC signal component to the read-write circuit 280, one or more of the various components of an equation for a capacitor [e.g., $v=1/C\int i(t)dt$] can be recorded as capacitance data 278 and interpreted to ascertain additional information about each bit line and/or DRAM cell.

Figure 30:
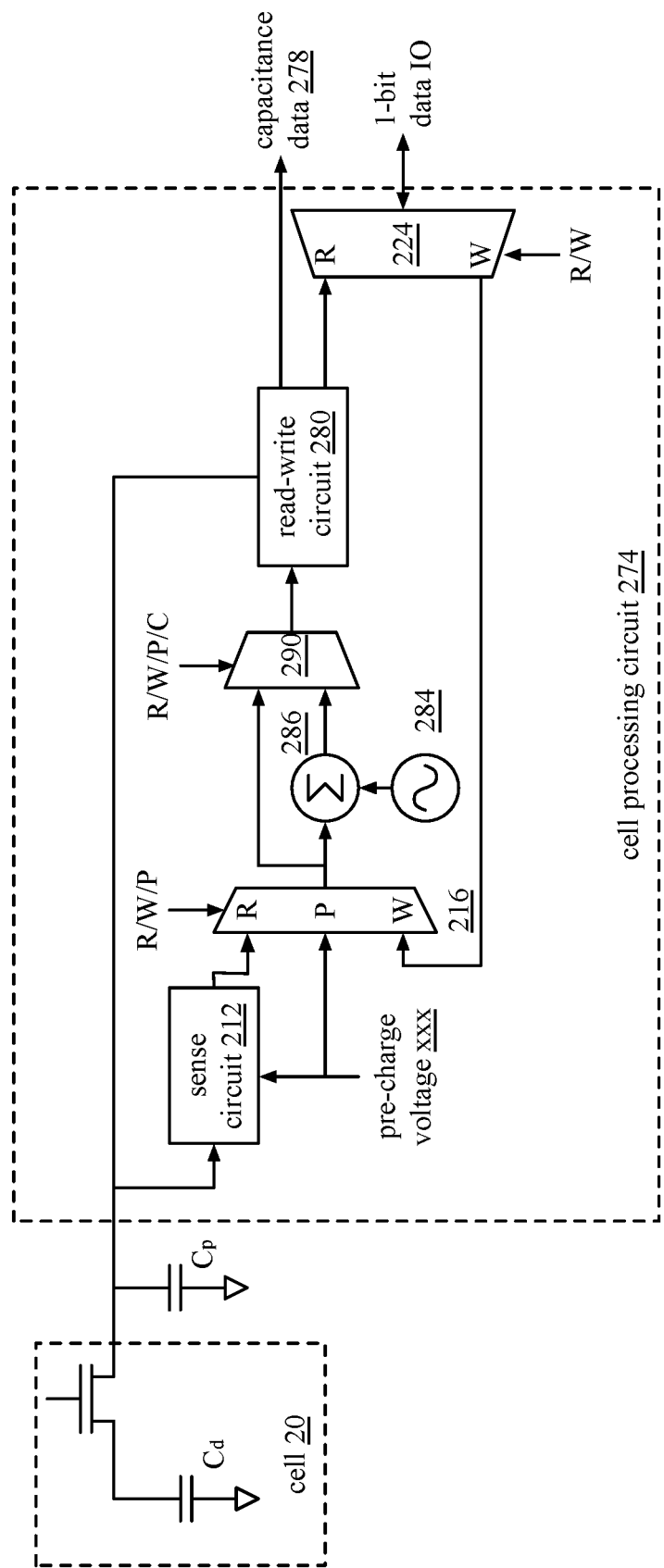
FIG. 30 is a schematic block diagram of another embodiment of a cell processing circuit of the DRAM memory device of FIG. 28 in accordance with the present invention.

FIG. 30 is a schematic block diagram of another embodiment of a cell processing circuit 274 of the DRAM memory device 10-3 of FIG. 28. The cell processing circuit 274 includes the sense circuit 212, the input selection circuit 216, the read-write circuit 280, the oscillator 284, the summing module 286, the read-write selection circuit 224, and a by-pass selection circuit 290 (e.g., a multiplexer). This embodiment of the cell processing circuit 274 operates similarly to the cell processing circuit of FIG. 29 with a difference being that the output of input selection circuit 216 can be directly provided to the read-write circuit 280 via the by-pass selection circuit 290.

As such, the processing module 270 can control when the oscillation will be part of the input to the read-write circuit 280. For example, the processing module 270 can have the oscillation included when in the write mode (e.g., the "W" control input of the by-pass selection circuit is high) and/or when in the read mode (e.g., the "R" control input of the by-pass selection circuit is high). This provide capacitance information regarding the combination of the bit line parasitic capacitance and the DRAM cell capacitance.

In another example, the processing module 270 can have the oscillation included when in the pre-charge mode (e.g., the "PC" control input of the by-pass selection circuit is high). This provides information only regarding the parasitic capacitance of the bit line. In another example, the processing module 270 can have the oscillation included at any time by having the "C" control input of the by-pass selection circuit is high.

Figure 31:
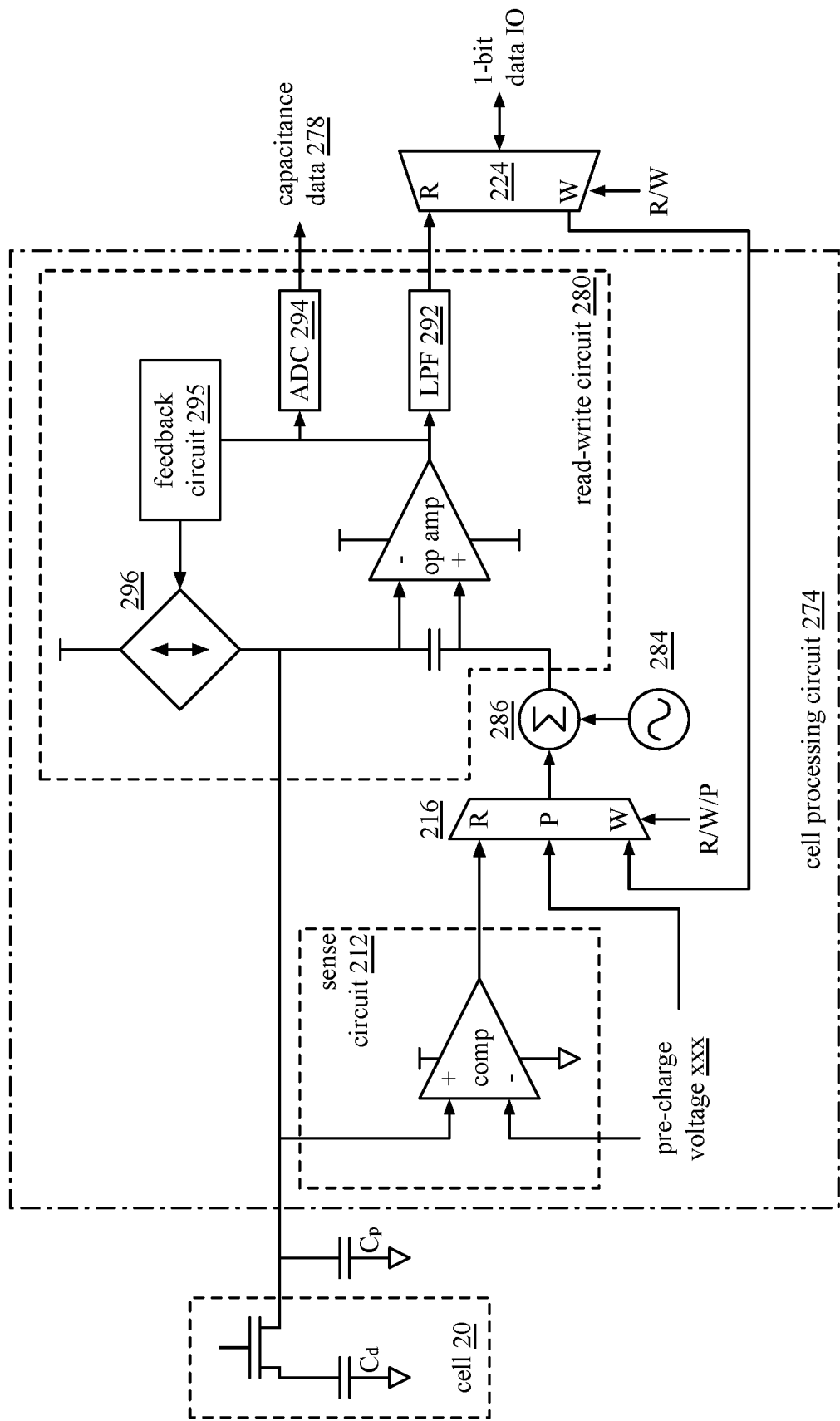
FIG. 31 is a schematic block diagram of another embodiment of a cell processing circuit of the DRAM memory device of FIG. 28 in accordance with the present invention.

FIG. 31 is a schematic block diagram of another embodiment of a cell processing circuit 274 of the DRAM memory device 10-3 of FIG. 28. The cell processing circuit 274 includes the sense circuit 212, the input selection circuit 216, the read-write selection circuit 224, the read-write circuit 280, the oscillator 284, and the summing module 286. The sense circuit 212 includes a comparator, which functions as previously discussed. The read-write circuit 280 includes an operational amplifier (op amp), a feedback circuit 295, a controlled source circuit 296 (e.g., controlled current source or controlled voltage source), a low pass filter (LPF) 292, and an analog to digital converter (ADC) 294.

Within the read-write circuit 280, the op amp receives the oscillating reference signal (e.g., the output of the input selection circuit 216 summed with the oscillation produced by oscillator 284). The op amp, via the feedback circuit 295 and the controlled source circuit 296, drives the oscillating reference voltage on to the bit line for pre-charge, for writing, or for refreshing. The feedback circuit 295 and controlled source circuit 296 may be implemented similarly to feedback circuit 233 and controlled source circuit 228 of FIG. 22.

The output of the op amp is low passed filtered by the LPF 292 to substantially remove the oscillation component, thus leaving the read voltage, which is outputted to the read-write selection circuit 224. The ADC 294 converts the analog output of the op amp into digital data that is representative of the capacitance data 278.

FIGS. 32-34 are schematic diagrams of various examples of an oscillating component and a DC voltage of the oscillating reference voltage provided to the read-write circuit 280. In FIG. 32, the oscillating reference voltage includes a DC component of a logic 1 voltage 281 and the oscillating component 283. In FIG. 33, the oscillating reference voltage includes a DC component of a logic 0 voltage 285 and the oscillating component 283. In FIG. 34, the oscillating reference voltage includes a DC component of a pre-charge voltage 287 (which is somewhere between a logic 0 voltage and a logic 1 voltage) and the oscillating component 283.

FIG. 35 is a schematic block diagram of another embodiment of a DRAM memory device 10-4 that includes a processing module 300, an IO module 302, a plurality of 2-bit cell processing circuits 304, a row select module 106, and a plurality of DRAM cells ("cell"). The cells are arranged into rows and columns and each cell stores a voltage that is representative of 2-bits of data. A column of cells is coupled to a bit line, which is coupled to a cell processing circuit 104. Each bit line has a parasitic capacitance $C_p$. A row of cells is coupled to a word line, which is coupled to the row select module 106.

The number of cells in a row and the number of columns is dependent on the desired cell density of the DRAM memory device. As an example, a 1 Gb cell density (e.g., stores 1 Giga-bit of data) DRAM memory device includes 8 columns and 64 million rows. In this example, the IO module 102 includes an 8-bit bus; one for each column and inputs/outputs 2-bits of data per IO clocking cycle. In another example, a 1 Gb cell density DRAM memory device includes 16 columns and 32 million rows. In this example, the IO module 102 includes a 16-bit bus; one for each column.

The processing module 300, the IO module 302, and the row select module 106 operate similarly to the processing module 200, the IO module 204, and the row select module 106 of FIG. 18 with a difference being that the DRAM memory device 10-4 stores 2-bits of data per cell. As such, the inputting and outputting of data is for 2-bits per cell.

Figure 36:
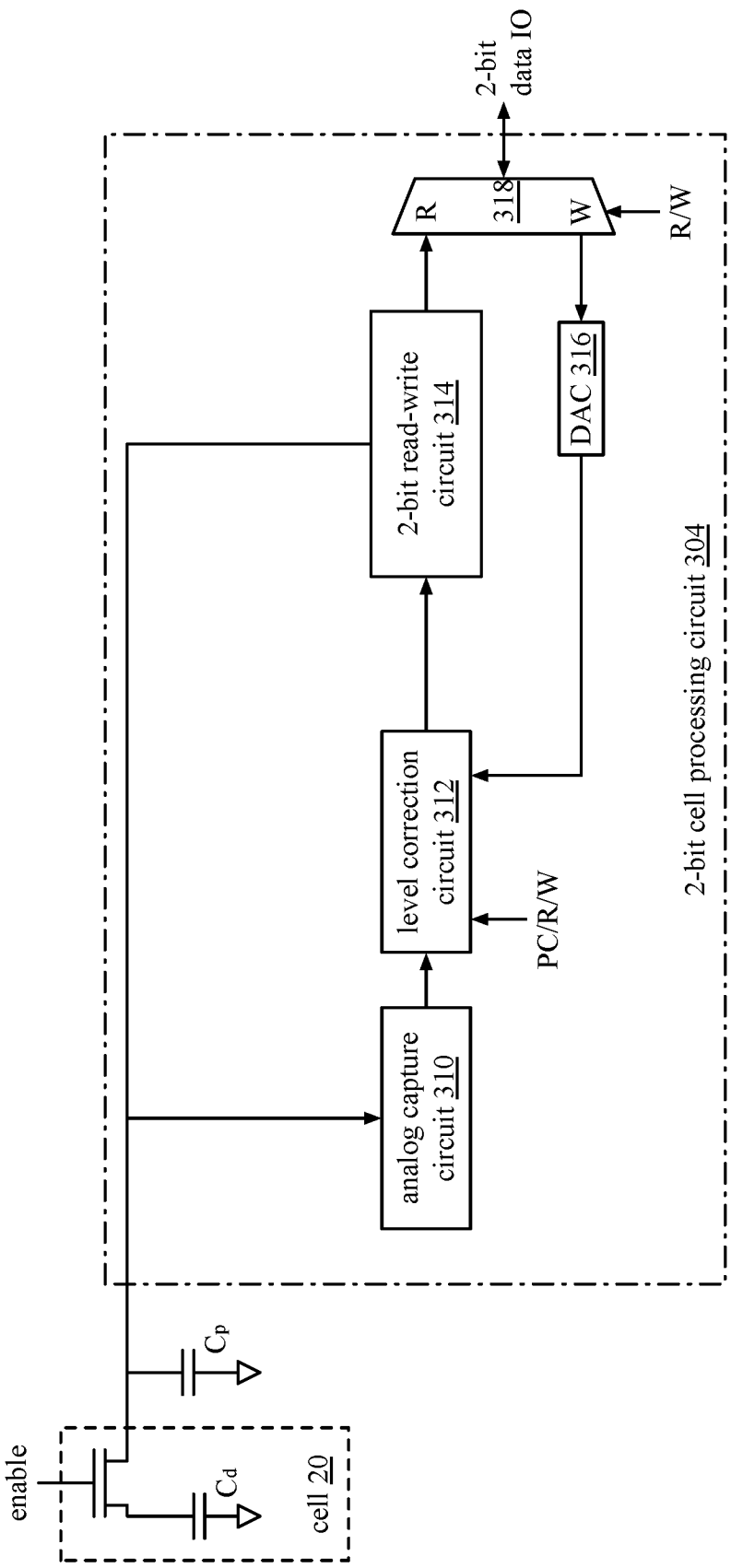
FIG. 36 is a schematic block diagram of an embodiment of a cell processing circuit of the DRAM memory device of FIG. 35 in accordance with the present invention.

FIG. 36 is a schematic block diagram of an embodiment of a cell processing circuit 304 of the DRAM memory device 10-4 of FIG. 35. The cell processing circuit 304 is coupled to a DRAM cell 20 via a bit line. The cell processing circuit 304 includes an analog capture circuit 310, a level correction circuit 312, a read-write circuit 314, and a read-write selection circuit 318.

In a pre-charge mode of a read operation, the level correction circuit 312 provides a pre-charge input to the read-write circuit 314. The read-write circuit 314 generates a pre-charge voltage based on the pre-charge input and supplies the pre-charge voltage on to the bit line. In this manner, the bit line is pre-charged to the pre-charge voltage.

In the read mode of the read operation, the analog capture circuit 310 determines a voltage stored by a DRAM cell 20 that is active on the bit line and supplies the voltage to the level correction circuit 312. The level correction circuit 312 generates a logic 11 input when the voltage stored by the DRAM cell is in a first state; generates a logic 10 input when the voltage stored by the DRAM cell is in a second state; generates a logic 01 input when the voltage stored by the DRAM cell is in a third state; and generates a logic 00 input when the voltage stored by the DRAM cell is in a fourth state.

The read-write circuit 314 supplies a logic 11 voltage on the bit line when input received from the level correction circuit 312 is a logic 11 input. The read-write circuit 314 supplies a logic 10 voltage on the bit line when input received from the level correction circuit 312 is a logic 10 input. The read-write circuit 314 supplies a logic 01 voltage on the bit line when input received from the level correction circuit 312 is a logic 01 input. The read-write circuit 314 supplies a logic 00 voltage on the bit line when input received from the level correction circuit 312 is a logic 00 input.

The read-write selection circuit 318 outputs a representation of the logic 11 voltage when the read-write signal is in the read state and the voltage stored by the DRAM cell is in the first state (i.e., when the read-write circuit 314 supplies the bit line with a logic 11 voltage). The read-write selection circuit 318 outputs a representation of the logic 10 voltage when the read-write signal is in the read state and the voltage stored by the DRAM cell is in the second state (i.e., when the read-write circuit 314 supplies the bit line with a logic 10 voltage). The read-write selection circuit 318 outputs a representation of the logic 01 voltage when the read-write signal is in the read state and the voltage stored by the DRAM cell is in the third state (i.e., when the read-write circuit 314 supplies the bit line with a logic 01 voltage). The read-write selection circuit 318 outputs a representation of the logic 00 voltage when the read-write signal is in the read state and the voltage stored by the DRAM cell is in the fourth state (i.e., when the read-write circuit 314 supplies the bit line with a logic 00 voltage).

For a write operation, the read-write selection circuit 318 provides a write input to the level correction circuit 312. The level correction circuit 312 generates a voltage representative of the write input and provides the representative voltage to the read-write circuit 314. The read-write circuit 314 generates a write input voltage (e.g., a logic 00 voltage, a logic 01 voltage, a logic 10 voltage, or a logic 11 voltage) based on the representative voltage and supplies the write input voltage onto the bit line such that the currently active DRAM cell is charged to the write input voltage.

Figure 37:
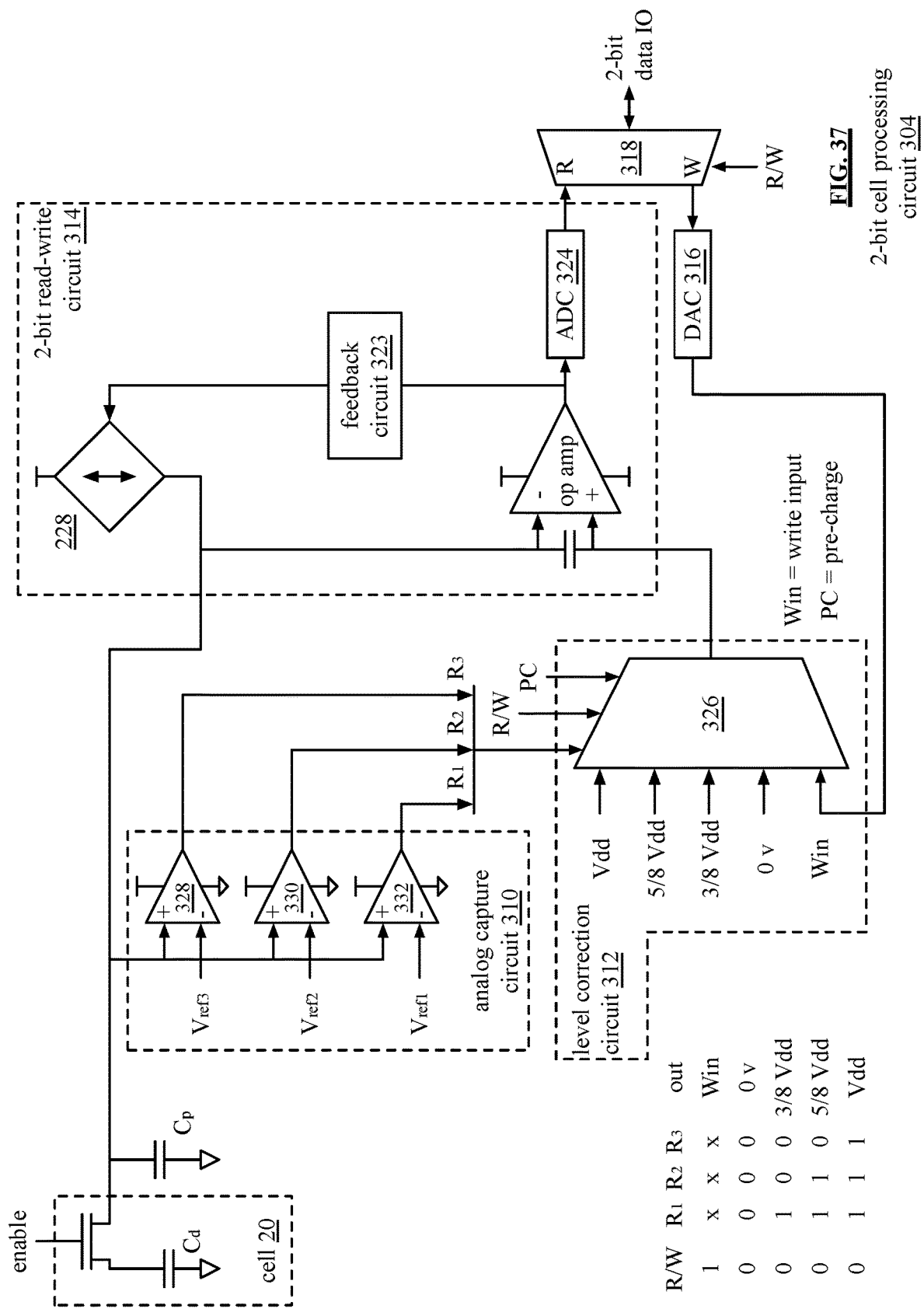
FIG. 37 is a schematic block diagram of another embodiment of a cell processing circuit of the DRAM memory device of FIG. 35 in accordance with the present invention.
Figure 38:
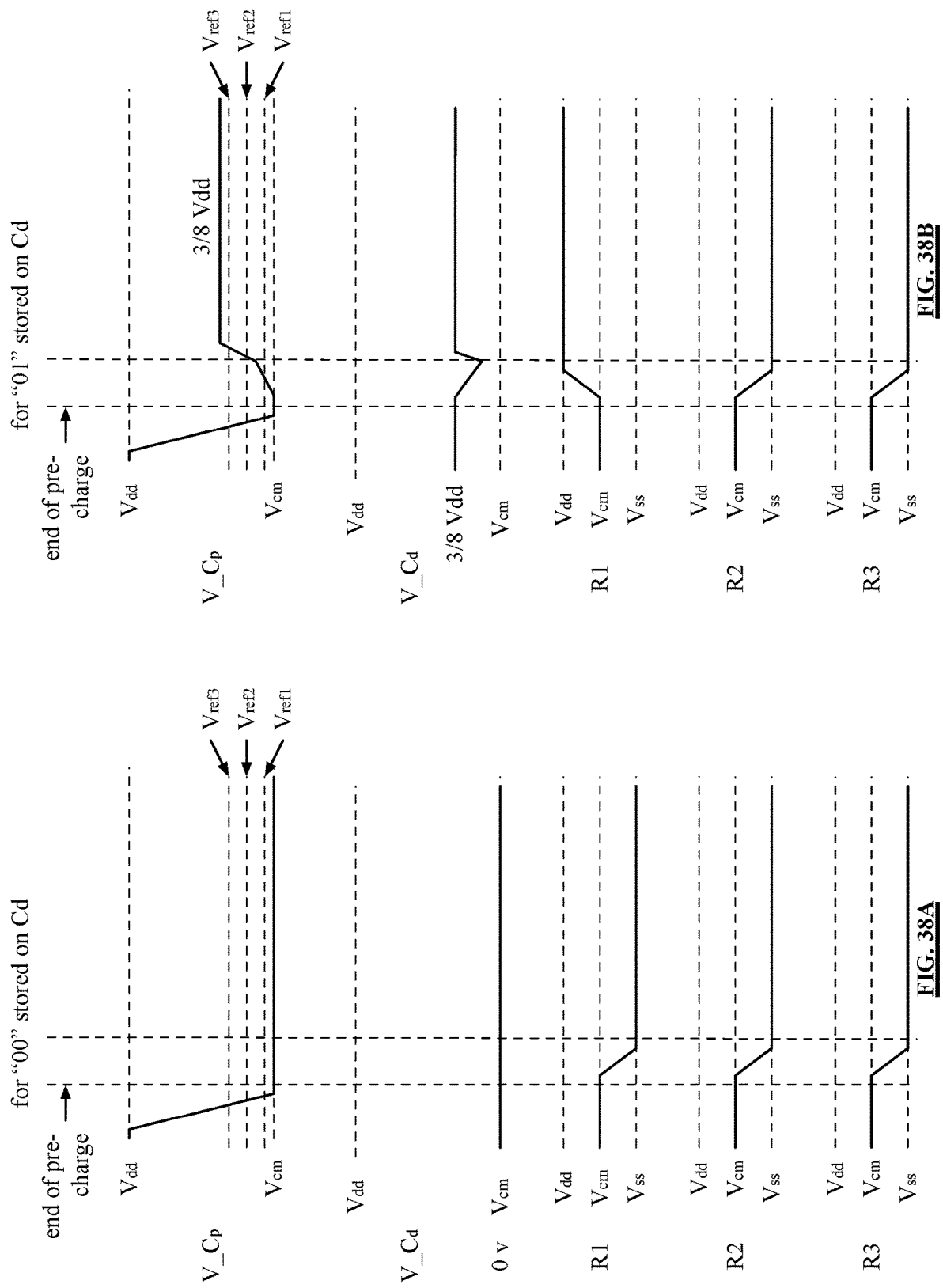
Figure 39:
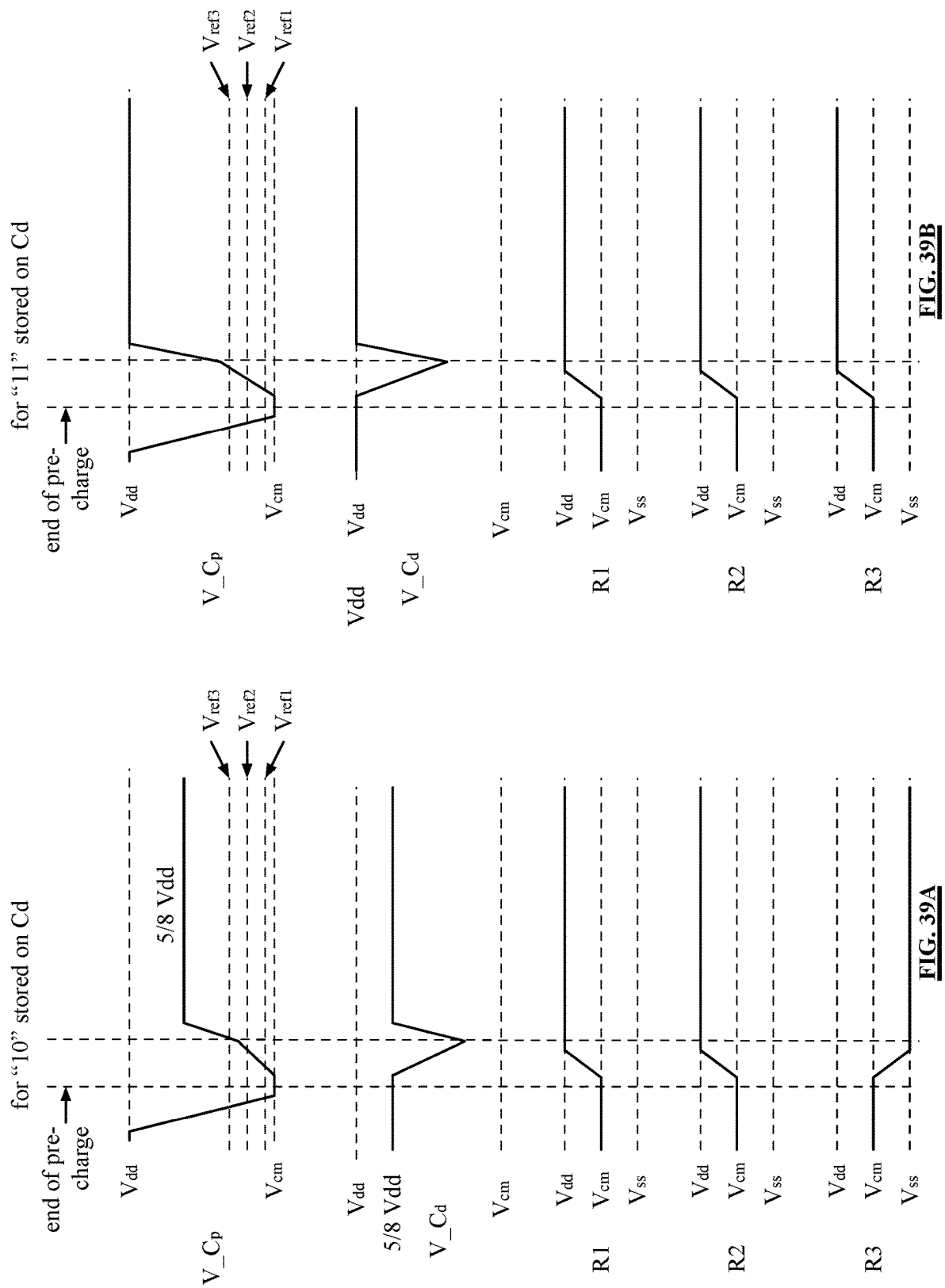

FIG. 37 is a schematic block diagram of another embodiment of a cell processing circuit 304 of the DRAM memory device 10-4 of FIG. 35. The cell processing circuit 304 includes the analog capture circuit 310, the level correction circuit 312, and the read-write circuit 314. The analog capture circuit 310 includes three comparators 328-332. The level correction circuit 312 includes a multiplexer 326 with five inputs and three control lines. The read-write circuit 314 includes the op amp, the feedback circuit 323, the controlled voltage source 228, and analog to digital converter (ADC) 324.

For a write operation, the read-write selection circuit 318 provides a write input (Win) to the multiplexer 326. In the write mode, the read/write (R/W) signal is a logic 0. As such, the multiplexer 326 outputs the write input to the read-write circuit 314. The read-write circuit 314 drives a write input voltage, which is based on the write input, onto the bit line to charge the capacitor of the currently active DRAM cell.

A read operation includes a pre-charge (PC) mode and a read-refresh mode. In the pre-charge mode, the PC input to the multiplexor 326 is a logic 1 and the read/write signal is a logic 1, such that the multiplexor 326 outputs the 0-volt signal to the read-write circuit 314. The read-write circuit 314 pre-charges the bit line to 0 volts.

In the read-refresh mode, the comparators 328-332 compares the voltage on the bit line with a reference voltages (Vref1, 2, and 3); an example of the reference voltage levels is provided in FIGS. 38A-39B. There are four states to the outputs of the comparators 328-332, which are: R1, R2, R3=000 indicating that the voltage on the bit line is a logic 00 voltage; R1, R2, R3=100 indicating that the voltage on the bit line is a logic 01 voltage; R1, R2, R3=110 indicating that the voltage on the bit line is a logic 10 voltage; and R1, R2, R3=111 indicating that the voltage on the bit line is a logic 11 voltage.

The multiplexer 326 outputs one of a plurality of voltages based on the state of the outputs of the comparators 328-332. For example, when R1, R2, R3 is 000, the multiplexer 326 outputs 0 volts (e.g., representing a logic 00 voltage level). As another example, when R1, R2, R3 is 100, the multiplexer 326 outputs a voltage of ⅜ Vdd (e.g., representing a logic 01 voltage level). As yet another example, when R1, R2, R3 is 110, the multiplexer 326 outputs a voltage of ⅝ Vdd (e.g., representing a logic 10 voltage level). As a further example, when R1, R2, R3 is 111, the multiplexer 326 outputs a voltage of ⅞ Vdd (e.g., representing a logic 11 voltage level).

The read-write circuit 314 drives a voltage corresponding to the voltage outputted by the multiplexer 326 on to the bit line to refresh the voltage stored by the capacitor of the DRAM cell. In addition, the ADC 324 converts the output of the op amp into a 2-bit digital value corresponding to the voltage driven onto the bit line. The read-write selection circuit 318 outputs the 2-bit value to the IO module 302 of the DRAM memory device 10-4.

FIGS. 38A, 38B, 39A, and 39B are timing diagrams of an example of operation of a cell processing circuit of FIG. 35. In FIG. 38A, the DRAM cell is storing a logic 00 voltage (e.g., Vcm=0 volts). The bit line is pre-charged to Vcm (e.g., 0 volts), which is shown as V_Cp (i.e., the parasitic capacitance of the bit line). During the beginning of the read enable (i.e., read mode), the capacitor of the DRAM cell is coupled to the bit line. In this instance, since the DRAM cell is storing a logic 00 voltage, the DRAM cell capacitor does not provide charge to or take a charge from the parasitic capacitance. Thus, both the parasitic capacitance and the DRAM cell capacitor remain at a logic 00 voltage and R1, R2, and R3 go low.

In FIG. 38B, the DRAM cell is storing a logic 01 voltage (e.g., ⅜ Vdd volts). The bit line is pre-charged to Vcm (e.g., 0 volts), which is shown as V_Cp (i.e., the parasitic capacitance of the bit line). During the beginning of the read enable (i.e., read mode), the capacitor of the DRAM cell is coupled to the bit line. In this instance, with the DRAM cell storing a logic 01 voltage (e.g., ⅜ Vdd), the DRAM cell capacitor provides a charge to the parasitic capacitance, which increases the voltage on the parasitic capacitance above the first threshold (Vref1). In this instance, R1 goes high and R2 & R3 go low.

In FIG. 39A, the DRAM cell is storing a logic 10 voltage (e.g., ⅝ Vdd volts). The bit line is pre-charged to Vcm (e.g., 0 volts), which is shown as V_Cp (i.e., the parasitic capacitance of the bit line). During the beginning of the read enable (i.e., read mode), the capacitor of the DRAM cell is coupled to the bit line. In this instance, with the DRAM cell storing a logic 10 voltage (e.g., ⅝ Vdd), the DRAM cell capacitor provides a charge to the parasitic capacitance, which increases the voltage on the parasitic capacitance above the second threshold (Vref2). In this instance, R1 and R2 go high and R3 goes low.

In FIG. 39B, the DRAM cell is storing a logic 11 voltage (e.g., Vdd volts). The bit line is pre-charged to Vcm (e.g., 0 volts), which is shown as V_Cp (i.e., the parasitic capacitance of the bit line). During the beginning of the read enable (i.e., read mode), the capacitor of the DRAM cell is coupled to the bit line. In this instance, with the DRAM cell storing a logic 11 voltage (e.g., Vdd), the DRAM cell capacitor provides a charge to the parasitic capacitance, which increases the voltage on the parasitic capacitance above the second threshold (Vref3). In this instance, R1, R2, and R2 go high.

FIG. 40 is a schematic block diagram of another embodiment of a Static Random Access (SRAM) memory device 350 that includes a processing module 352, an input/output (IO) module 354, a plurality of cell processing circuits 356, a row select module 358, and a plurality of modified SRAM cells ("cell"). The SRAM memory device 350 may be implemented in a variety of ways. For example, the SRAM memory device is a die incorporated into an integrated circuit. As another example, the SRAM memory device is an integrated circuit that includes one or more dies. As yet another example, the SRAM memory device is a portion of a die that includes one or more other circuits. As a further example, the SRAM memory device is a portion of an integrated circuit that includes one or more other circuits.

The cells are arranged into rows and columns. A column of cells is coupled to a bit line, which is coupled to a cell processing circuit 16. A row of cells is coupled to a word line, which is coupled to the row select module 18. The number of cells in a row and the number of columns is dependent on the desired cell density of the SRAM memory device. As an example, a 288 Mb cell density (e.g., stores 288 Mega-bit of data) SRAM memory device includes 32 columns and 9 million rows. In this example, the IO module 354 includes a 32-bit bus; one for each column. In another example, a 288 Mb cell density SRAM memory device includes 16 columns and 18 million rows. In this example, the IO module 354 includes a 16-bit bus; one for each column. In general, an SRAM memory device includes $2^Y$ columns and $2^N$ rows, where Y is equal to or greater than 1 and where N is equal to or greater than 3.

The processing module 352 receives an address, a Read/Write (R/W) signal, and a clock signal. The processing module 352 converts the clock signal (e.g., the memory clock) into an IO bus clock signal based on the data rate for the DRAM memory device. For example, the processing module generates a 100 MHz IO bus clock signal from a 100 MHz memory clock for single data rate (SDR) and double data rate (DDR) applications. As another example, the processing module generates a 200 MHz IO bus clock signal from a 100 MHz clock signal for a quad data rate (QDR) application. Other data rate applications, such as DDR2, DDR3, and DDR4 have different IO bus clock signals. For each data access of a cycle of the memory clock (e.g., once per memory clock cycle for SDR, twice per memory clock cycle for DDR, and four times per memory clock cycle for QDR), the processing module interprets an address to produce a row enable signal. The row enable signal activates a word line (e.g., a row) such that the cells of the activated row are coupled via their respective bit lines to their respective cell processing circuits 16.

For a read operation, a cell processing circuit 356 reads a voltage stored an active cell. The cell processing circuit 356 provides a logic 1 voltage or a logic 0 voltage to the IO module 354 based on the voltage stored by the cell. This process will be discussed in greater detail with reference to one or more of the subsequent Figures.

For a write operation, the cell processing circuit 356 receives a bit of data from the IO module 354. The cell processing circuit 356 drives a voltage representative of the bit on to its bit line. The cell on the bit line that is activated via its word line has the voltage written to it. For example, if the write input bit is a logic 0, the cell processing circuit 356 creates a logic 0 voltage and drives it onto the bit line. The activated cell, via its word line, stores the logic 0 voltage. As another example, if the write input bit is a logic 1, the cell processing circuit 356 creates a logic 1 voltage and drives it onto the bit line. The activated cell, via its word line, stores the logic 1 voltage. This process will be discussed in greater detail with reference to one or more of the subsequent Figures.

FIG. 41 is a schematic block diagram of an embodiment of a cell processing circuit 356 of the SRAM memory device 350 of FIG. 40. The cell processing circuit 356 is coupled to a bit line, which is coupled to a column of SRAM cells 355. The cell processing circuit 356 includes an input selection circuit 362 (e.g., a multiplexor), a read-write circuit 360, and a read-write selection circuit 364 (e.g., a multiplexor). The SRAM cell 355 includes a transistor 370, a first inverter 366, and a second inverter 368.

Within the SRAM cell, the first and second inverters 366 and 368 are coupled in a piggy-back fashion (i.e., the input of one is coupled to the output of the other). In this embodiment, the SRAM cell includes only one transistor coupled to its respective bit line (instead of the normal two transistors coupled to a non-inverting bit line and an inverting bit line). The cell processing circuit 356 is configured to sufficiently drive a single bit line to accurately read from and write to an SRAM cell. As such, instead of the tradition 6-transistor SRAM cell, the present embodiment includes only 5 transistors per SRAM cell. For an SRAM memory device with 288 million SRAM cells, the present embodiment includes 288 million less transistors than in a traditional SRAM memory.

FIG. 42 is a schematic block diagram of an embodiment of a cell processing circuit 356 of the SRAM memory device 350 of FIG. 40. The cell processing circuit 356 is coupled to an SRAM cell 355 and includes the input selection circuit 362, the read-write circuit 360, and the read-write selection circuit 364. The read-write circuit 360 includes an operational amplifier (op amp), a feedback circuit 373, and a controlled source circuit 372 (e.g., a controlled current source or a controlled voltage source).

In a write mode, the read-write selection circuit 364 provides a write input to the input selection circuit 362. The input selection circuit 362 provides the write input, or a representation thereof, to the read-write circuit 360. The op amp functions to have both of its inputs at the same voltage. As such, through voltage controlled source 372 and the feedback circuit 373, which may be constructed in a similar manner to feedback circuit 33 of FIG. 2, the read-write circuit drives the voltage it receives from the input selection circuit 362 on to the bit line.

For example, when the write input corresponds to a logic 1 voltage, the read-write circuit drives a logic 1 voltage on the bit line. With sufficient drive strength (i.e., sufficient current and/or sufficient voltage), the logic 1 voltage on the bit line causes a logic 1 onto the input of inverter 368 and onto the output of inverter 366 and causes a logic 0 onto the output of inverter 368 and onto the input of inverter 366.

As another example, when the write input corresponds to a logic 0 voltage, the read-write circuit drives a logic 0 voltage on the bit line. With sufficient drive strength (i.e., sufficient current and/or sufficient voltage), the logic 0 voltage on the bit line causes a logic 0 onto the input of inverter 368 and onto the output of inverter 366 and causes a logic 1 onto the output of inverter 368 and onto the input of inverter 366.

In a read mode, the stored voltage of the SRAM cell 355 (e.g., a logic 0 voltage or a logic 1 voltage) is provided to the input selection circuit 362, which provides it to the read-write circuit 360. Since the bit line is already at the desired voltage, the read-write circuit 360 holds that voltage on the bit line. In addition, the read-write circuit 360 outputs a representation of the voltage on the bit line to the read-write selection circuit 364, which outputs 1-bit digital data to the IO module 352.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a Dynamic Random Access (DRAM) cell processing circuit, the method comprises:
   when a current DRAM memory device is in a read mode:
   charging a bit-line operably coupled to a plurality of DRAM cells of a DRAM memory device including a current DRAM cell, at a first voltage to pre-charge a parasitic capacitance between a ground and the bit-line to a second voltage, wherein the second voltage is between a logic 1 voltage and a logic 0 voltage;
   sensing a voltage change on the bit-line, wherein the sensing is based on a difference between a voltage stored on a DRAM cell capacitor of the current DRAM cell and the second voltage;
   outputting a read output voltage that is generated based on the sensed voltage change; and
   supplying, while outputting the read output voltage, the read output voltage to the bit-line to refresh the voltage stored in the DRAM cell capacitor of the current DRAM cell.

2. The method of claim 1, wherein the voltage change is one of an increase in voltage or a decrease in voltage from the first voltage, wherein an increase in voltage causes the cell processing circuit to create a representative sensed logic 1 voltage and a decrease in voltage causes the cell processing circuit to create a representative sensed logic 0 voltage.

3. The method of claim 1, further comprising:
   when the current DRAM memory device is in a write mode:
   receiving a write input, wherein the write input is one of a logic 1 voltage or a logic 0 voltage;
   generating a write voltage based on the write input; and
   supplying the write voltage to the bit-line.

4. The method of claim 1, wherein the current DRAM memory device is in a read mode when the DRAM cell capacitor of the current DRAM cell is coupled in parallel with the parasitic capacitance.

5. The method of claim 1, wherein the read output voltage is output as at least one of a voltage, a digital output of an analog to digital converter (ADC) or an amplified representation of the read output voltage.

6. The method of claim 1, wherein the charging the bit-line comprises:
   receiving, by another op-amp a pre-charge voltage from an input selection circuit at a first input of the another op-amp and driving the bit-line provide so that a voltage on a second input of the another op-amp matches the pre-charge voltage.

7. The method of claim 1, wherein the read output voltage is substantially equal to Vdd when the current DRAM cell is storing a logic 1 voltage, wherein Vdd is a positive supply voltage with reference to a common mode voltage (Vcm).

8. The method of claim 1, wherein the read output voltage is substantially equal to Vcm when the first DRAM is storing a logic 0 voltage, wherein Vcm is a negative supply voltage with reference to Vdd.

9. The method of claim 1, wherein the charging the bit-line comprises:
   receiving, by another op-amp a pre-charge voltage from an input selection circuit at a first input of the another op-amp;
   outputting, by the another op-amp, a signal representative of the pre-charge voltage to an analog to digital converter (ADC), wherein the ADC is configured to generate a signal indicative of a logic state of the current DRAM cell; and
   based on the logic state generated by the ADC, charging, by a digital to analog converter (DAC) and a controlled source circuit, the bit-line.

10. A cell processing circuit of a Dynamic Random Access (DRAM) memory device, the cell processing circuit comprises:
    a read-write circuit operably coupled to a bit-line of a DRAM memory device, wherein the read-write circuit is configured to drive the bit-line at a first voltage for pre-charging a parasitic capacitance between a ground and the bit-line to a second voltage, wherein the second voltage is between a logic 1 voltage and a logic 0 voltage, wherein the bit-line is operably coupled to a plurality of DRAM cells including a first DRAM cell of the DRAM memory device;
    a drive sense circuit operably coupled to the bit line, wherein the drive sense circuit is operable to sense a voltage change on the bit-line when the parasitic capacitance is coupled in parallel to a DRAM cell capacitor of the first DRAM cell; and
    an input selection circuit operably coupled to the drive sense circuit and operably coupled to the read-write circuit, wherein the read-write circuit is configured to receive an output from the input selection circuit and generate a read output voltage based on the output from the input selection circuit, wherein the read-write circuit is further configured to apply the read output voltage to the bit-line to refresh a voltage stored by the first DRAM cell.

11. The cell processing circuit of claim 10, wherein the voltage change one of an increase in voltage or a decrease in voltage on the bit-line from the second voltage on the bit-line to a third voltage.

12. The cell processing circuit of claim 10, wherein the drive sense circuit is further operable to create a voltage difference output corresponding to a logic 1 voltage for an increase in voltage on the bit-line and a voltage difference corresponding to logic 0 voltage for a decrease in voltage on the bit-line.

13. The cell processing circuit of claim 10, further comprising:
    when the first DRAM memory device is in a write mode:
    receiving a write input, wherein the write input is one of a logic 1 voltage or a logic 0 voltage;
    generating a write voltage based on the write input; and
    supplying the write voltage to the bit-line.

14. The cell processing circuit of claim 10, wherein the DRAM memory device is in a read mode when the parasitic capacitance is coupled in parallel to the DRAM cell capacitor of the first DRAM cell.

15. The cell processing circuit of claim 10, wherein the read output voltage is output as at least one of a voltage, a digital output of an analog to digital converter (ADC) and an amplified representation of the read output voltage.

16. The cell processing circuit of claim 10, wherein the read-write circuit comprises:
    a feedback circuit;
    an output driver; and
    an operation amplifier (op-amp) operable to receive a pre-charge voltage from an input selection circuit at a first input and drive the bit-line so that a voltage on a second input of the operation amplifier matches the pre-charge voltage.

17. The cell processing circuit of claim 10, wherein the read output voltage is substantially equal to Vdd when the first DRAM is storing a logic 1 voltage, wherein Vdd is a positive supply voltage with reference to a common mode voltage (Vcm).

18. The cell processing circuit of claim 17, wherein the read output voltage is substantially equal to Vcm when the first DRAM is storing a logic 0 voltage, wherein Vcm is a negative supply voltage with reference to Vdd.

19. The cell processing circuit of claim 10, wherein the read-write circuit comprises:
- a feedback circuit;
  - a controlled source circuit;
- a bit level adjust circuit; and
  - an operation amplifier (op-amp) operable to receive a pre-charge voltage from an input selection circuit at a first input, wherein the feedback circuit and the controlled source circuit is configured to drive the bit-line so that a voltage on a second input of the operation amplifier matches the pre-charge voltage.

20. The cell processing circuit of claim 10, wherein the read-write circuit comprises:
- a controlled source circuit;

a digital to analog converter (DAC);

an analog to digital converter (ADC); and an operation amplifier (op-amp) operable to receive a pre-charge voltage from an input selection circuit at a first input, wherein the ADC, the DAC and the controlled source circuit are configured to drive the bit-line so that a voltage on a second input of the operation amplifier matches the pre-charge voltage.

\* \* \* \* \*